United States Patent
Hattori et al.

(10) Patent No.: US 10,143,087 B2
(45) Date of Patent: Nov. 27, 2018

(54) CAPACITOR ELEMENT-MOUNTED STRUCTURE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/586,310

(22) Filed: May 4, 2017

(65) Prior Publication Data

US 2017/0339792 A1  Nov. 23, 2017

(30) Foreign Application Priority Data

May 18, 2016  (JP) .................................. 2016-099956
Dec. 21, 2016  (JP) .................................. 2016-247888

(51) Int. Cl.
*H01G 4/012* (2006.01)
*H01G 4/018* (2006.01)
(Continued)

(52) U.S. Cl.
CPC ............. *H05K 1/188* (2013.01); *H01G 2/065* (2013.01); *H01G 4/012* (2013.01); *H01G 4/018* (2013.01);
(Continued)

(58) Field of Classification Search
CPC ........ H01G 2/065; H01G 4/012; H01G 4/018; H01G 4/224; H01G 4/232; H01G 4/30;
(Continued)

(56) References Cited

U.S. PATENT DOCUMENTS

2002/0007908 A1  1/2002 Mamada
2007/0230091 A1* 10/2007 Kobayashi ............. H01G 9/042
361/523
(Continued)

FOREIGN PATENT DOCUMENTS

JP  2000-232030 A  8/2000
JP  2002-232110 A  8/2002
(Continued)

OTHER PUBLICATIONS

Office Communication issued in corresponding Korean Patent Application No. 10-2017-0059269, dated Mar. 14, 2018.

*Primary Examiner* — Timothy Thompson
*Assistant Examiner* — Guillermo Egoavil
(74) *Attorney, Agent, or Firm* — Keating & Bennett, LLP

(57) ABSTRACT

A circuit module includes a first and second monolithic ceramic capacitors encapsulated by a mold resin layer on a wiring board. The first and second monolithic ceramic capacitors are lined up along a direction parallel or substantially parallel to the main surface of the wiring board and are electrically connected in series or in parallel through a conductive pattern provided on the wiring board. One of a pair of end surfaces of the first monolithic ceramic capacitor is opposed to one of the width-direction side surfaces as a pair of side surfaces of the second monolithic ceramic capacitor with the mold resin layer interposed.

17 Claims, 30 Drawing Sheets

(51) Int. Cl.
*H01G 4/30* (2006.01)
*H05K 1/18* (2006.01)
*H01G 4/232* (2006.01)
*H01G 4/38* (2006.01)
*H01G 4/40* (2006.01)
*H01G 2/06* (2006.01)
*H01G 4/224* (2006.01)

(52) U.S. Cl.
CPC .............. *H01G 4/224* (2013.01); *H01G 4/232* (2013.01); *H01G 4/30* (2013.01); *H01G 4/38* (2013.01); *H01G 4/40* (2013.01); *H05K 2201/10015* (2013.01)

(58) Field of Classification Search
CPC ............ H01G 4/38; H01G 4/40; H01G 4/248; H05K 1/18; H05K 1/188; H05K 1/111; H05K 3/303; H05K 3/3442; H05K 2201/10015; H05K 2201/10522; H05K 2201/2045; H05K 2201/09227; Y10T 29/4913; Y02P 70/611

USPC ............................................ 174/260; 29/832
See application file for complete search history.

(56) References Cited

U.S. PATENT DOCUMENTS

| | | | |
|---|---|---|---|
| 2011/0006718 A1* | 1/2011 | Teshima | H05K 3/284 |
| | | | 318/494 |
| 2011/0249416 A1 | 10/2011 | Takai | |
| 2013/0050957 A1 | 2/2013 | Ogawa et al. | |
| 2014/0332261 A1* | 11/2014 | Fujimoto | H01G 4/30 |
| | | | 174/260 |
| 2016/0049243 A1 | 2/2016 | Uno et al. | |

FOREIGN PATENT DOCUMENTS

| | | |
|---|---|---|
| JP | 2014-045068 A | 3/2014 |
| KR | 10-2011-0113134 A | 10/2011 |
| KR | 10-2014-0133465 A | 11/2014 |
| KR | 10-2015-0010688 A | 1/2015 |
| WO | 2011/135926 A1 | 11/2011 |

* cited by examiner

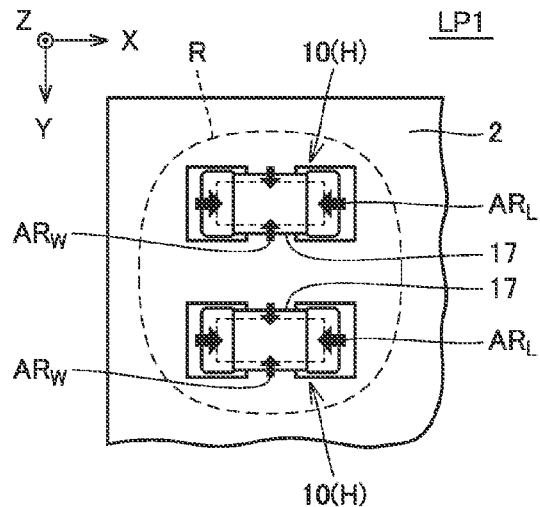
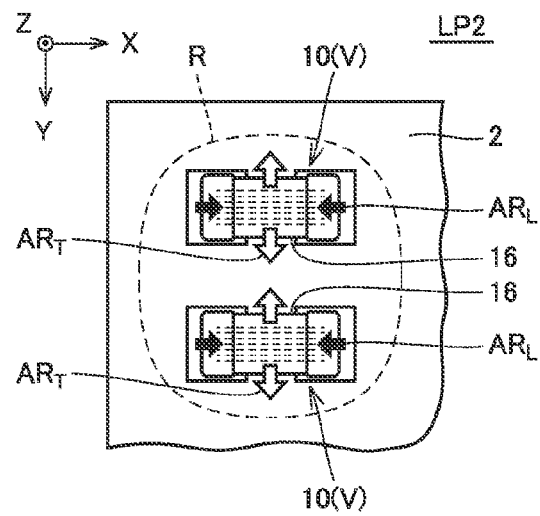
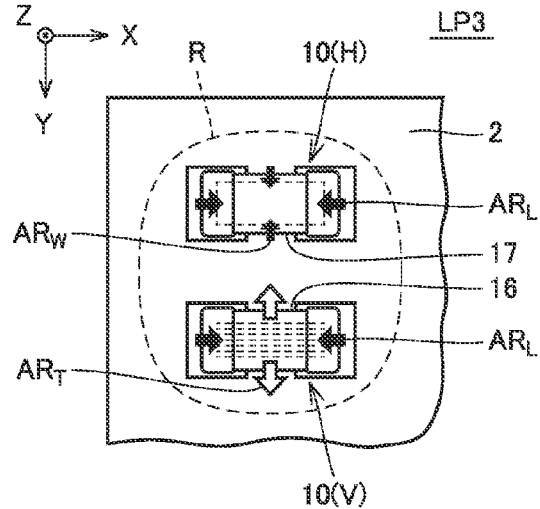

COMPARATIVE EXAMPLE 1

COMPARATIVE EXAMPLE 2

EXAMPLE 1

EXAMPLE 2

COMPARATIVE EXAMPLE 3

EXAMPLE 3

EXAMPLE 4

EXAMPLE 5

EXAMPLE 6

EXAMPLE 7

EXAMPLE 8

EXAMPLE 9

EXAMPLE 10

CAPACITOR ELEMENT-MOUNTED STRUCTURE

CROSS REFERENCE TO RELATED APPLICATIONS

This application claims the benefit of priority to Japanese Patent Application No. 2016-099956 filed on May 18, 2016 and Japanese Patent Application No. 2016-247888 filed on Dec. 21, 2016. The entire contents of these applications are hereby incorporated herein by reference.

BACKGROUND OF THE INVENTION

1. Field of the Invention

The present invention relates to a capacitor element-mounted structure in which a plurality of capacitor elements are mounted on a wiring board and the capacitor elements are encapsulated with a mold resin layer on the wiring board.

2. Description of the Related Art

With recent sophistication of electronic equipment, the capacitance of monolithic ceramic capacitors serving as electronic components has been increased. In large-capacitance monolithic ceramic capacitors, high-permittivity ceramic materials such as barium titanate ($BaTiO_3$) are used as dielectric materials.

Since these high-permittivity ceramic materials have piezoelectric characteristics and electrostriction, a monolithic ceramic capacitor including a dielectric made of a high-permittivity ceramic material is mechanically distorted when a voltage is applied.

Therefore, when an AC voltage or a DC voltage having a superimposed AC component is applied a large-capacitance monolithic ceramic capacitor mounted on a wiring board, mechanical distortion produced in the ceramic material causes vibration, which propagates to the wiring board and causes vibration of the circuit board.

Here, when the propagating vibration causes the circuit board to vibrate in the audio frequency range, that is, frequencies of 20 Hz or higher to 20 kHz or lower, noise called "acoustic noise" occurs.

For example, a DC/DC converter installed in electronic equipment converts DC voltage into a predetermined DC voltage suitable for each electronic equipment and supplies the converted DC voltage as a power source. The DC/DC converter has an input/output circuit connected with a decoupling monolithic ceramic capacitor for reducing noise produced based on a switching operation. The monolithic ceramic capacitor is subjected to a ripple voltage superimposed on the DC voltage through the switching operation, and this ripple voltage causes mechanical distortion having frequencies in the audio frequency range in the monolithic ceramic capacitor. This propagates to the wiring board and thus causes noise in the circuit board.

When a sensor such as an acceleration sensor or an angular velocity sensor is mounted on the wiring board populated with monolithic ceramic capacitors, vibration of the circuit board may cause the sensor to malfunction.

A variety of techniques have been proposed to suppress vibration of circuit boards resulting from mechanical distortion of monolithic ceramic capacitors. For example, Japanese Patent Laying-Open No. 2000-232030 discloses a mounting structure in which a pair of monolithic ceramic capacitors having equivalent specifications are mounted in plane symmetry at corresponding positions on the front and back surfaces of a wiring board so that vibration propagating from one of the monolithic ceramic capacitors to the wiring board and vibration propagating from the other monolithic ceramic capacitor to the wiring board cancel out each other thus suppressing vibration of the circuit board.

Japanese Patent Laying-Open No. 2002-232110 discloses a mounting structure in which a pair of monolithic ceramic capacitors are mounted close to each other such that their longer axes are parallel to each other on the same main surface of a wiring board, and a ripple voltage is applied the pair of monolithic ceramic capacitors such that the frequencies of oscillatory waves transmitted to the wiring board have amplitudes of opposite phases, thus suppressing vibration of the circuit board.

In both of the mounting structures disclosed in Japanese Patent Laying-Open No. 2000-232030 and Japanese Patent Laying-Open No. 2002-232110, the monolithic ceramic capacitors are mounted so as to be exposed on the main surface of the wiring board. Another example of the mounting structure for monolithic ceramic capacitors is a structure in which the main surface of a wiring board populated with monolithic ceramic capacitors is covered with a mold resin layer so that the monolithic ceramic capacitors are encapsulated with the mold resin layer. For example, WO2011/135926 discloses such a configuration.

Here, there is a significant difference in manner of vibration occurring in the circuit board between when a monolithic ceramic capacitor is exposed on the wiring board and when a monolithic ceramic capacitor is encapsulated with a mold resin layer on the wiring board. In the former case, the vibration transmission path is limited to solder joints, whereas in the latter case, the vibration transmission path is not limited to solder joints but the mold resin layer encapsulating the monolithic ceramic capacitor also serves as the vibration transmission path. When the main surface of the wiring board populated with a monolithic ceramic capacitor is entirely covered with a mold resin layer, vibration occurs not only in the wiring board but also in the circuit board including the mold resin layer as a whole. The manner of vibration differs also in this respect.

Therefore, such techniques as disclosed in Japanese Patent Laying-Open No. 2000-232030 and Japanese Patent Laying-Open No. 2002-232110 may not necessarily be applied suitably to a mounting structure having a monolithic ceramic capacitor encapsulated with a mold resin layer on a wiring board.

SUMMARY OF THE INVENTION

Preferred embodiments of the present invention significantly reduce or prevent vibrations produced in a capacitor element-mounted structure including a plurality of capacitor elements encapsulated with a mold resin layer on a wiring board.

A capacitor element-mounted structure according to a preferred embodiment of the present invention includes a first capacitor element and a second capacitor element each including a rectangular or substantially rectangular parallelepiped-shaped multilayer structure including a dielectric layer and an internal electrode layer alternately stacked along a stacking direction; a wiring board including a main surface with the first capacitor element and the second capacitor element mounted thereon; and a mold resin layer encapsulating the first capacitor element and the second capacitor element. The first capacitor element and the second capacitor element are electrically connected in series or in parallel through a conductive pattern provided on the wiring board. The first capacitor element and the second capacitor element each include a surface opposed to the wiring board, the opposed surface having short sides and long sides. Each of the first capacitor element and the second capacitor element includes a pair of end surfaces positioned to face each other in a direction in which the long sides extend, a pair of side surfaces positioned to face each other in a direction in which the short sides extend, and a pair of external electrodes spaced apart from each other on an outer surface of the multilayer structure. Each of the external electrodes included in the first capacitor element and the second capacitor element is bonded to a land through a conductive bonding member, the land being provided on the wiring board so as to correspond to each of the external electrodes. One of the pair of end surfaces of the first capacitor element is opposed to one of the pair of side surfaces of the second capacitor element with the mold resin layer interposed.

In a capacitor element-mounted structure according to a preferred embodiment of the present invention, it is preferable that both of the stacking direction in the first capacitor element and the stacking direction in the second capacitor element are oriented in a direction along the main surface of the wiring board.

A capacitor element-mounted structure according to a preferred embodiment of the present invention includes a first capacitor element, a second capacitor element, and a third capacitor element each including a rectangular or substantially rectangular parallelepiped-shaped multilayer structure including a dielectric layer and an internal electrode layer alternately stacked along a stacking direction; a wiring board including a main surface with the first capacitor element, the second capacitor element, and the third capacitor element mounted thereon; and a mold resin layer encapsulating the first capacitor element, the second capacitor element, and the third capacitor element. The first capacitor element, the second capacitor element, and the third capacitor element are electrically connected in series or in parallel through a conductive pattern provided on the wiring board. The first capacitor element, the second capacitor element, and the third capacitor element each include a surface opposed to the wiring board, the opposed surface having short sides and long sides. Each of the first capacitor element, the second capacitor element, and the third capacitor element includes a pair of end surfaces positioned to face each other in a direction in which the long sides extend, a pair of side surfaces positioned to face each other in a direction in which the short sides extend, and a pair of external electrodes spaced apart from each other on an outer surface of the multilayer structure. Each of the external electrodes included in the first capacitor element, the second capacitor element, and the third capacitor element is bonded to a land through a conductive bonding member, the land being provided on the wiring board so as to correspond to each of the external electrodes. Any one surface of the pair of end surfaces of the first capacitor element, the pair of end surfaces of the second capacitor element, and the pair of end surfaces of the third capacitor element is opposed to any one surface of the pair of side surfaces of the first capacitor element, the pair of side surfaces of the second capacitor element, and the pair of side surfaces of the third capacitor element with the mold resin layer interposed. Another remaining surface of the pair of end surfaces of the first capacitor element, the pair of end surfaces of the second capacitor element, and the pair of end surfaces of the third capacitor element is opposed to any one surface of the pair of side surfaces of the first capacitor element, the pair of side surfaces of the second capacitor element, and the pair of side surfaces of the third capacitor element with the mold resin layer interposed.

In a capacitor element-mounted structure according to a preferred embodiment of the present invention, one of the pair of end surfaces of the first capacitor element may be opposed to one of the pair of side surfaces of the second capacitor element with the mold resin layer interposed, and the remaining other of the pair of end surfaces of the first capacitor element may be opposed to one of the pair of side surfaces of the third capacitor element with the mold resin layer interposed.

In a capacitor element-mounted structure according to a preferred embodiment of the present invention, one of the pair of end surfaces of the first capacitor element may be opposed to one of the pair of side surfaces of the second capacitor element with the mold resin layer interposed, and one of the pair of end surfaces of the third capacitor element may be opposed to the remaining other of the pair of side surfaces of the second capacitor element with the mold resin layer interposed.

In a capacitor element-mounted structure according to a preferred embodiment of the present invention, one of the pair of end surfaces of the first capacitor element and one the pair of end surfaces of the third capacitor element may be opposed to one of the pair of side surfaces of the second capacitor element with the mold resin layer interposed.

In a capacitor element-mounted structure according to a preferred embodiment of the present invention, it is preferable that both of the stacking direction in the first capacitor element and the stacking direction in the second capacitor element are oriented in a direction along the main surface of the wiring board.

In a capacitor element-mounted structure according to a preferred embodiment of the present invention, the stacking direction in the third capacitor element may be oriented in a direction along the main surface of the wiring board.

In a capacitor element-mounted structure according to a preferred embodiment of the present invention, the stacking direction in the third capacitor element may be oriented in a direction not along the main surface of the wiring board.

A capacitor element-mounted structure according to a preferred embodiment of the present invention includes a first capacitor element, a second capacitor element, a third capacitor element, and a fourth capacitor element each including a rectangular or substantially rectangular parallelepiped-shaped multilayer structure including a dielectric layer and an internal electrode layer alternately stacked along a stacking direction; a wiring board including a main surface with the first capacitor element, the second capacitor element, the third capacitor element, and the fourth capacitor element mounted thereon; and a mold resin layer encapsulating the first capacitor element, the second capacitor element, the third capacitor element, and the fourth capacitor element. The first capacitor element, the second capacitor element, the third capacitor element, and the fourth capacitor element are electrically connected in series or in parallel through a conductive pattern provided on the wiring board. The first capacitor element, the second capacitor element, the third capacitor element, and the fourth capacitor element each include a surface opposed to the wiring board, the opposed surface having short sides and long sides. Each of the first capacitor element, the second capacitor element, the third capacitor element, and the fourth capacitor element includes a pair of end surfaces positioned to face each other in a direction in which the long sides extend, a pair of side surfaces positioned to face each other in a direction in which the short sides extend, and a pair of external electrodes spaced apart from each other on an outer surface of the multilayer structure. Each of the external electrodes included in the first capacitor element, the second capacitor element, the third capacitor element, and the fourth capacitor element is bonded to a land through a conductive bonding member, the land being provided on the wiring board so as to correspond to each of the external electrodes. One of the pair of end surfaces of the first capacitor element is opposed to one of the pair of side surfaces of the second capacitor element with the mold resin layer interposed. One of the pair of end surfaces of the second capacitor element is opposed to one of the pair of side surfaces of the third capacitor element with the mold resin layer interposed. One of the pair of end surfaces of the third capacitor element is opposed to one of the pair of side surfaces of the fourth capacitor element with the mold resin layer interposed. One of the pair of end surfaces of the fourth capacitor element is opposed to one of the pair of side surfaces of the first capacitor element with the mold resin layer interposed.

In a capacitor element-mounted structure according to a preferred embodiment of the present invention, it is preferable that both of the stacking direction in the first capacitor element and the stacking direction in the second capacitor element are oriented in a direction along the main surface of the wiring board.

In a capacitor element-mounted structure according to a preferred embodiment of the present invention, both of the stacking direction in the third capacitor element and the stacking direction in the fourth capacitor element may be oriented in a direction along the main surface of the wiring board.

In a capacitor element-mounted structure according to a preferred embodiment of the present invention, both of the stacking direction in the third capacitor element and the stacking direction in the fourth capacitor element may be oriented in a direction not along the main surface of the wiring board.

A capacitor element-mounted structure according to a preferred embodiment of the present invention includes a first capacitor element, a second capacitor element, a third capacitor element, and a fourth capacitor element each including a rectangular or substantially rectangular parallelepiped-shaped multilayer structure including a dielectric layer and an internal electrode layer alternately stacked along a stacking direction; a wiring board including a main surface having the first capacitor element, the second capacitor element, the third capacitor element, and the fourth capacitor element mounted thereon; and a mold resin layer encapsulating the first capacitor element, the second capacitor element, the third capacitor element, and the fourth capacitor element. The first capacitor element, the second capacitor element, the third capacitor element, and the fourth capacitor element are electrically connected in series or in parallel through a conductive pattern provided on the wiring board. The first capacitor element, the second capacitor element, the third capacitor element, and the fourth capacitor element each include a surface opposed to the wiring board, the opposed surface having short sides and long sides. Each of the first capacitor element, the second capacitor element, the third capacitor element, and the fourth capacitor element includes a pair of end surfaces opposed to face each other in a direction in which the long sides extend, a pair of side surfaces positioned to face each other in a direction in which the short sides extend, and a pair of external electrodes spaced apart from each other on an outer surface of the multilayer structure. Each of the external electrodes included in the first capacitor element, the second capacitor element, the third capacitor element, and the fourth capacitor element is bonded to a land through a conductive bonding member, the land being provided on the wiring board so as to correspond to each of the external electrodes. One of the pair of end surfaces of the first capacitor element is opposed to one of the pair of side surfaces of the second capacitor element with the mold resin layer interposed. One of the pair of end surfaces of the third capacitor element is opposed to one of the pair of side surfaces of the fourth capacitor element with the mold resin layer interposed. Both of the stacking direction in the first capacitor element and the stacking direction in the second capacitor element are oriented in a direction along the main surface of the wiring board. Both of the stacking direction in the third capacitor element and the stacking direction in the fourth capacitor element are oriented in a direction not along the main surface of the wiring board.

In a capacitor element-mounted structure according to a preferred embodiment of the present invention, it is preferable that the other of the pair of side surfaces of the second capacitor element is opposed to the other of the pair of end surfaces of the third capacitor element with the mold resin layer interposed.

In a capacitor element-mounted structure according to a preferred embodiment of the present invention, it is preferable that one of the pair of side surfaces of the first capacitor element is opposed to one of the pair of side surfaces of the third capacitor element with the mold resin layer interposed, and that one of the pair of end surfaces of the second capacitor element is opposed to one of the pair of end surfaces of the fourth capacitor element with the mold resin layer interposed.

Here, the term "rectangular or substantially rectangular parallelepiped-shaped capacitor element" in the foregoing description includes the one having rounded corners or edges and the one having steps or depressions and protrusions on its surface that may be ignored when viewed as a whole.

The term "surface in a rectangular shape" in the description includes a shape with an outline with rounded corners and a shape including bends or curves that may be ignored when viewed as a whole on the sides of the outline.

The wording "the end surface and the side surface are opposed" in the description includes a structure in which the entire surface of one of the end surface and the side surface is opposed to the other surface and also includes a structure in which a partial region of one surface is opposed to a partial region of the other surface.

Preferred embodiments of the present invention significantly reduce or prevent vibration produced in a capacitor element-mounted structure including a plurality of capacitor elements encapsulated with a mold resin layer on a wiring board.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7A is a diagram showing a first layout pattern belonging to a first layout group in a case in which two monolithic ceramic capacitors are arranged in proximity.

FIG. 7B is a diagram showing a second layout pattern belonging to the first layout group in a case in which two monolithic ceramic capacitors are arranged in proximity.

FIG. 7C is a diagram showing a third layout pattern belonging to the first layout group in a case in which two monolithic ceramic capacitors are arranged in proximity.

DETAILED DESCRIPTION OF THE PREFERRED EMBODIMENTS

Figure 1:
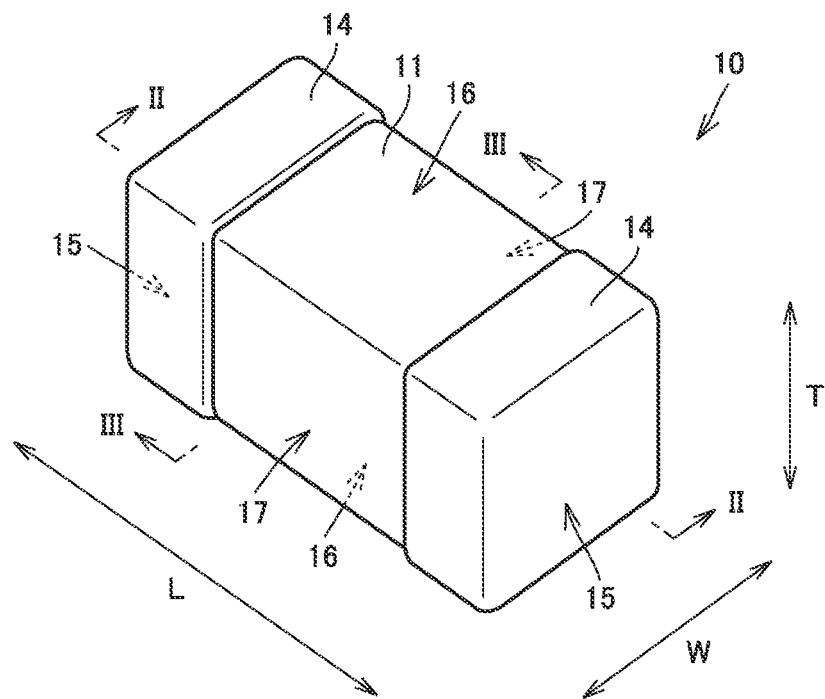
FIG. 1 is a perspective view of a monolithic ceramic capacitor included in a circuit module according to a preferred embodiment of the present invention.

Preferred embodiments of the present invention will be described in detail below in conjunction with the drawing figures. It is noted that in the following preferred embodiments the same or corresponding components and features are denoted with the same reference signs and a description thereof will not be repeated.

In the preferred embodiments described below, a circuit module in which a monolithic ceramic capacitor made of a ceramic material as a dielectric material is encapsulated as a capacitor element will be described by way of illustration. Other examples of the circuit module to which preferred embodiments of the present invention are applicable include a circuit module in which a multilayer metallized film capacitor made of a resin film as a dielectric material is encapsulated as a capacitor element.

Figure 2:
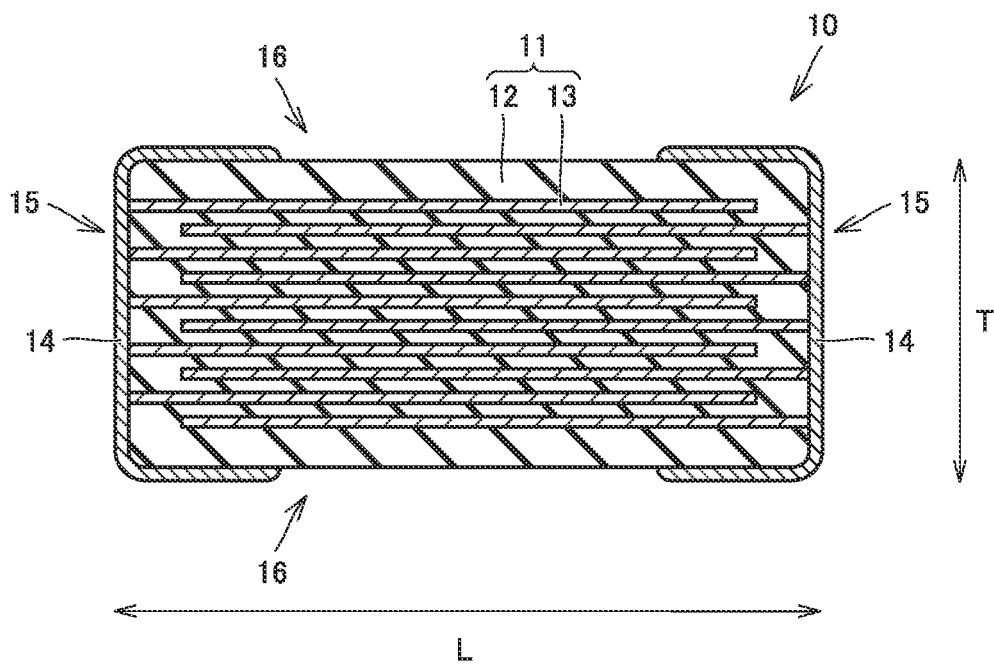
FIG. 2 is a cross-sectional view of the monolithic ceramic capacitor shown in FIG. 1 along line II-II shown in FIG. 1.
Figure 3:
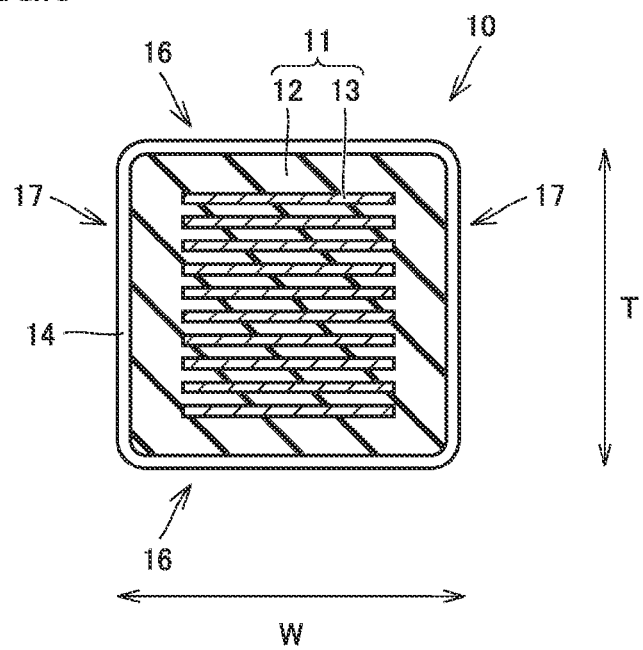
FIG. 3 is a cross-sectional view of the monolithic ceramic capacitor shown in FIG. 1 along line III-III shown in FIG. 1.

FIG. 1 is a perspective view of a monolithic ceramic capacitor included in a circuit module according to a preferred embodiment of the present invention. FIG. 2 is a cross-sectional view of the monolithic ceramic capacitor shown in FIG. 1 along line II-II shown in FIG. 1, and FIG. 3 is a cross-sectional view of the monolithic ceramic capacitor shown in FIG. 1 along line III-III shown in FIG. 1. Referring first to FIG. 1 to FIG. 3, the monolithic ceramic capacitor included in the circuit module according to the present preferred embodiment will be described.

As shown in FIG. 1 to FIG. 3, the monolithic ceramic capacitor 10 is an electronic component preferably with a rectangular or substantially rectangular parallelepiped shape as a whole and has a multilayer structure 11 and a pair of external electrodes 14.

As shown in FIG. 2 and FIG. 3, multilayer structure 11 includes dielectric layers 12 and internal electrode layers 13 alternately stacked along a predetermined direction. Dielectric layer 12 is made of, for example, a ceramic material composed mainly of barium titanate. Dielectric layer 12 may further contain an Mn compound, an Mg compound, an Si compound, a Co compound, a Ni compound, a rare-earth compound or the like as a subcomponent of ceramic powder serving as a raw material of the ceramic sheet described later. On the other hand, internal electrode layer 13 is made of a metal material, typically including Ni, Cu, Ag, Pd, Ag—Pd alloy, and Au.

Multilayer structure 11 is fabricated preferably by preparing a plurality of material sheets having conductive paste printed as internal electrode layer 13 on the surface of a ceramic sheet (which is called green sheet) defining and functioning as dielectric layer 12 and crimping and baking these stacked material sheets.

The material of dielectric layer 12 is not limited to the ceramic material composed mainly of barium titanate, and any other high-permittivity ceramic materials (for example, composed mainly of $CaTiO_3$, $SrTiO_3$, or the like) may be selected as the material of dielectric layer 12. The material of internal electrode layer 13 is not limited to the metal material described above and any other conductive materials may be selected as the material of internal electrode layer 13.

As shown in FIG. 1 and FIG. 2, a pair of external electrodes 14 are spaced apart from each other so as to cover the outer surface on both ends of multilayer structure 11 in a predetermined direction. A pair of external electrodes 14 is provided with a conductive film.

A pair of external electrodes 14 includes, for example, a multilayer film including a sintered metal layer and a plating layer. The sintered metal layer is formed, for example, preferably by baking paste of Cu, Ni, Ag, Pd, Ag—Pd alloy, Au, or the like. The plating layer includes, for example, an Ni plating layer and an Sn plating layer covering the Ni plating layer. Alternatively, the plating layer may be a Cu plating layer or an Au plating layer. A pair of external electrodes 14 may be provided with a plating layer alone.

Furthermore, conductive resin paste including a metal component and a resin component may be used for a pair of external electrodes 14. When conductive resin paste is used as a pair of external electrodes 14, the resin component included in the conductive resin paste brings about the effect of absorbing vibration produced in multilayer structure 11 and therefore makes it possible to effectively attenuate vibration propagating from multilayer structure 11 to the outside.

As shown in FIG. 2, one of a pair of internal electrode layers 13 adjacent with dielectric layer 12 interposed along the stacking direction is electrically connected to one of a pair of external electrodes 14 in the inside of monolithic ceramic capacitor 10, and the other of a pair of internal electrode layers 13 adjacent with dielectric layer 12 interposed along the stacking direction is electrically connected to the other of a pair of external electrodes 14 in the inside of monolithic ceramic capacitor 10. A plurality of capacitor components are thus electrically connected in parallel between a pair of external electrodes 14.

Here, as shown in FIG. 1 to FIG. 3, the direction in which a pair of external electrodes 14 are arranged is defined as the length direction L of monolithic ceramic capacitor 10. The stacking direction of dielectric layers 12 and internal electrode layers 13 in multilayer structure 11 is defined as the thickness direction T. The direction perpendicular or substantially perpendicular to both of the length direction L and the thickness direction T is defined as the width direction W. Then, monolithic ceramic capacitor 10 in the present preferred embodiment preferably has an elongated rectangular or substantially rectangular parallelepiped shape such that the external dimension along the length direction L is longest.

The typical values of the external dimension in the length direction L and the external dimension in the width direction W of monolithic ceramic capacitor 10 (usually, the external dimension in the thickness direction T is equal to the external dimension in the width direction W) are approximately, for example, 3.2 mm×1.6 mm, 2.0 mm×1.25 mm, 1.6 mm×0.8 mm, 1.0 mm×0.5 mm, 0.8 mm×0.4 mm, 0.6 mm×0.3 mm, or 0.4 mm×0.2 mm.

Of the six surfaces of the rectangular or substantially rectangular parallelepiped-shaped monolithic ceramic capacitor 10, a pair of surfaces positioned to face each other in the length direction L are defined as end surfaces 15, and the four surfaces connecting a pair of end surfaces 15 are defined as side surfaces 16, 17. Of the four side surfaces 16, 17, a pair of surfaces positioned to face each other in the thickness direction T are defined as thickness-direction side surfaces 16, and a pair of surfaces positioned to face each other in the width direction W are defined as width-direction side surfaces 17. In the following description, these defined terms will be used. A pair of thickness-direction side surfaces 16 and a pair of width-direction side surfaces 17 each preferably have a rectangular or substantially rectangular shape including a pair of long sides extending in the length direction L and a pair of short sides connecting the pair of long sides.

Figure 4:
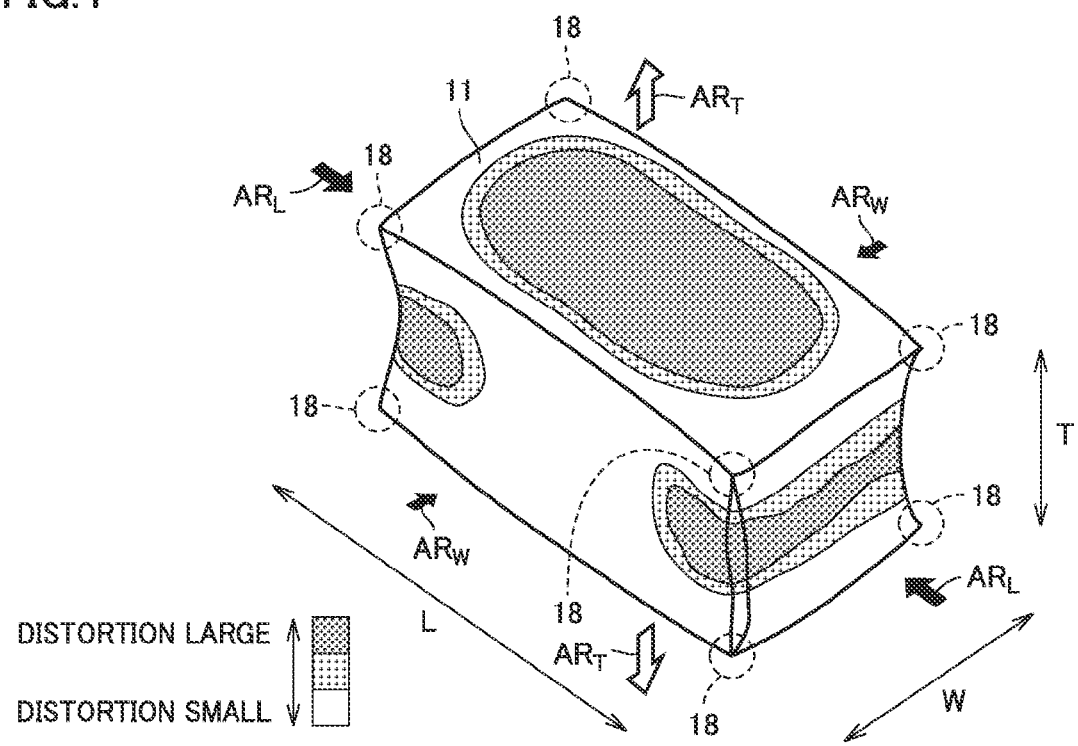
FIG. 4 is a diagram showing the result of simulation of distortion occurring in the multilayer structure of the monolithic ceramic capacitor shown in FIG. 1 during voltage application.

FIG. 4 is a diagram showing the result of simulation of distortion occurring in the multilayer structure of the monolithic ceramic capacitor shown in FIG. 1 during voltage application. Referring now to FIG. 4, distortion that may occur in the monolithic ceramic capacitor included in a circuit module in the present preferred embodiment will be described.

When AC voltage or DC voltage having superimposed AC voltage is applied a pair of external electrodes 14 of the monolithic ceramic capacitor 10 described above, mechanical distortion is produced in multilayer structure 11 as shown in FIG. 4 and this becomes distortion of monolithic ceramic capacitor 10.

As shown in FIG. 4, during voltage application, multilayer structure 11 is distorted significantly greatly outward along the thickness direction T as shown by arrow $AR_T$ in the figure. With this, multilayer structure 11 is distorted inward somewhat greatly along the length direction L as shown by arrow $AR_L$ in the figure, and multilayer structure 11 is distorted slightly inward along the width direction W as shown by arrow $AR_W$ in the figure. By contrast, almost no distortion occurs at corners 18 of multilayer structure 11 having an elongated rectangular or substantially rectangular parallelepiped shape. In the drawings, the distortion occurring outward of multilayer structure 11 is shown by white arrows, and the distortion occurring inward of multilayer structure 11 is shown by black arrows. The magnitudes of these distortions are represented by the size of the arrows.

Therefore, similar distortion occurs also in monolithic ceramic capacitor 10 during voltage application, and distortion as described above repeatedly occurs in synchronization with the cycle of voltage applied monolithic ceramic capacitor 10. As a result, monolithic ceramic capacitor 10 becomes a source of vibration in the circuit module including monolithic ceramic capacitor 10, and the vibration propagates to the mold resin layer and the wiring board to cause vibration of the circuit module, leading to noise or malfunction of other elements.

Figure 5A:
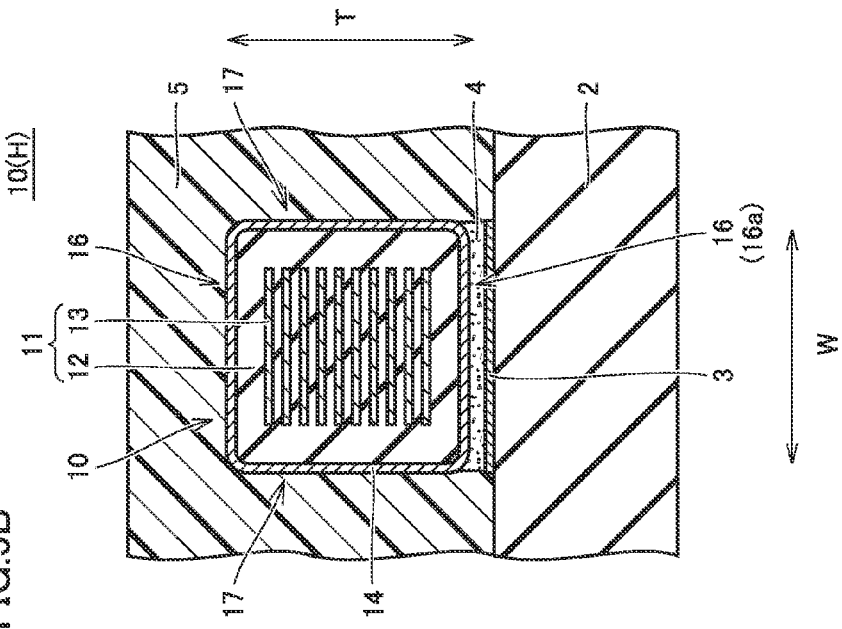
FIG. 5A is a schematic cross-sectional view showing a first mounting mode of the monolithic ceramic capacitor shown in FIG. 1 in a circuit module.
Figure 5B:
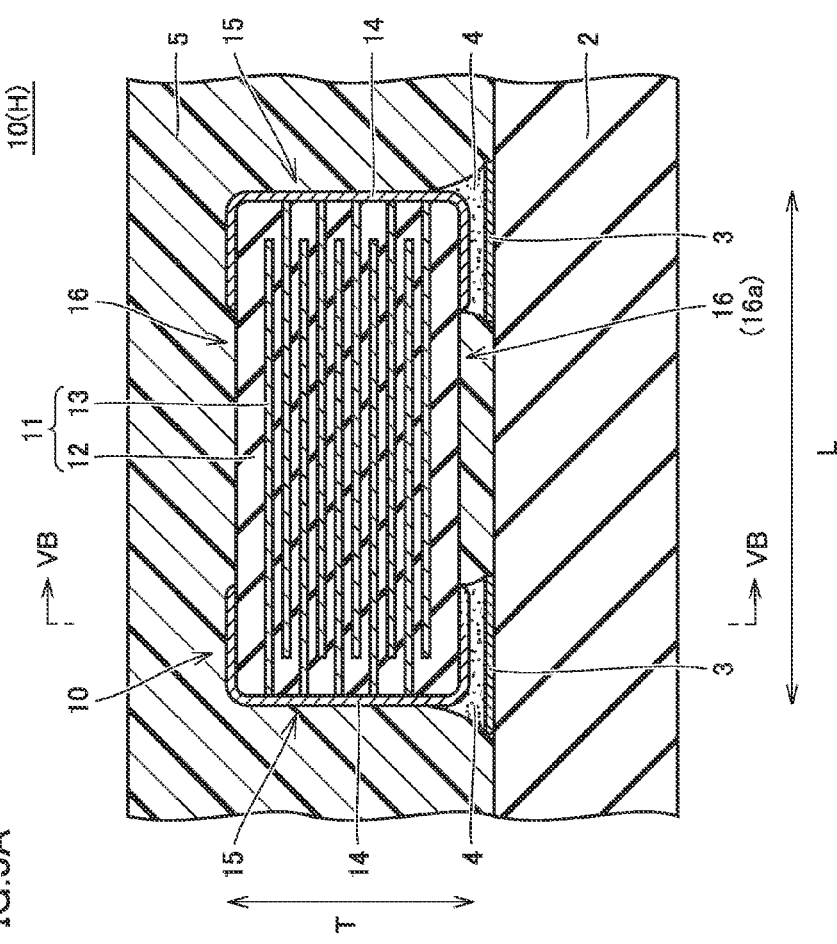
FIG. 5B is a cross-sectional view along line VB-VB shown in FIG. 5A.
Figure 6A:
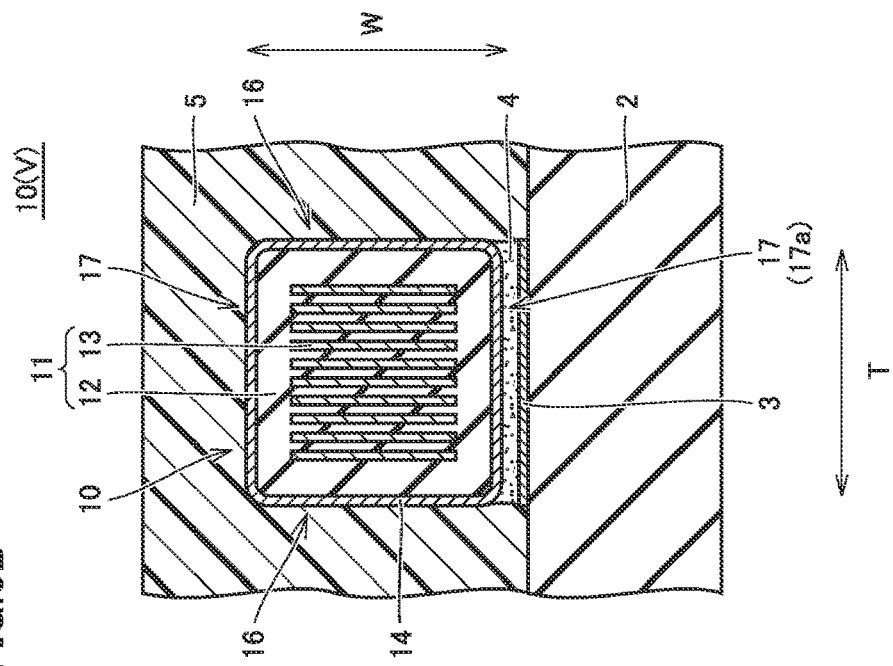
FIG. 6A is a schematic cross-sectional view showing a second mounting mode of the monolithic ceramic capacitor shown in FIG. 1 in a circuit module.
Figure 6B:
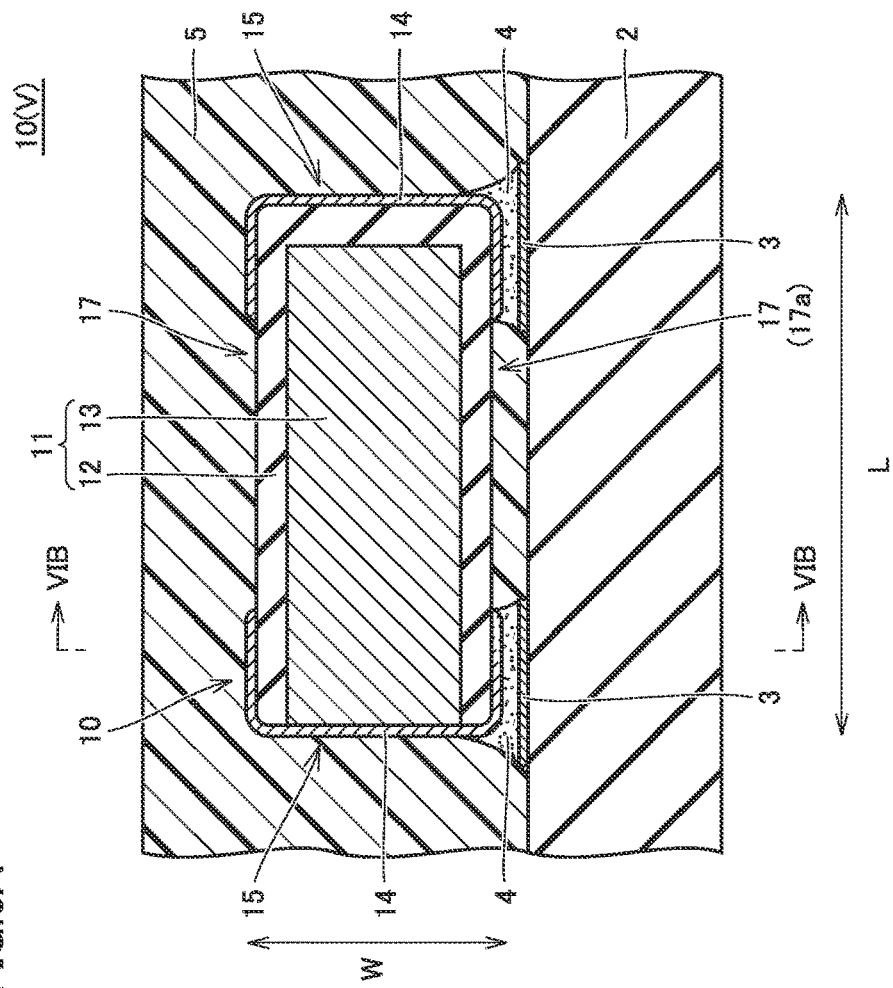
FIG. 6B is a cross-sectional view along line VIB-VIB shown in FIG. 6A.

FIG. 5 and FIG. 6 are cross-sectional views schematically showing first and second mounting modes of the monolithic ceramic capacitor shown in FIG. 1 in a circuit module. Two mounting modes different in orientation to the wiring board are supposed as the mounting modes of the monolithic ceramic capacitor in a circuit module. Referring to FIG. 5 and FIG. 6, the two mounting modes will be described below. The cross sections shown in FIG. 5B and FIG. 6B are cross sections along line VB-VB shown in FIG. 5A and line VIB-VIB shown in FIG. 6A, respectively.

As shown in FIG. 5 and FIG. 6, in both of a first mounting mode 10(H) and a second mounting mode 10(V), monolithic ceramic capacitor 10 is arranged on the main surface of wiring board 2 such that the length direction L which is the direction connecting a pair of end surfaces 15 is oriented in the direction along the main surface of wiring board 2. That is, any one of side surfaces 16 and 17 having a rectangular or substantially rectangular shape including long sides and short sides is the opposed surface opposed to the main surface of wiring board 2. In this state, mold resin layer 5 is provided on the main surface of wiring board 2 so as to encapsulate monolithic ceramic capacitor 10.

Wiring board 2 is made of an insulating substrate having a conductive pattern on one of a pair of its main surfaces. Examples of the material of wiring board 2 include those composed of resin materials such as epoxy resin and ceramic materials such as alumina and those additionally including fillers or fabrics of inorganic materials or organic materials. In general, a glass epoxy substrate formed by adding glass fabrics to an epoxy resin substrate is suitably used as wiring board 2.

On the main surface of wiring board 2, a pair of lands 3 are provided corresponding to monolithic ceramic capacitor 10. The pair of lands 3 correspond to a portion of the above-noted conductive pattern and are disposed so as to be spaced apart from each other.

The pair of lands 3 preferably has a size corresponding to a pair of external electrodes 14 of each monolithic ceramic capacitor 10 and each includes a portion opposed to the corresponding external electrode 14 along the normal direction to the main surface of wiring board 2. As the material of a pair of lands 3, a variety of conductive materials can be used, and in general, metal materials such as copper foil are suitably used.

A pair of external electrodes 14 of each monolithic ceramic capacitor 10 are bonded with a pair of lands 3 provided on wiring board 2 through respective conductive bonding members 4. For example, conductive adhesive or solder can be used as bonding member 4. Here, when conductive adhesive is used as bonding member 4, the resin component included in the conductive adhesive brings about the effect of absorbing vibration generated in monolithic ceramic capacitor 10 and therefore makes it possible to effectively attenuate vibration propagating from monolithic ceramic capacitor 10 to the outside.

Mold resin layer 5 is positioned to cover the main surface of wiring board 2 at a portion where monolithic ceramic capacitor 10 is mounted, and encapsulates monolithic ceramic capacitor 10 on the main surface of wiring board 2. More specifically, mold resin layer 5 covers the main surface of wiring board 2, the surfaces of lands 3 provided on wiring board 2, the surfaces of bonding members 4, and the surfaces of monolithic ceramic capacitor 10 to prevent the surfaces of these members from being exposed on the outside of the circuit module. The space between wiring board 2 and monolithic ceramic capacitor 10, between a pair of lands 3, and between a pair of bonding members 4 is preferably filled with mold resin layer 5 but may not be necessarily filled with mold resin layer 5, and the space may be simply surrounded by mold resin layer 5.

The material of mold resin layer 5 may be, but not limited to, a variety of thermoplastic resin materials or thermosetting resin materials. Fillers made of various materials may be added to mold resin layer 5. In view of the reliability of the circuit module, the difference in coefficient of linear expansion between mold resin layer 5 and wiring board 2 or electronic components mounted thereon is preferably small. When the above-noted glass epoxy substrate is used as wiring board 2, epoxy resin is usually used as mold resin layer 5. Although not shown, a member such as a conductive layer may be separately provided on the surface of mold resin layer 5.

To assemble monolithic ceramic capacitor 10 in a circuit module, first of all, conductive adhesive or solder paste is applied, for example, by screen printing on a pair of lands 3, provided on wiring board 2 in advance, and with monolithic ceramic capacitor 10 placed thereon, these components are put into a reflow furnace. A fillet is thus formed in bonding member 4, and monolithic ceramic capacitor 10 is mounted on wiring board 2. Subsequently, mold resin layer 5 is formed on the main surface of wiring board 2 populated with monolithic ceramic capacitor 10 by transfer mold or potting to fabricate a circuit module.

Here, as shown in FIGS. 5A and 5B, in first mounting mode 10(H), monolithic ceramic capacitor 10 is arranged on wiring board 2 such that the thickness direction T which is the stacking direction of dielectric layers 12 and internal electrode layers 13 in multilayer structure 11 of monolithic ceramic capacitor 10 is oriented in a direction not along the main surface of wiring board (that is, such that the thickness direction T of monolithic ceramic capacitor 10 is perpendicular or substantially perpendicular to the main surface of wiring board 2). Thus, in first mounting mode 10(H), one of a pair of thickness-direction side surfaces 16 positioned to face each other in the thickness direction T of monolithic ceramic capacitor 10 is an opposed surface 16a that is opposed to wiring board 2.

On the other hand, as shown in FIGS. 6A and 6B, in second mounting mode 10(V), monolithic ceramic capacitor 10 is arranged on wiring board 2 such that the thickness direction T which is the stacking direction of dielectric layers 12 and internal electrode layers 13 in multilayer structure 11 of monolithic ceramic capacitor 10 is oriented in the direction along the main surface of wiring board 2 (that is, such that the thickness direction T of monolithic ceramic capacitor 10 is positioned parallel or substantially parallel to the main surface of wiring board 2). Thus, in second mounting mode 10(V), one of a pair of width-direction side surfaces 17 positioned to face each other in the width direction W of monolithic ceramic capacitor 10 is opposed surface 17a opposed to wiring board 2.

Figure 8A:
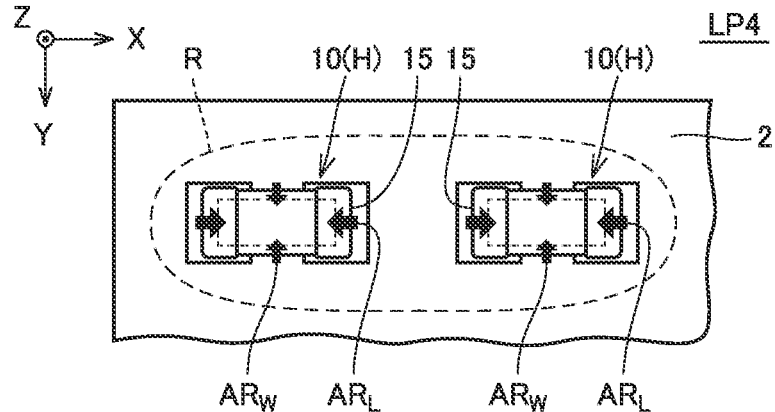
FIG. 8A is a diagram showing a fourth layout pattern belonging to a second layout group in a case in which two monolithic ceramic capacitors are arranged in proximity.
Figure 8B:
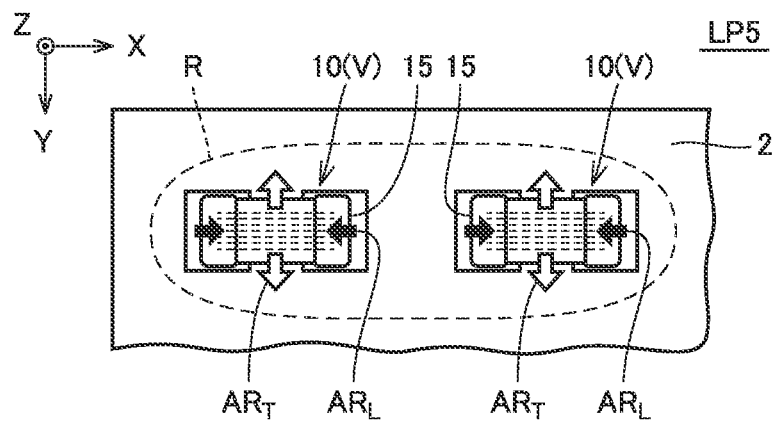
FIG. 8B is a diagram showing a fifth layout pattern belonging to the second layout group in a case in which two monolithic ceramic capacitors are arranged in proximity.
Figure 8C:
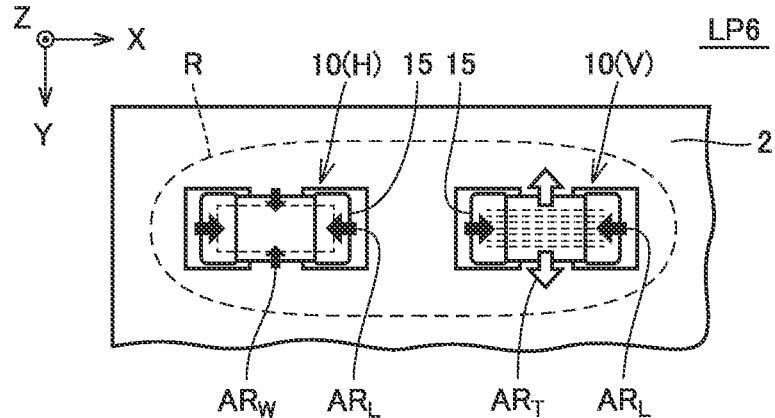
FIG. 8C is a diagram showing a sixth layout pattern belonging to the second layout group in a case in which two monolithic ceramic capacitors are arranged in proximity.

FIG. 7 to FIG. 9 are diagrams showing a variety of layout patterns in a case in which two monolithic ceramic capacitors are arranged in proximity. Here, FIGS. 7A to 7C are diagrams showing first to third layout patterns, respectively, belonging to a first layout group. FIGS. 8A to 8C are diagrams showing fourth to sixth layout patterns, respectively, belonging to a second layout group. FIGS. 9A to 9D are diagrams showing seventh to tenth layout patterns, respectively, belonging to a third layout group. Referring now to FIG. 7 to FIG. 9, the details of a variety of layout patterns in the case in which two monolithic ceramic capacitors are arranged in proximity will be described, and the magnitude of vibration generated in a region R where these two monolithic ceramic capacitors are arranged in a circuit module when the layout pattern is provided will be described. Here, the "vicinity" means a range in which the distance between two ceramic capacitors is preferably about 1.0 mm or less, for example. In FIG. 7 to FIG. 9, mold resin layer 5 is not shown.

As shown in FIGS. 7A to 7C, in all of first to third layout patterns LP1 to LP3 belonging to the first layout group, two monolithic ceramic capacitors are arranged such that the axes along the length direction L of the two monolithic ceramic capacitors are positioned in parallel or substantially in parallel at a distance from each other on the main surface of wiring board 2.

In first layout pattern LP1 shown in FIG. 7A, two monolithic ceramic capacitors are both mounted in the above-noted first mounting mode 10(H). In this case, one of a pair of width-direction side surfaces 17 of one monolithic ceramic capacitor is opposed to one of a pair of width-direction side surfaces 17 of the other monolithic ceramic capacitor with mold resin layer 5 interposed.

In the case of first layout pattern LP1, in the X-axis direction shown in the figure, somewhat large distortion along the length direction L (see arrow $AR_L$) generated in one monolithic ceramic capacitor and somewhat large distortion along the length direction L (see arrow $AR_L$) generated in the other monolithic ceramic capacitor act to mutually amplify vibration in region R, and vibration in the X-axis direction is increased to a considerable degree. Furthermore, in the case of first layout pattern LP1, in the Y-axis direction shown in the figure, slightly large distortion along the width direction W (see arrow $AR_W$) generated in one monolithic ceramic capacitor and slightly large distortion along the width direction W (see arrow $AR_W$) generated in the other monolithic ceramic capacitor act to mutually amplify vibration in region R, but the vibration in the Y-axis direction is suppressed to be relatively small.

In second layout pattern LP2 shown in FIG. 7B, two monolithic ceramic capacitors are both mounted in the above-noted second mounting mode 10(V). In this case, one of a pair of thickness-direction side surfaces 16 of one monolithic ceramic capacitor is opposed to one of a pair of thickness-direction side surfaces 16 of the other monolithic ceramic capacitor with mold resin layer 5 interposed.

In the case of second layout pattern LP2, in the X-axis direction shown in the figure, somewhat large distortion along the length direction L (see arrow $AR_L$) generated in one monolithic ceramic capacitor and somewhat large distortion along the length direction L (see arrow $AR_L$) generated in the other monolithic ceramic capacitor act to mutually amplify vibration in region R, and the vibration in the X-axis direction is increased to a considerable degree. Furthermore, in the case of second layout pattern LP2, in the Y-axis direction shown in the figure, significantly large distortion along the thickness direction T (see arrow $AR_T$) generated in one monolithic ceramic capacitor and significantly large distortion along the thickness direction T (see arrow $AR_T$) generated in the other monolithic ceramic capacitor act to mutually amplify vibration in region R, and the vibration in the Y-axis direction is extremely increased.

In third layout pattern LP3 shown in FIG. 7C, one of two monolithic ceramic capacitors is mounted in second mounting mode 10(V) and the other of the two monolithic ceramic capacitors is mounted in first mounting mode 10(H). In this case, one of a pair of thickness-direction side surfaces 16 of one monolithic ceramic capacitor is opposed to one of a pair of width-direction side surfaces 17 of the other monolithic ceramic capacitor with mold resin layer 5 interposed.

In the case of third layout pattern LP3, in the X-axis direction shown in the figure, somewhat large distortion along the length direction L (see arrow $AR_L$) generated in one monolithic ceramic capacitor and somewhat large distortion along the length direction L (see arrow $AR_L$) generated in the other monolithic ceramic capacitor act to mutually amplify vibration in region R, and the vibration in the X-axis direction is increased to a considerable degree. In the case of third layout pattern LP3, in the Y-axis direction shown in the figure, significantly large distortion along the thickness direction T (see arrow $AR_T$) generated in one monolithic ceramic capacitor and slightly large distortion along the width direction W (see arrow $AR_W$) generated in the other monolithic ceramic capacitor act to mutually cancel out vibration in region R, and the vibration in the Y-axis direction is suppressed to be small to a considerable degree.

As is clear from the foregoing, it can be said that, among the first to third layout patterns LP1 to LP3 belonging to the first layout group, the third layout pattern LP3 in which vibration is partially cancelled out in region R is preferable in terms of suppressing vibration.

As shown in FIGS. 8A to 8C, in all of the fourth to sixth layout patterns LP4 to LP6 belonging to the second layout group, two monolithic ceramic capacitors are arranged such that the axes along the length direction L of the two monolithic ceramic capacitors are positioned on the same straight line on the main surface of wiring board 2.

In the fourth layout pattern LP4 shown in FIG. 8A, two monolithic ceramic capacitors are both mounted in first mounting mode 10(H). In this case, one of a pair of end surfaces 15 of one monolithic ceramic capacitor is opposed to one of a pair of end surfaces 15 of the other monolithic ceramic capacitor with mold resin layer 5 interposed.

In the case of the fourth layout pattern LP4, in the X-axis direction shown in the figure, somewhat large distortion along the length direction L (see arrow $AR_L$) generated in one monolithic ceramic capacitor and somewhat large distortion along the length direction L (see arrow $AR_L$) generated in the other monolithic ceramic capacitor act to mutually amplify vibration in region R, and the vibration in the X-axis direction is increased to a considerable degree. Furthermore, in the case of fourth layout pattern LP4, in the Y-axis direction shown in the figure, slightly large distortion along the width direction W (see arrow $AR_W$) generated in one monolithic ceramic capacitor and slightly large distortion along the width direction W (see arrow $AR_W$) generated in the other monolithic ceramic capacitor act to mutually amplify vibration in region R, but the vibration in the Y-axis direction is suppressed to be relatively small.

In the fifth layout pattern LP5 shown in FIG. 8B, two monolithic ceramic capacitors are both mounted in the above-noted second mounting mode 10(V). In this case, one of a pair of end surfaces 15 of one monolithic ceramic capacitor is opposed to one of a pair of end surfaces 15 of the other monolithic ceramic capacitor with mold resin layer 5 interposed.

In the case of fifth layout pattern LP5, in the X-axis direction shown in the figure, somewhat large distortion along the length direction L (see arrow $AR_L$) generated in one monolithic ceramic capacitor and somewhat large distortion along the length direction L (see arrow $AR_L$) generated in the other monolithic ceramic capacitor act to mutually amplify vibration in region R, and the vibration in the X-axis direction is increased to a considerable degree. Furthermore, in the case of the fifth layout pattern LP5, in the Y-axis direction shown in the figure, significantly large distortion along the thickness direction T (see arrow $AR_T$) generated in one monolithic ceramic capacitor and significantly large distortion along the thickness direction T (see arrow $AR_T$) generated in the other monolithic ceramic capacitor act to mutually amplify vibration in region R, and the vibration in the Y-axis direction is extremely increased.

In the sixth layout pattern LP6 shown in FIG. 8C, one of two monolithic ceramic capacitors is mounted in the above-noted second mounting mode 10(V) and the other of the two monolithic ceramic capacitors is mounted in the above-noted first mounting mode 10(H). In this case, one of a pair of end surfaces 15 of one monolithic ceramic capacitor is opposed to one of a pair of end surfaces 15 of the other monolithic ceramic capacitor with mold resin layer 5 interposed.

In the case of the sixth layout pattern LP6, in the X-axis direction shown in the figure, somewhat large distortion along the length direction L (see arrow $AR_L$) generated in one monolithic ceramic capacitor and somewhat large distortion along the length direction L (see arrow $AR_L$) generated in the other monolithic ceramic capacitor act to mutually amplify vibration in region R, and the vibration in the X-axis direction is increased to a considerable degree. Furthermore, in the case of sixth layout pattern LP6, in the Y-axis direction shown in the figure, significantly large distortion along the thickness direction T (see arrow $AR_T$) generated in one monolithic ceramic capacitor and slightly large distortion along the width direction W (see arrow $AR_W$) generated in the other monolithic ceramic capacitor act to mutually cancel out vibration in region R, and the vibration in the Y-axis direction is suppressed to be small to a considerable degree.

As is clear from the foregoing, it can be said that, among the fourth to sixth layout patterns LP4 to LP6 belonging to the second layout group, the sixth layout pattern LP6 alone, in which vibration is partially cancelled out in region R, is preferred in terms of suppressing vibration.

As shown in FIGS. 9A to 9D, in all of seventh to tenth layout patterns LP7 to LP10 belonging to the third layout group, two monolithic ceramic capacitors are arranged such that the axes along the length direction L of the two monolithic ceramic capacitors are perpendicular or substantially perpendicular to each other on the main surface of wiring board 2.

Figure 9A:
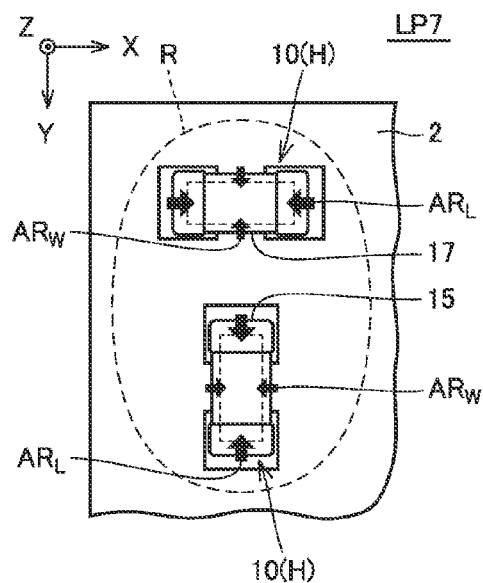
FIG. 9A is a diagram showing a seventh layout pattern belonging to a third layout group in a case in which two monolithic ceramic capacitors are arranged in proximity.

In the seventh layout pattern LP7 shown in FIG. 9A, two monolithic ceramic capacitors are both mounted in the above-noted first mounting mode 10(H). In this case, one of a pair of end surfaces 15 of one monolithic ceramic capacitor is opposed to one of a pair of width-direction side surfaces 17 of the other monolithic ceramic capacitor with mold resin layer 5 interposed.

In the case of the seventh layout pattern LP7, in the X-axis direction shown in the figure, slightly large distortion along the width direction W (see arrow $AR_W$) generated in one monolithic ceramic capacitor and somewhat large distortion along the length direction L (see arrow $AR_L$) generated in the other monolithic ceramic capacitor act to mutually amplify vibration in region R, but the vibration in the X-axis direction is suppressed to be relatively small. Furthermore, in the case of seventh layout pattern LP7, in the Y-axis direction shown in the figure, somewhat large distortion along the length direction L (see arrow $AR_L$) generated in one monolithic ceramic capacitor and slightly large distortion along the width direction W (see arrow $AR_W$) generated in the other monolithic ceramic capacitor act to mutually amplify vibration in region R, but the vibration in the X-axis direction is suppressed to be relatively small.

Figure 9B:
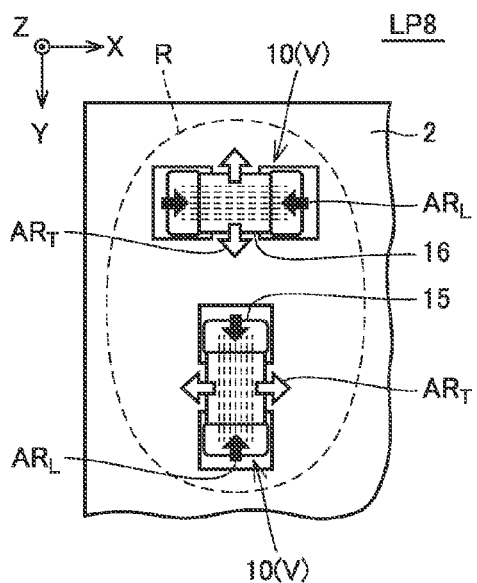
FIG. 9B is a diagram showing an eighth layout pattern belonging to the third layout group in a case in which two monolithic ceramic capacitors are arranged in proximity.

In the eighth layout pattern LP8 shown in FIG. 9B, two monolithic ceramic capacitors are both mounted in the above-noted second mounting mode 10(V). In this case, one of a pair of end surfaces 15 of one monolithic ceramic capacitor is opposed to one of a pair of thickness-direction side surfaces 16 of the other monolithic ceramic capacitor with mold resin layer 5 interposed.

In the case of the eighth layout pattern LP8, in the X-axis direction shown in the figure, significantly large distortion along the thickness direction T (see arrow $AR_T$) generated in one monolithic ceramic capacitor and somewhat large distortion along the length direction L (see arrow $AR_L$) generated in the other monolithic ceramic capacitor act to mutually cancel out vibration in region R, and the vibration in the X-axis direction is suppressed to be small to a large degree. Furthermore, in the case of eighth layout pattern LP8, in the Y-axis direction shown in the figure, somewhat large distortion along the length direction L (see arrow $AR_L$) generated in one monolithic ceramic capacitor and significantly large distortion along the thickness direction T (see arrow $AR_T$) generated in the other monolithic ceramic capacitor act to mutually cancel out vibration in region R, and the vibration in the Y-axis direction is suppressed to be small to a large degree.

Figure 9C:
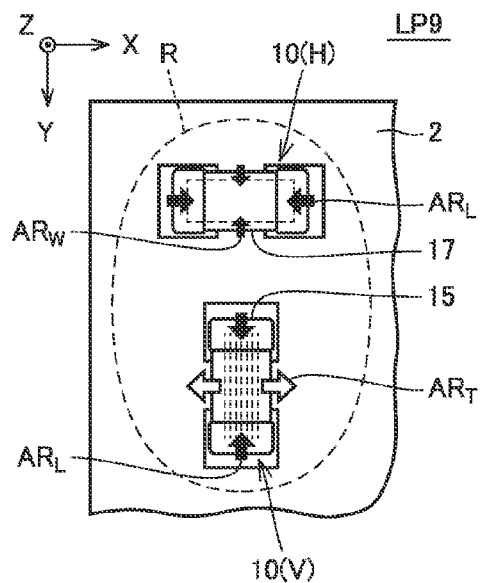
FIG. 9C is a diagram showing a ninth layout pattern belonging to the third layout group in a case in which two monolithic ceramic capacitors are arranged in proximity.

In the ninth layout pattern LP9 shown in FIG. 9C, one of two monolithic ceramic capacitors is mounted in the above-noted second mounting mode 10(V) and the other of the two monolithic ceramic capacitors is mounted in the above-noted first mounting mode 10(H). In this case, one of a pair of end surfaces 15 of one monolithic ceramic capacitor is opposed to one of a pair of width-direction side surfaces 17 of the other monolithic ceramic capacitor with mold resin layer 5 interposed.

In the case of the ninth layout pattern LP9, in the X-axis direction shown in the figure, significantly large distortion along the thickness direction T (see arrow $AR_T$) generated in one monolithic ceramic capacitor and somewhat large distortion along the length direction L (see arrow $AR_L$) generated in the other monolithic ceramic capacitor act to mutually cancel out vibration in region R, and the vibration in the X-axis direction is suppressed to be small to a large degree. Furthermore, in the case of the ninth layout pattern LP9, in the Y-axis direction shown in the figure, somewhat large distortion along the length direction L (see arrow $AR_L$) generated in one monolithic ceramic capacitor and slightly large distortion along the width direction W (see arrow $AR_W$) generated in the other monolithic ceramic capacitor act to mutually amplify vibration in region R, but the vibration in the Y-axis direction is suppressed to be relatively small.

Figure 9D:
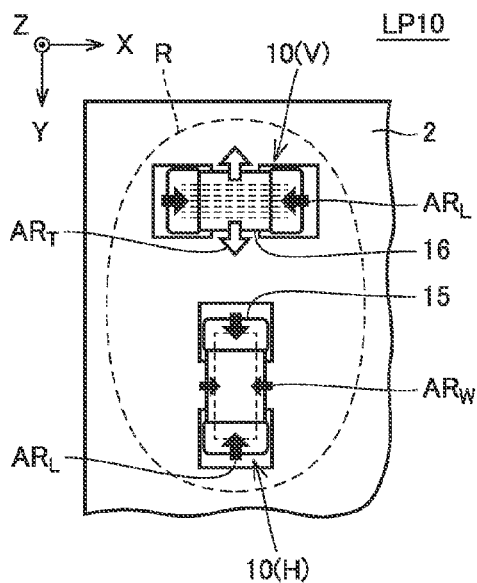
FIG. 9D is a diagram showing a tenth layout pattern belonging to the third layout group in a case in which two monolithic ceramic capacitors are arranged in proximity.

In the tenth layout pattern LP10 shown in FIG. 9D, one of two monolithic ceramic capacitors is mounted in the above-noted first mounting mode 10(H) and the other of the two monolithic ceramic capacitors is mounted in the above-noted second mounting mode 10(V). In this case, one of a pair of end surfaces 15 of one monolithic ceramic capacitor is opposed to one of a pair of thickness-direction side surfaces 16 of the other monolithic ceramic capacitor with mold resin layer 5 interposed.

In the case of the tenth layout pattern LP10, in the X-axis direction shown in the figure, slightly large distortion along the width direction W (see arrow $AR_W$) generated in one monolithic ceramic capacitor and somewhat large distortion along the length direction L (see arrow $AR_L$) generated in the other monolithic ceramic capacitor act to mutually amplify vibration in region R, but the vibration in the X-axis direction is suppressed to be relatively small. Furthermore, in the case of the tenth layout pattern LP10, in the Y-axis direction shown in the figure, somewhat large distortion along the length direction L (see arrow $AR_L$) generated in one monolithic ceramic capacitor and significantly large distortion along the thickness direction T (see arrow $AR_T$) generated in the other monolithic ceramic capacitor act to mutually cancel out vibration in region R, and the vibration in the Y-axis direction is suppressed to be small to a large degree.

As is clear from the foregoing, it can be said that, among the seventh to tenth layout patterns LP7 to LP10 belonging to the third layout group, the eighth to tenth layout patterns LP8 to LP10 in which vibration is cancelled out at least partially in region R are preferable in terms of suppressing vibration. Especially the eighth layout pattern LP8 is preferable in terms of suppressing vibration, because vibration is cancelled out to a large degree both in the X-axis direction and in the Y-axis direction in region R.

On the other hand, in the seventh layout pattern LP7 belonging to the third layout group, although vibration is not cancelled out in region R, the degree of vibration amplified is relatively small. Thus, the seventh layout pattern LP7 can be said to be preferable in terms of suppressing vibration.

In all of the layout patterns belonging to the third layout group, the length directions L of two monolithic ceramic capacitors are oriented in directions different from each other in the direction along the main surface of the wiring board, so that somewhat large distortions along the length direction L do not mutually amplify vibration. Furthermore, in all of the layout patterns belonging to the third layout group, the thickness directions T of two monolithic ceramic capacitors are oriented in directions different from each other, so that significantly large distortions along the thickness direction T do not mutually amplify vibration. Therefore, it can be said that the layout patterns belonging to the third layout group are preferable layout patterns compared with the layout patterns belonging to the first and second layout groups, in terms of suppressing vibration.

Therefore, based on the foregoing discussion, it can be said that, in the case in which two monolithic ceramic capacitors are arranged in proximity, the two monolithic ceramic capacitors are preferably arranged such that one of a pair of end surfaces 15 of one monolithic ceramic capacitor is opposed to one of a pair of side surfaces (including a pair of thickness-direction side surfaces 16 and a pair of width-direction side surfaces 17) of the other monolithic ceramic capacitor with mold resin layer 5 interposed.

Here, in the case in which two monolithic ceramic capacitors are arranged in proximity, it is particularly preferable that the eighth layout pattern LP8 is used in terms of suppressing vibration, as described above. Considering this point, in a case in which three or more monolithic ceramic capacitors are arranged in proximity, it is preferable that two of the monolithic ceramic capacitors are mounted in the second mounting mode 10(V) in accordance with layout pattern LP8 and the remaining one or more monolithic ceramic capacitors are mounted in first mounting mode 10(H) in proximity of these two monolithic ceramic capacitors.

With such a configuration, vibration that is not fully cancelled out in the two monolithic ceramic capacitors mounted in accordance with eighth layout pattern LP8 can be further cancelled out by the remaining one or more monolithic ceramic capacitors both in the X-axis direction and in the Y-axis direction in region R, thus achieving a high vibration-suppressing effect.

Based on the discoveries described above, in a circuit module including a plurality of monolithic ceramic capacitors, we focus on a monolithic ceramic capacitor group including a plurality of certain monolithic ceramic capacitors included in the monolithic ceramic capacitors. The circuit modules according to the first to twelfth configuration examples will be described in details below, in which characteristic layouts are applied the mounting position for a plurality of monolithic ceramic capacitors included in the monolithic ceramic capacitor group to suppress vibration.

First Configuration Example

Figure 10:
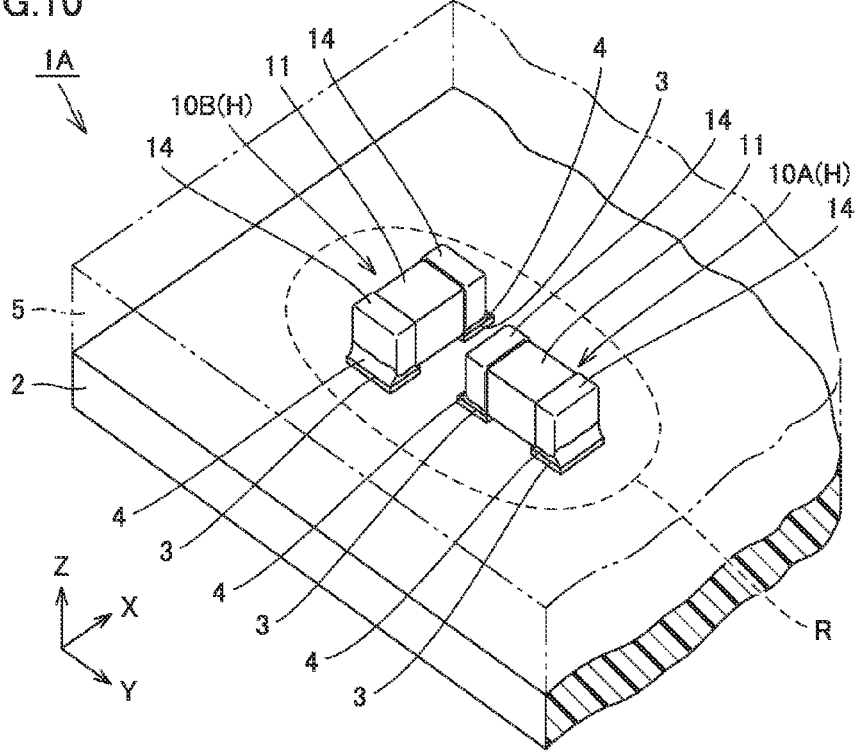
FIG. 10 is a schematic perspective view of a circuit module according to a first configuration example.
Figure 11:
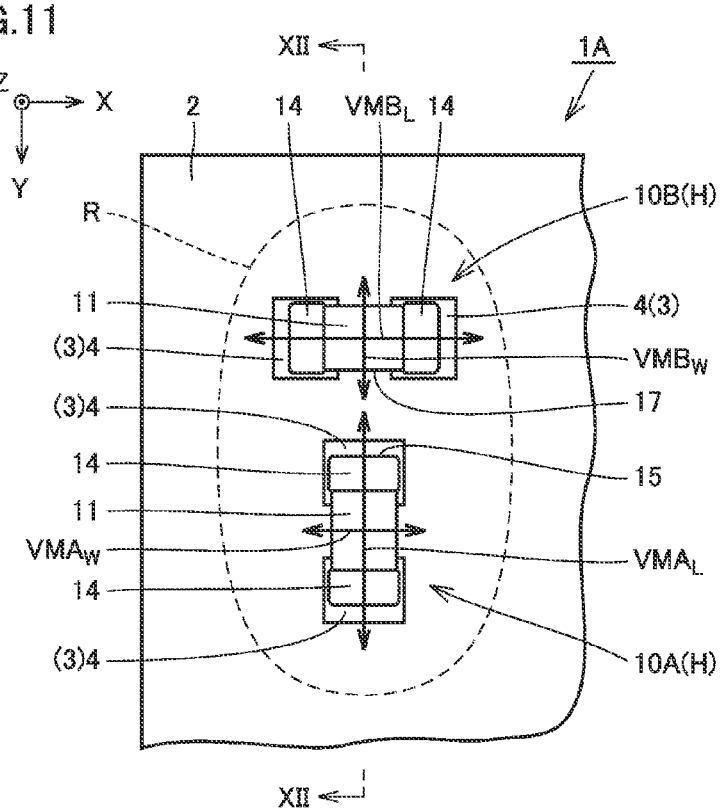
FIG. 11 is a schematic plan view showing the layout of monolithic ceramic capacitors included in the circuit module according to the first configuration example.
Figure 12:
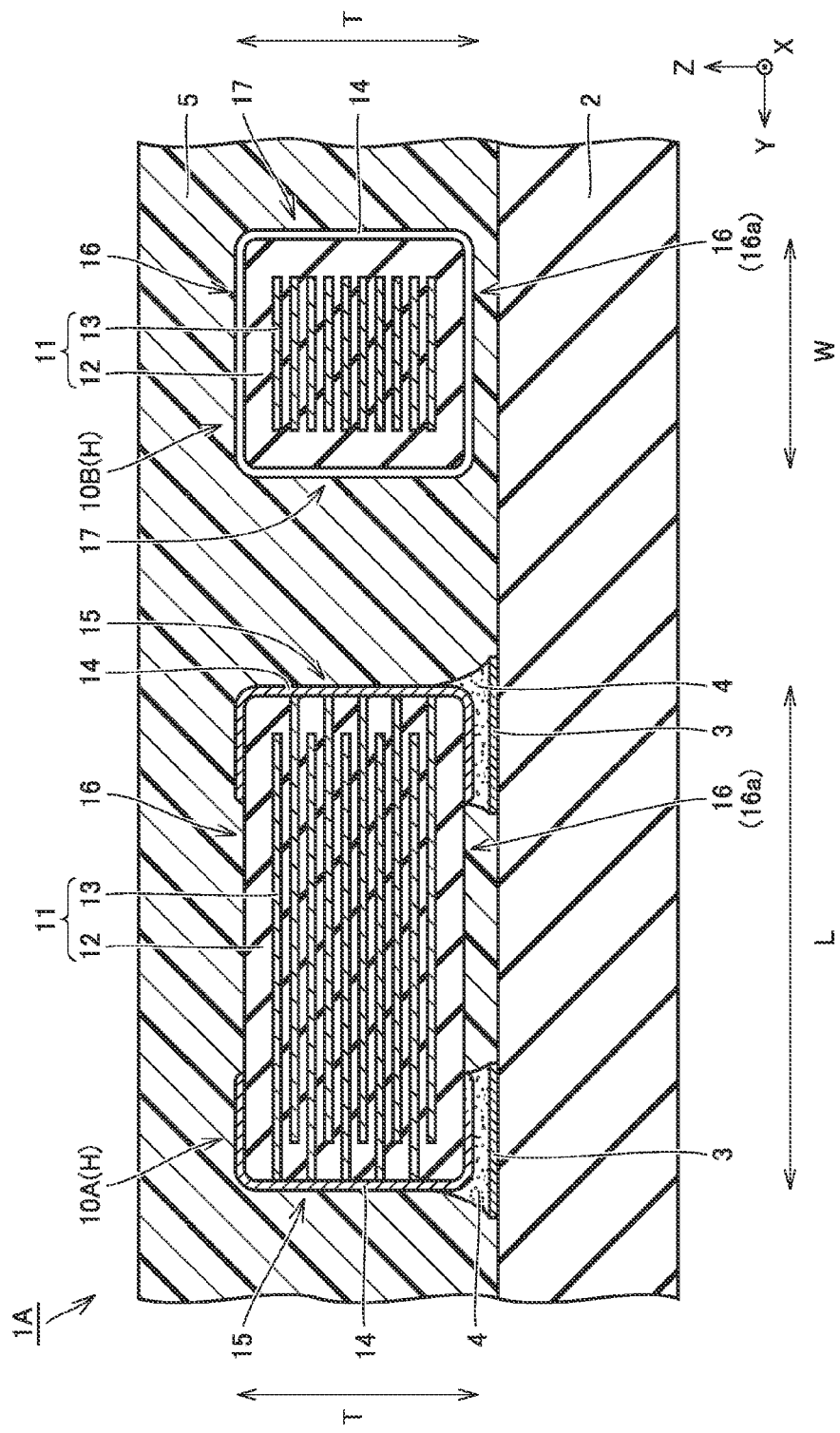
FIG. 12 is a schematic cross-sectional view of the circuit module according to the first configuration example along line XII-XII shown in FIG. 11.

FIG. 10 and FIG. 11 are a schematic perspective view and a schematic plan view showing the layout of monolithic ceramic capacitors included in a circuit module according to a first configuration example based on the present preferred embodiment. FIG. 12 is a schematic cross-sectional view of the circuit module shown in FIG. 10 and FIG. 11 along line XII-XII shown in FIG. 11, and FIG. 13 is a diagram showing a circuit configuration example of a circuit including the monolithic ceramic capacitors shown in FIG. 10 to FIG. 12. It is noted that in FIG. 11, mold resin layer 5 is not shown.

The present first configuration example focuses on two monolithic ceramic capacitors with identical design specifications (identical capacitance and identical size) electrically connected in series or in parallel through a conductive pattern provided on a wiring board, as a plurality of monolithic ceramic capacitors included in a monolithic ceramic capacitor group described above. The layout pattern of two monolithic ceramic capacitors in the circuit module according to the present first configuration example corresponds to the seventh layout pattern LP7 belonging to the third layout group.

As shown in FIG. 10 to FIG. 13, in a circuit module 1A according to the present first configuration example, first monolithic ceramic capacitor 10A and second monolithic ceramic capacitor 10B are electrically connected in series or in parallel with each other through lands 3, wiring 6A to 6C, and the like, which are a conductive pattern provided on wiring board 2, and are electrically connected to the same power supply 7 and electrically connected to ground terminal GND. That is, first monolithic ceramic capacitor 10A and second monolithic ceramic capacitor 10B are coupled in series or in parallel to the same power supply line.

Figure 13A:
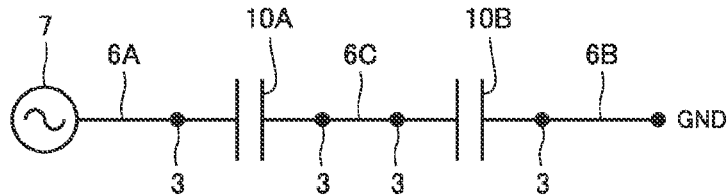
FIG. 13A is a diagram showing a circuit configuration example of a circuit in which the monolithic ceramic capacitors shown FIG. 10 to in FIG. 12 are electrically connected in series.

The circuit configuration shown in FIG. 13A shows a case in which first monolithic ceramic capacitor 10A and second monolithic ceramic capacitor 10B are electrically connected in series. In this case, one of a pair of external electrodes 14 of first monolithic ceramic capacitor 10A and one of a pair of external electrodes 14 of second monolithic ceramic capacitor 10B are electrically connected through land 3 and wiring 6C, the other of a pair of external electrodes 14 of first monolithic ceramic capacitor 10A and power supply 7 are electrically connected through land 3 and wiring 6A, and the other of a pair of external electrodes 14 of second monolithic ceramic capacitor 10B and ground terminal GND are electrically connected through land 3 and wiring 6B.

Figure 13B:
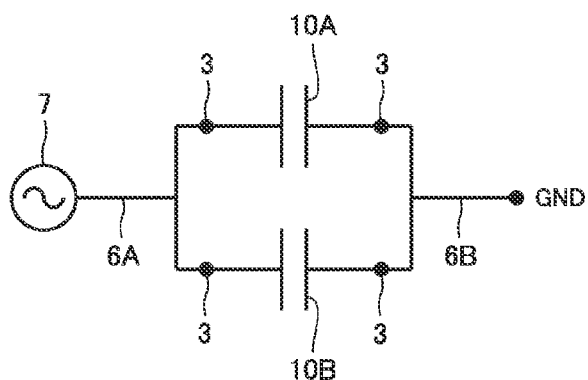
FIG. 13B is a diagram showing a circuit configuration example of a circuit in which the monolithic ceramic capacitors shown in FIG. 10 to FIG. 12 are electrically connected in parallel.

The circuit configuration shown in FIG. 13B shows a case in which first monolithic ceramic capacitor 10A and second monolithic ceramic capacitor 10B are electrically connected in parallel. In this case, one of a pair of external electrodes 14 of first monolithic ceramic capacitor 10A, one of a pair of external electrodes 14 of second monolithic ceramic capacitor 10B, and power supply 7 are electrically connected through land 3 and wiring 6A, the other of a pair of external electrodes 14 of first monolithic ceramic capacitor 10A, the other of a pair of external electrodes 14 of second monolithic ceramic capacitor 10B, and ground terminal GND are electrically connected through land 3 and wiring 6B. That is, first monolithic ceramic capacitor 10A and second monolithic ceramic capacitor 10B are coupled in parallel to the same power supply line. In other words, when viewed in an equivalent circuit, first monolithic ceramic capacitor 10A and second monolithic ceramic capacitor 10B are coupled to the same node.

As shown in FIG. 10 to FIG. 12, first monolithic ceramic capacitor 10A and second monolithic ceramic capacitor 10B are both mounted in the above-noted first mounting mode 10(H). That is, thickness-direction side surface 16 with a rectangular or substantially rectangular shape having long sides and short sides of each of first monolithic ceramic capacitor 10A and second monolithic ceramic capacitor 10B is opposed surface 16a positioned to be opposed to the main surface of wiring board 2.

Opposed surface 16a of each of first monolithic ceramic capacitor 10A and second monolithic ceramic capacitor 10B has a rectangular or substantially rectangular shape including a pair of short sides and a pair of long sides, because first monolithic ceramic capacitor 10A and second monolithic ceramic capacitor 10B both have a rectangular or substantially rectangular parallelepiped shape and are mounted on wiring board 2 such that their length direction L is parallel or substantially parallel to the main surface of wiring board 2.

Here, in circuit module 1A according to the present first configuration example, first monolithic ceramic capacitor 10A and second monolithic ceramic capacitor 10B are mounted on wiring board such that the direction in which the long sides of opposed surface 16a of first monolithic ceramic capacitor 10A extend is perpendicular or substantially perpendicular to the direction in which the long sides of opposed surface 16a of second monolithic ceramic capacitor 10B extend, and one of a pair of end surfaces 15 of first monolithic ceramic capacitor 10A is opposed to one of a pair of width-direction side surfaces 17 of second monolithic ceramic capacitor 10B with mold resin layer 5 interposed.

In a preferable configuration, when viewed from the main surface of wiring board 2, the axis parallel or substantially parallel to the length direction L extending through the center of first monolithic ceramic capacitor 10A passes through second monolithic ceramic capacitor 10B. In a further preferable configuration, when viewed from the main surface of wiring board 2, the axis parallel or substantially parallel to the width direction W extending through the center of second monolithic ceramic capacitor 10B passes through first monolithic ceramic capacitor 10A. In a more preferable configuration, the axis parallel or substantially parallel to the length direction L extending through the center of first monolithic ceramic capacitor 10A agrees with the axis parallel or substantially parallel to the width direction W extending through the center of second monolithic ceramic capacitor 10B.

Here, the direction parallel or substantially parallel to the main surface of wiring board 2 and perpendicular or substantially perpendicular to the length direction L of first monolithic ceramic capacitor 10A is defined as the X-axis direction, and the direction parallel or substantially parallel to the main surface of wiring board 2 and parallel to the length direction L of first monolithic ceramic capacitor 10A is defined as the Y-axis direction. Then, the width direction W of first monolithic ceramic capacitor 10A and the length direction L of second monolithic ceramic capacitor 10B are oriented in the same X-axis direction, and the length direction L of first monolithic ceramic capacitor 10A and the width direction W of second monolithic ceramic capacitor 10B are oriented in the same Y-axis direction.

In this case, the vibration mode (see the arrow $VMA_W$ shown in FIG. 11) resulting from distortion along the width direction W of first monolithic ceramic capacitor 10A and the vibration mode (see the arrow $VMB_L$ shown in FIG. 11) resulting from distortion along the length direction L of second monolithic ceramic capacitor 10B are matched so as to be oriented in the same direction along the X-axis direction of circuit module 1A, and the vibration mode (see the arrow $VMA_L$ shown in FIG. 11) resulting from distortion along the length direction L of first monolithic ceramic capacitor 10A and the vibration mode (see the arrow $VMB_W$ shown in FIG. 11) resulting from distortion along the width direction W of second monolithic ceramic capacitor 10B are matched so as to be oriented in the same direction along the Y-axis direction of circuit module 1A.

Therefore, as mentioned in the description section of seventh layout pattern LP7 belonging to the third layout group, extreme amplification of vibration of circuit module 1A resulting from distortion produced in first monolithic ceramic capacitor 10A and second monolithic ceramic capacitor 10B during voltage application is able to be prevented. This significantly decreases or prevents noise and prevents malfunction of other elements.

Second Configuration Example

Figure 14:
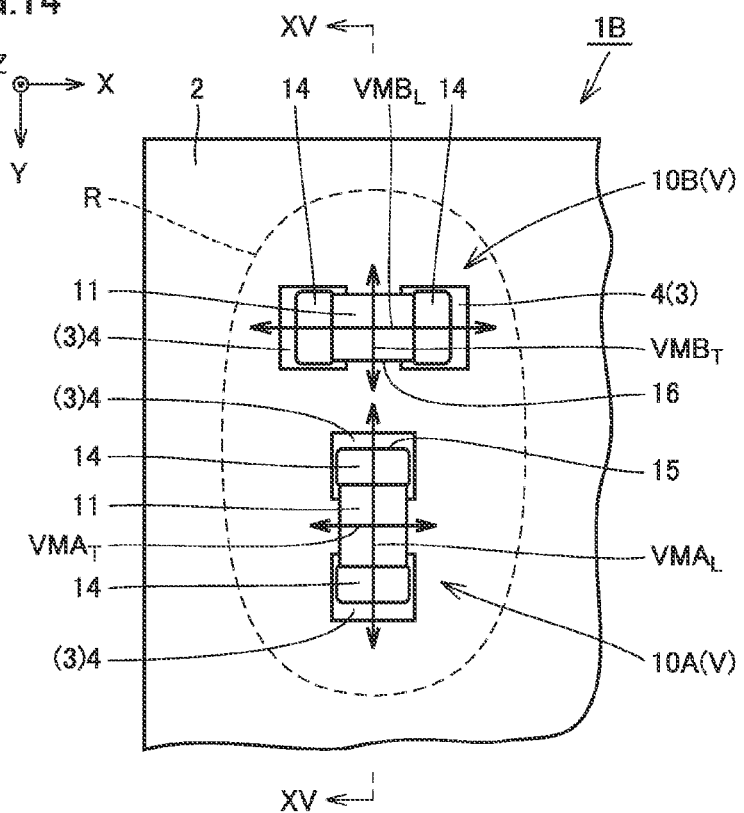
FIG. 14 is a schematic plan view showing the layout of monolithic ceramic capacitors included in a circuit module according to a second configuration example.
Figure 15:
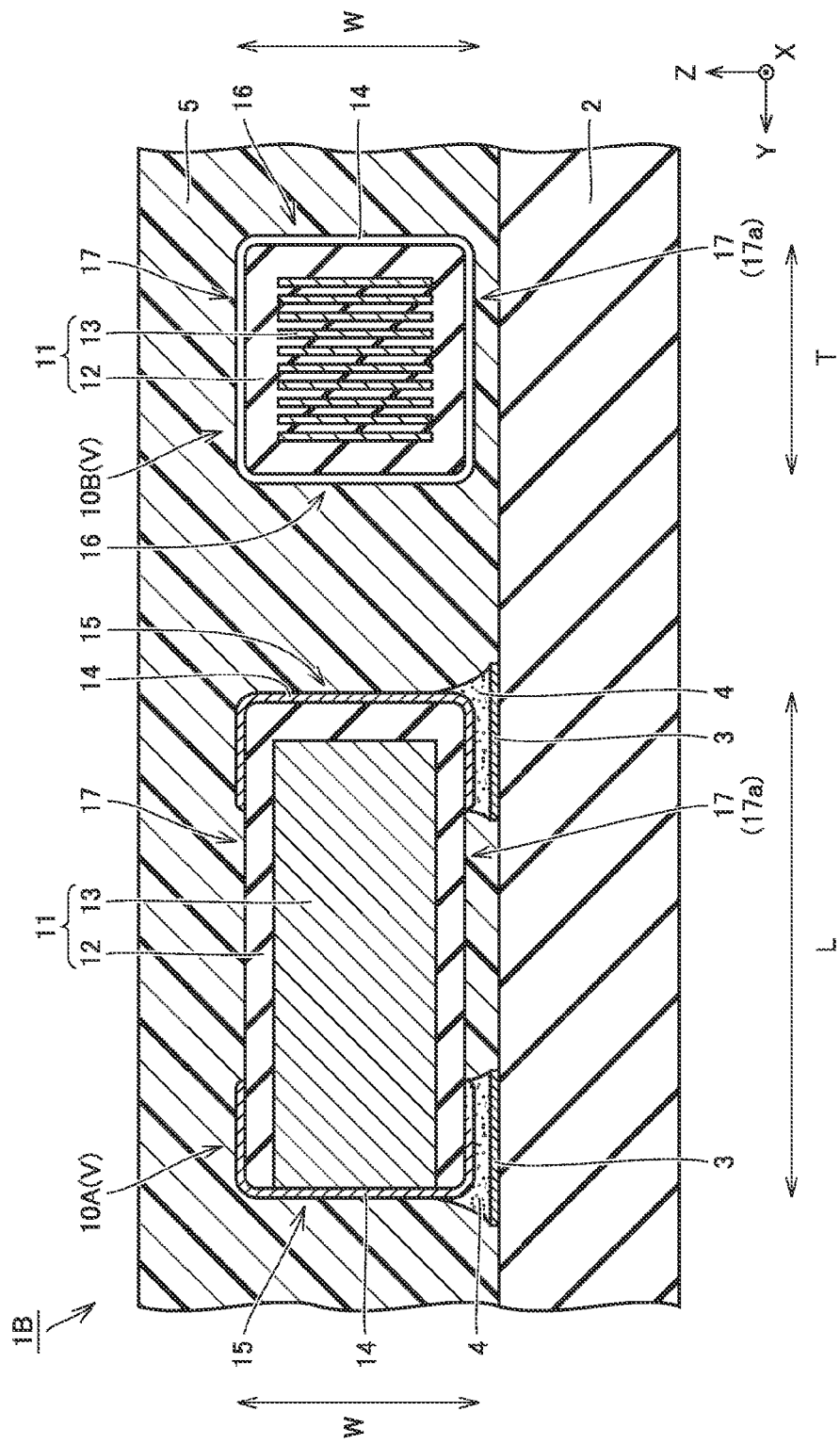
FIG. 15 is a schematic cross-sectional view of the circuit module according to the second configuration example along line XV-XV shown in FIG. 14.

FIG. 14 is a schematic plan view showing the layout of monolithic ceramic capacitors included in a circuit module according to a second configuration example based on the present preferred embodiment, and FIG. 15 is a schematic cross-sectional view of the circuit module shown in FIG. 14 along line XV-XV shown in FIG. 14. It is noted that in FIG. 14, mold resin layer 5 is not shown.

The present second configuration example corresponds to the eighth layout pattern LP8 belonging to the third layout group described above. Specifically, as shown in FIG. 14 and FIG. 15, a circuit module 1B according to the present second configuration example differs from the first configuration example in that first monolithic ceramic capacitor 10A and second monolithic ceramic capacitor 10B are both mounted in the above-noted second mounting mode 10(V), and has a similar configuration as the first configuration example in other respects.

That is, width-direction side surface 17 preferably with a rectangular or substantially rectangular shape including long sides and short sides of first monolithic ceramic capacitor 10A and second monolithic ceramic capacitor 10B is opposed surface 17a positioned to be opposed to the main surface of wiring board 2. Thus, one of a pair of end surfaces 15 of first monolithic ceramic capacitor 10A is opposed to one of a pair of thickness-direction side surfaces 16 of second monolithic ceramic capacitor 10B with mold resin layer 5 interposed.

Here, the direction parallel or substantially parallel to the main surface of wiring board 2 and perpendicular or substantially perpendicular to the length direction L of first monolithic ceramic capacitor 10A is defined as the X-axis direction, and the direction parallel to the main surface of wiring board 2 and parallel or substantially parallel to the length direction L of first monolithic ceramic capacitor 10A is defined as the Y-axis direction. Then, the thickness direction T of first monolithic ceramic capacitor 10A and the length direction L of second monolithic ceramic capacitor 10B are oriented in the same X-axis direction, and the length direction L of first monolithic ceramic capacitor 10A and the thickness direction T of second monolithic ceramic capacitor 10B are oriented in the same Y-axis direction.

In this case, the vibration mode (see the arrow $VMA_T$ shown in FIG. 14) resulting from distortion along the thickness direction T of first monolithic ceramic capacitor 10A and the vibration mode (see the arrow $VMB_L$ shown in FIG. 14) resulting from distortion along the length direction L of second monolithic ceramic capacitor 10B are matched so as to be oriented in the same direction along the X-axis direction of circuit module 1B, and the vibration mode (see the arrow $VMA_L$ shown in FIG. 14) resulting from distortion along the length direction L of first monolithic ceramic capacitor 10A and the vibration mode (see arrow $VMB_T$ shown in FIG. 14) resulting from distortion along the thickness direction T of second monolithic ceramic capacitor 10B are matched so as to be oriented in the same direction along the Y-axis direction of circuit module 1B.

Therefore, as mentioned in the description section of eighth layout pattern LP8 belonging to the third layout group, vibration of circuit module 1A resulting from distortion produced in first monolithic ceramic capacitor 10A and second monolithic ceramic capacitor 10B during voltage application is cancelled out in both the X-axis direction and the Y-axis direction. This significantly reduces or prevents noise and prevents malfunction of other elements.

In the configuration described above, since one end surface 15 of first monolithic ceramic capacitor 10A and one thickness-direction side surface 16 of second monolithic ceramic capacitor 10B are opposed to each other in the Y-axis direction, the propagation directions of the vibration modes produced along the Y-axis direction face each other, thus achieving the vibration-cancelling effect more efficiently.

Third Configuration Example

Figure 16:
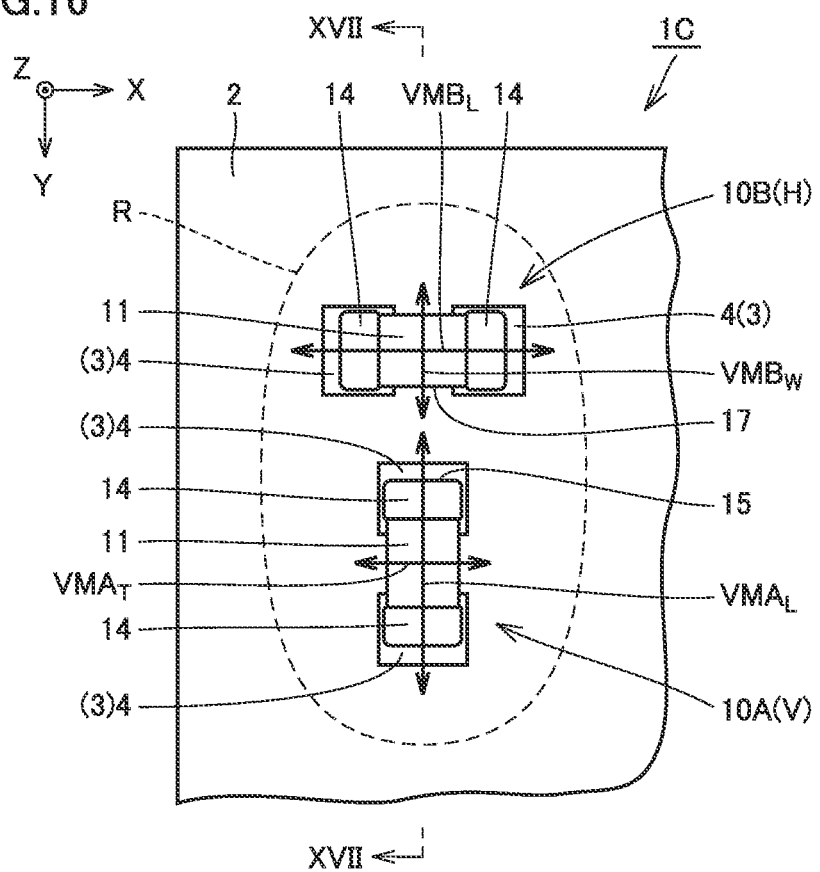
FIG. 16 is a schematic plan view showing the layout of monolithic ceramic capacitors included in a circuit module according to a third configuration example.
Figure 17:
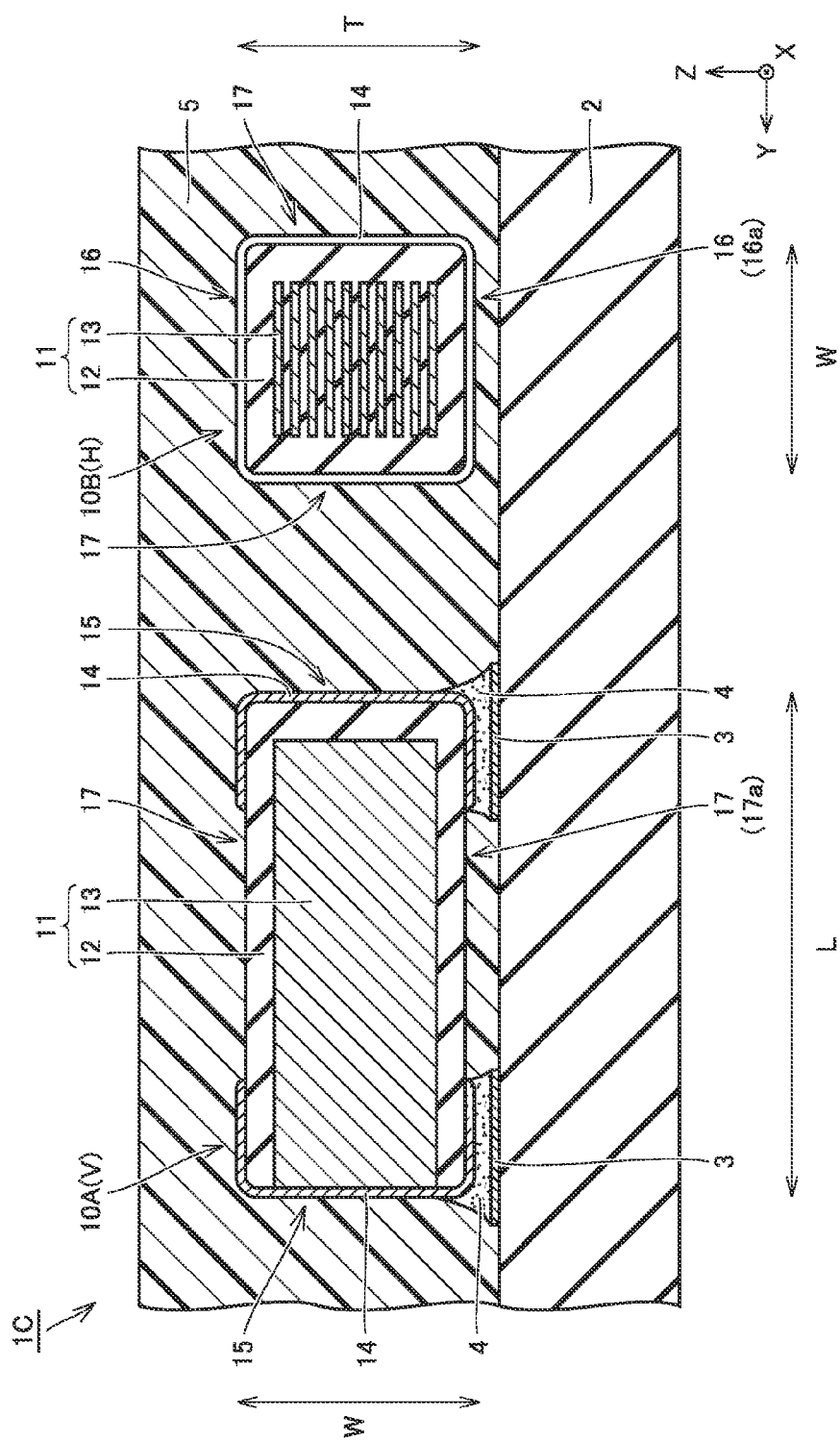
FIG. 17 is a schematic cross-sectional view of the circuit module according to the third configuration example along line XVII-XVII shown in FIG. 16.

FIG. 16 is a schematic plan view showing the layout of monolithic ceramic capacitors included in a circuit module according to a third configuration example based on the present preferred embodiment, and FIG. 17 is a schematic cross-sectional view of the circuit module shown in FIG. 16 along line XVII-XVII shown in FIG. 16. It is noted that in FIG. 16, mold resin layer 5 is not shown.

The present third configuration example corresponds to the ninth layout pattern LP9 belonging to the third layout group described above. Specifically, as shown in FIG. 16 and FIG. 17, a circuit module 1C according to the present third configuration example differs from the first configuration example in that first monolithic ceramic capacitor 10A is mounted in the above-noted second mounting mode 10(V) and second monolithic ceramic capacitor 10B is mounted in the above-noted first mounting mode 10(H), and has a similar configuration as the first configuration example in other respects.

That is, width-direction side surface 17 with a rectangular or substantially rectangular shape including long sides and short sides of first monolithic ceramic capacitor 10A is opposed surface 17a positioned to be opposed to the main surface of wiring board 2, and thickness-direction side surface 16 in a rectangular or substantially rectangular shape including long sides and short sides of second monolithic ceramic capacitor 10B is opposed surface 16a positioned to be opposed to the main surface of wiring board 2. Thus, one of a pair of end surfaces 15 of first monolithic ceramic capacitor 10A is opposed to one of a pair of width-direction side surfaces 17 of second monolithic ceramic capacitor 10B with mold resin layer 5 interposed.

Here, the direction parallel or substantially parallel to the main surface of wiring board 2 and perpendicular or substantially perpendicular to the length direction L of first monolithic ceramic capacitor 10A is defined as the X-axis direction, and the direction parallel or substantially parallel to the main surface of wiring board 2 and parallel or substantially parallel to the length direction L of first monolithic ceramic capacitor 10A is defined as the Y-axis direction. Then, the thickness direction T of first monolithic ceramic capacitor 10A and the length direction L of second monolithic ceramic capacitor 10B are oriented in the same X-axis direction, and the length direction L of first monolithic ceramic capacitor 10A and the width direction W of second monolithic ceramic capacitor 10B are oriented in the same Y-axis direction.

In this case, the vibration mode (see the arrow $VMA_T$ shown in FIG. 16) resulting from distortion along the thickness direction T of first monolithic ceramic capacitor 10A and the vibration mode (see the arrow $VMB_L$ shown in FIG. 16) resulting from distortion along the length direction L of second monolithic ceramic capacitor 10B are matched so as to be oriented in the same direction along the X-axis direction of circuit module 1C, and the vibration mode (see the arrow $VMA_L$ shown in FIG. 16) resulting from distortion along the length direction L of first monolithic ceramic capacitor 10A and the vibration mode (see the arrow $VMB_W$ shown in FIG. 16) resulting from distortion along the width direction W of second monolithic ceramic capacitor 10B are matched so as to be oriented in the same direction along the Y-axis direction of circuit module 1C.

Therefore, as mentioned in the description section of ninth layout pattern LP9 belonging to the third layout group, vibration of circuit module 1A resulting from distortion produced in first monolithic ceramic capacitor 10A and second monolithic ceramic capacitor 10B during voltage application is cancelled out in the X-axis direction. This significantly reduces or prevents noise and prevents malfunction of other elements.

Fourth Configuration Example

Figure 18:
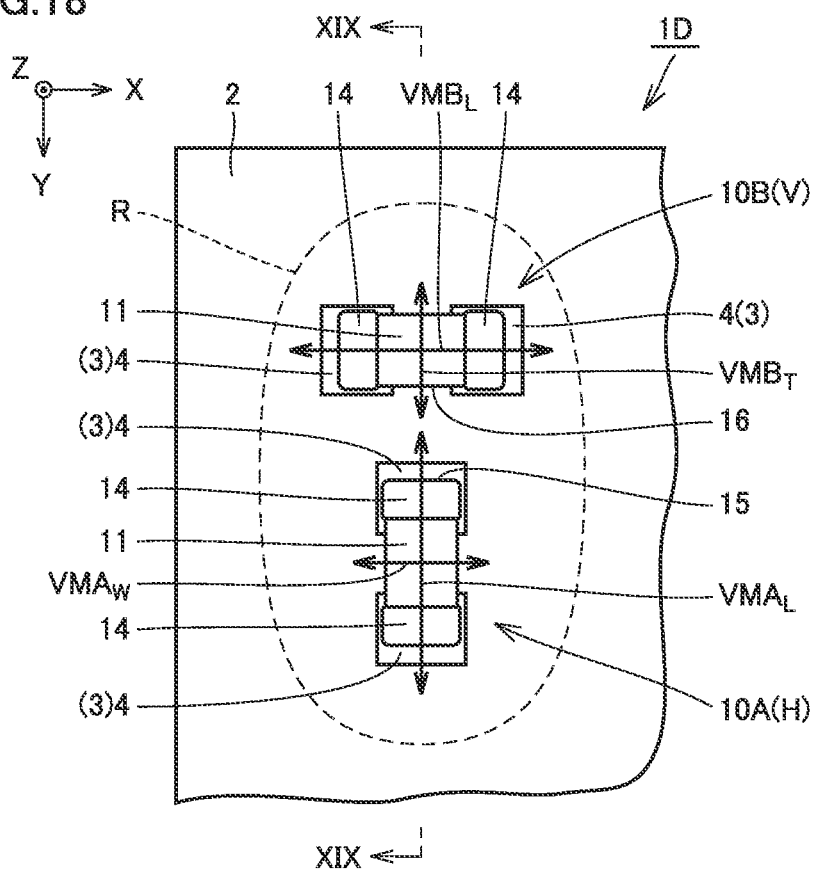
FIG. 18 is a schematic plan view showing the layout of monolithic ceramic capacitors included in a circuit module according to a fourth configuration example.
Figure 19:
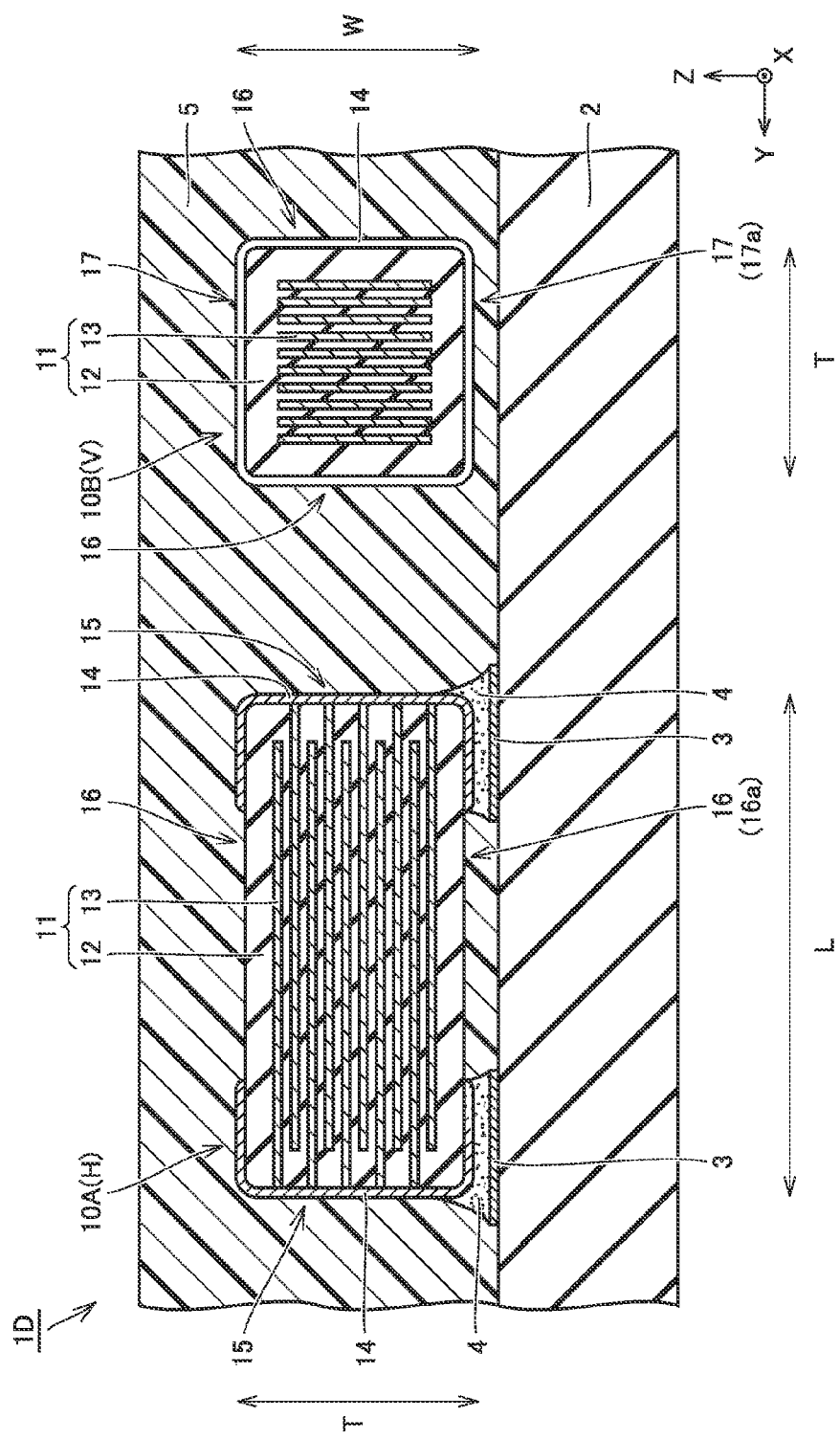
FIG. 19 is a schematic cross-sectional view of the circuit module according to the fourth configuration example along line XIX-XIX shown in FIG. 18.

FIG. 18 is a schematic plan view showing the layout of monolithic ceramic capacitors included in a circuit module according to a fourth configuration example based on the present preferred embodiment, and FIG. 19 is a schematic cross-sectional view of the circuit module shown in FIG. 18 along line XIX-XIX shown in FIG. 18. It is noted that in FIG. 18, mold resin layer 5 is not shown.

The present fourth configuration example corresponds to tenth layout pattern LP10 belonging to the third layout group described above. Specifically, as shown in FIG. 18 and FIG. 19, a circuit module 1D according to the present fourth configuration example differs from the first configuration example in that first monolithic ceramic capacitor 10A is mounted in the above-noted first mounting mode 10(H) and second monolithic ceramic capacitor 10B is mounted in the above-noted second mounting mode 10(V), and has a similar configuration as the first configuration example in other respects.

That is, thickness-direction side surface 16 with a rectangular or substantially rectangular shape including long sides and short sides of first monolithic ceramic capacitor 10A is opposed surface 16a positioned to be opposed to the main surface of wiring board 2, and width-direction side surface 17 in a rectangular or substantially rectangular shape including long sides and short sides of second monolithic ceramic capacitor 10B is opposed surface 17a positioned to be opposed to the main surface of wiring board 2. Thus, one of a pair of end surfaces 15 of first monolithic ceramic capacitor 10A is opposed to one of a pair of thickness-direction side surfaces 16 of second monolithic ceramic capacitor 10B with mold resin layer 5 interposed.

Here, the direction parallel or substantially parallel to the main surface of wiring board 2 and perpendicular or substantially perpendicular to the length direction L of first monolithic ceramic capacitor 10A is defined as the X-axis direction, and the direction parallel or substantially parallel to the main surface of wiring board 2 and parallel or substantially parallel to the length direction L of first monolithic ceramic capacitor 10A is defined as the Y-axis direction. Then, the width direction W of first monolithic ceramic capacitor 10A and the length direction L of second monolithic ceramic capacitor 10B are oriented in the same X-axis direction, and the length direction L of first monolithic ceramic capacitor 10A and the thickness direction T of second monolithic ceramic capacitor 10B are oriented in the same Y-axis direction.

In this case, the vibration mode (see the arrow $VMA_W$ shown in FIG. 18) resulting from distortion along the width direction W of first monolithic ceramic capacitor 10A and the vibration mode (see the arrow $VMB_L$ shown in FIG. 18) resulting from distortion along the length direction L of second monolithic ceramic capacitor 10B are matched so as to be oriented in the same direction along the X-axis direction of circuit module 1D, and the vibration mode (see the arrow $VMA_L$ shown in FIG. 18) resulting from distortion along the length direction L of first monolithic ceramic capacitor 10A and the vibration mode (see arrow $VMB_T$ shown in FIG. 18) resulting from distortion along the thickness direction T of second monolithic ceramic capacitor 10B are matched so as to be oriented in the same direction along the Y-axis direction of circuit module 1D.

Therefore, as mentioned in the description section of tenth layout pattern LP10 belonging to the third layout group, vibration of circuit module 1A resulting from distortion produced in first monolithic ceramic capacitor 10A and second monolithic ceramic capacitor 10B during voltage application is canceled out in the Y-axis direction. This significantly reduces or prevents noise and prevents malfunction of other elements.

In the configuration as described above, since one end surface 15 of first monolithic ceramic capacitor 10A and one thickness-direction side surface 16 of second monolithic ceramic capacitor 10B are arranged to be opposed to each other in the Y-axis direction, the propagation directions of the vibration modes produced along the Y-axis direction face each other, thus achieving the vibration-cancelling effect more efficiently.

Fifth Configuration Example

Figure 20:
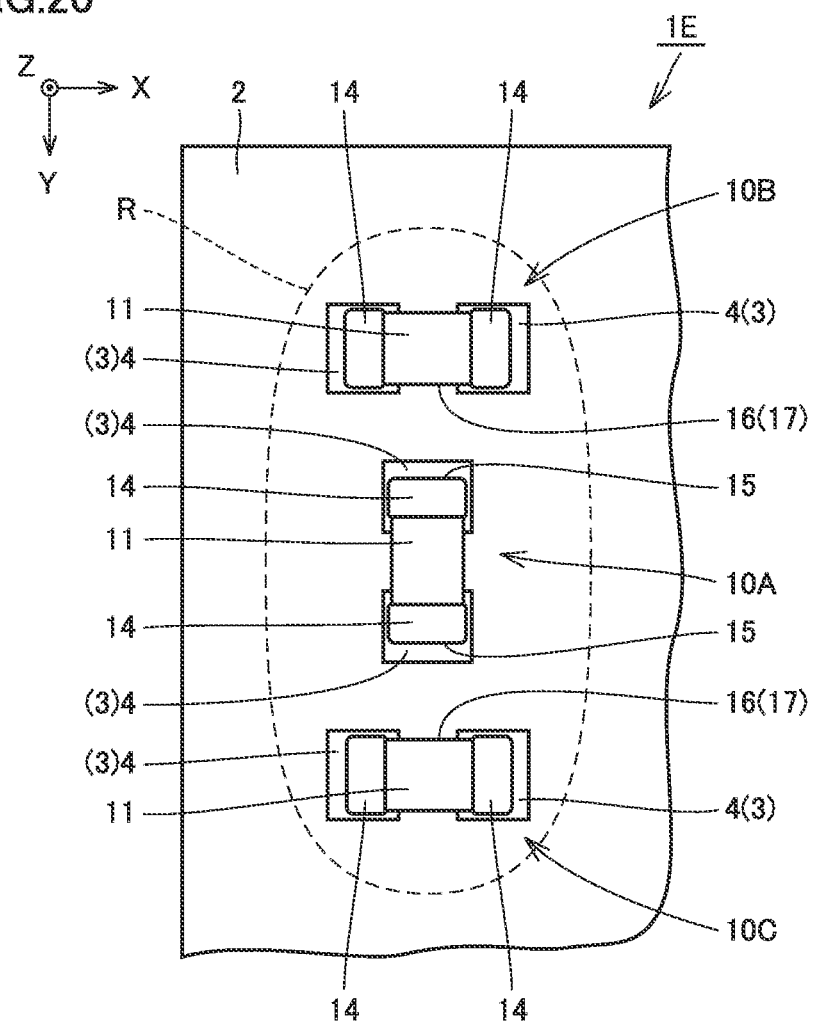
FIG. 20 is a schematic plan view showing the layout of monolithic ceramic capacitors included in a circuit module according to a fifth configuration example.

FIG. 20 is a schematic plan view showing the layout of monolithic ceramic capacitors included in a circuit module according to a fifth configuration example based on the present preferred embodiment. It is noted that in FIG. 20, mold resin layer 5 is not shown.

The present fifth configuration example focuses on three monolithic ceramic capacitors with identical design specifications (identical capacitance and identical size) electrically connected in series or in parallel through a conductive pattern provided on a wiring board, as a plurality of monolithic ceramic capacitors included in the monolithic ceramic capacitor group described above. The three monolithic ceramic capacitors in the circuit module according to the present fifth configuration example are electrically connected in series or in parallel with each other, as in the first configuration example.

As shown in FIG. 20, in a circuit module 1E according to the present fifth configuration example, first monolithic ceramic capacitor 10A, second monolithic ceramic capacitor 10B, and third monolithic ceramic capacitor 10C are each mounted in either of the above-noted first mounting mode 10(H) and second mounting mode 10(V). Specifically, first monolithic ceramic capacitor 10A, second monolithic ceramic capacitor 10B, and third monolithic ceramic capacitor 10C are each mounted on wiring board 2 such that the length direction L is parallel or substantially parallel to the main surface of wiring board 2 and either of the width direction W and the thickness direction T is parallel or substantially parallel to the normal direction (the Z-axis direction shown in the figure) to the main surface of wiring board 2. First monolithic ceramic capacitor 10A and second monolithic ceramic capacitor 10B are adjacent to each other, and first monolithic ceramic capacitor 10A and third monolithic ceramic capacitor 10C are adjacent to each other.

In such a configuration, one of a pair of end surfaces 15 of first monolithic ceramic capacitor 10A is opposed to one of a pair of side surfaces (including a pair of thickness-direction side surfaces 16 and a pair of width-direction side surfaces 17) of second monolithic ceramic capacitor 10B with mold resin layer 5 interposed, and the other of a pair of end surfaces 15 of first monolithic ceramic capacitor 10A is opposed to one of a pair of side surfaces (including a pair of thickness-direction side surfaces 16 and a pair of width-direction side surfaces 17) of third monolithic ceramic capacitor 10C with mold resin layer 5 interposed.

Thus, in the present fifth configuration example, first monolithic ceramic capacitor 10A and second monolithic ceramic capacitor 10B positioned adjacent to each other have the positional relation as in the seventh to tenth layout patterns LP7 to LP10 in the third layout group, and first monolithic ceramic capacitor 10A and third monolithic ceramic capacitor 10C positioned adjacent to each other have the positional relation as in the seventh to tenth layout patterns LP7 to LP10 in the third layout group.

Therefore, with this configuration, vibration of circuit module 1E resulting from distortion produced in first monolithic ceramic capacitor 10A, second monolithic ceramic capacitor 10B, and third monolithic ceramic capacitor 10C during voltage application is significantly reduced or prevented in region R. This results in significant reduction or prevention of noise and prevents malfunction of other elements.

Here, the stacking directions of dielectric layers 12 and internal electrode layers 13 in first monolithic ceramic capacitor 10A, second monolithic ceramic capacitor 10B, and third monolithic ceramic capacitor 10C are aligned in the same direction, thus facilitating manufacturing of circuit module 1E. Meanwhile, in terms of suppressing vibration produced in this circuit module 1E, for example, referring to FIG. 20, it is preferable that first monolithic ceramic capacitor 10A, second monolithic ceramic capacitor 10B, and third monolithic ceramic capacitor 10C are each mounted in the above-noted second mounting mode 10(V).

On the other hand, in terms of maximizing suppression of vibration produced in circuit module 1E, for example, referring to FIG. 20, it is preferable that first monolithic ceramic capacitor 10A and second monolithic ceramic capacitor 10B are each mounted in the above-noted second mounting mode 10(V) and third monolithic ceramic capacitor 10C is mounted in the above-noted first mounting mode 10(H).

Sixth Configuration Example

Figure 21:
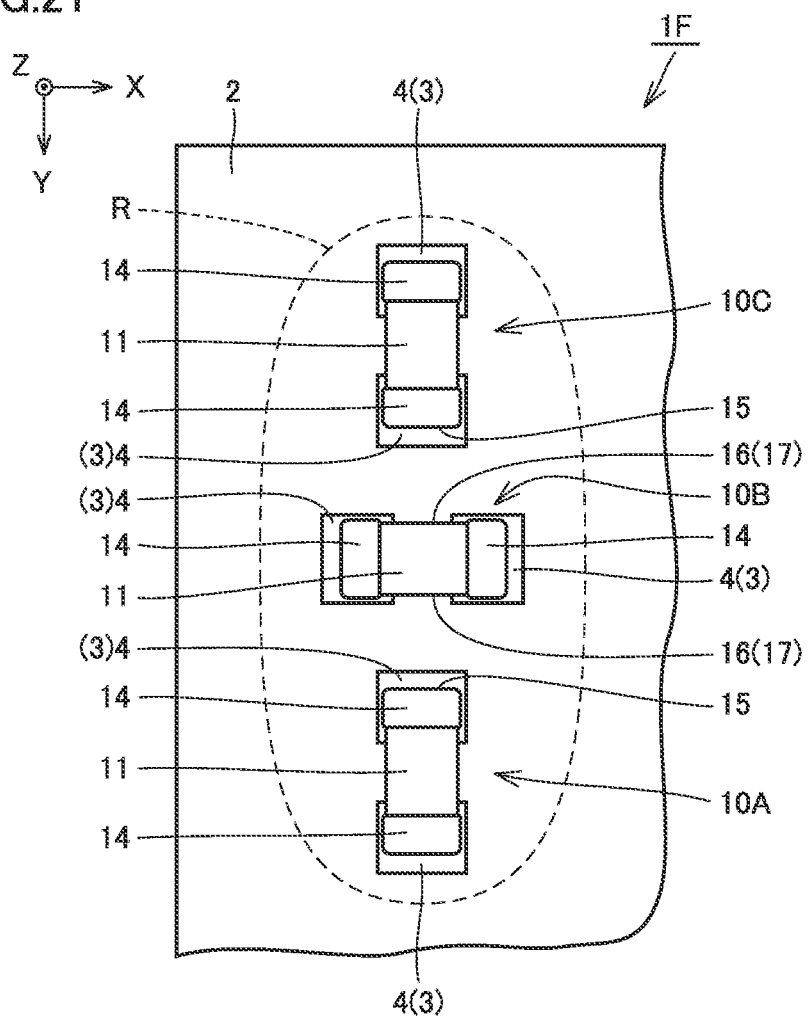
FIG. 21 is a schematic plan view showing the layout of monolithic ceramic capacitors included in a circuit module according to a sixth configuration example.

FIG. 21 is a schematic plan view showing the layout of monolithic ceramic capacitors included in a circuit module according to a sixth configuration example based on the present preferred embodiment. It is noted that in FIG. 21, mold resin layer 5 is not shown.

The present sixth configuration example focuses on three monolithic ceramic capacitors with identical design specifications (identical capacitance and identical size) electrically connected in series or in parallel through a conductive pattern provided on a wiring board, as a plurality of monolithic ceramic capacitors included in the monolithic ceramic capacitor group described above. The three monolithic ceramic capacitors in the circuit module according to the present sixth configuration example are electrically connected in series or in parallel with each other, as in the first configuration example.

As shown in FIG. 21, in a circuit module 1F according to the present sixth configuration example, first monolithic ceramic capacitor 10A, second monolithic ceramic capacitor 10B, and third monolithic ceramic capacitor 10C are each mounted in either of the above-noted first mounting mode 10(H) and second mounting mode 10(V). Specifically, first monolithic ceramic capacitor 10A, second monolithic ceramic capacitor 10B, and third monolithic ceramic capacitor 10C are each mounted on wiring board 2 such that the length direction L is parallel or substantially parallel to the main surface of wiring board 2 and either of the width direction W and the thickness direction T is parallel or substantially parallel to the normal direction (the Z-axis direction shown in the figure) to the main surface of wiring board 2. First monolithic ceramic capacitor 10A and second monolithic ceramic capacitor 10B are adjacent to each other, and second monolithic ceramic capacitor 10B and third monolithic ceramic capacitor 10C are adjacent to each other.

In such a configuration, one of a pair of end surfaces 15 of first monolithic ceramic capacitor 10A is opposed to one of a pair of side surfaces (including a pair of thickness-direction side surfaces 16 and a pair of width-direction side surfaces 17) of second monolithic ceramic capacitor 10B with mold resin layer interposed, and one of a pair of end surfaces 15 of third monolithic ceramic capacitor 10C is opposed to the other of a pair of side surfaces (including a pair of thickness-direction side surfaces 16 and a pair of width-direction side surfaces 17) of second monolithic ceramic capacitor 10B with mold resin layer 5 interposed.

Therefore, in the present sixth configuration example, first monolithic ceramic capacitor 10A and second monolithic ceramic capacitor 10B positioned adjacent to each other have the positional relation as in seventh to tenth layout patterns LP7 to LP10 in the third layout group, and second monolithic ceramic capacitor 10B and third monolithic ceramic capacitor 10C positioned adjacent to each other have the positional relation as in the seventh to tenth layout patterns LP7 to LP10 in the third layout group.

Therefore, with this configuration, vibration of circuit module 1F resulting from distortion produced in first monolithic ceramic capacitor 10A, second monolithic ceramic capacitor 10B, and third monolithic ceramic capacitor 10C during voltage application is significantly reduced or prevented in region R. This results in significant reduction or prevention of noise and prevents malfunction of other elements.

Here, the stacking directions of dielectric layers 12 and internal electrode layers 13 in first monolithic ceramic capacitor 10A, second monolithic ceramic capacitor 10B, and third monolithic ceramic capacitor 10C are aligned in the same direction, thus facilitating manufacturing of circuit module 1F. Meanwhile, in terms of suppressing vibration produced in this circuit module 1F, for example, referring to FIG. 21, it is preferable that first monolithic ceramic capacitor 10A, second monolithic ceramic capacitor 10B, and third monolithic ceramic capacitor 10C are each mounted in the above-noted second mounting mode 10(V).

On the other hand, in terms of maximizing suppression of vibration produced in circuit module 1F, for example, referring to FIG. 21, it is preferable that first monolithic ceramic capacitor 10A and second monolithic ceramic capacitor 10B are each mounted in the above-noted second mounting mode 10(V) and third monolithic ceramic capacitor 10C is mounted in the above-noted first mounting mode 10(H).

Seventh Configuration Example

Figure 22:
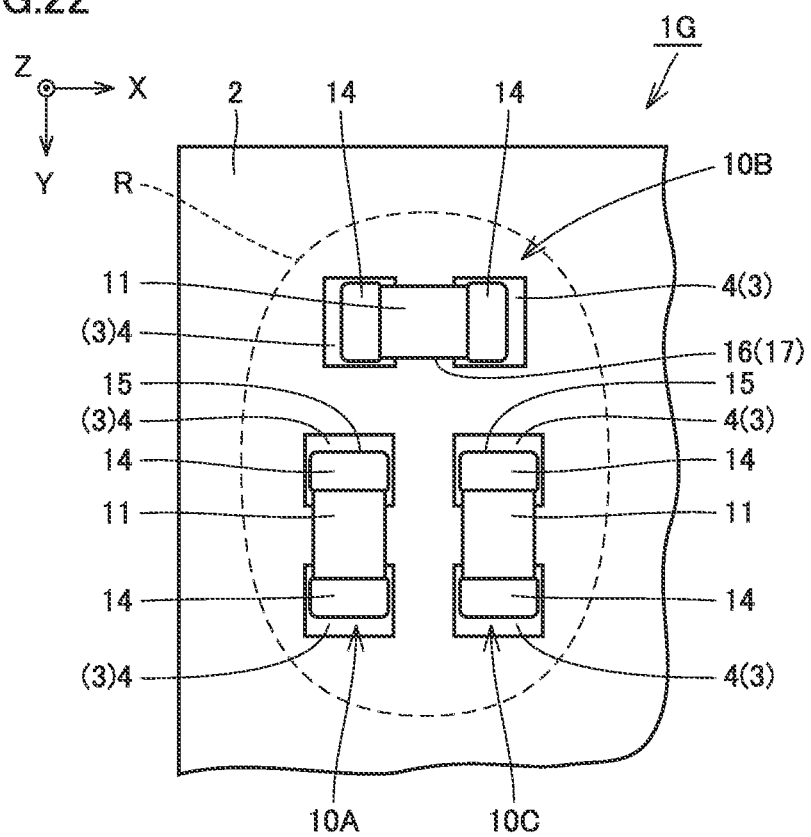
FIG. 22 is a schematic plan view showing the layout of monolithic ceramic capacitors included in a circuit module according to a seventh configuration example.

FIG. 22 is a schematic plan view showing the layout of monolithic ceramic capacitors included in a circuit module according to a seventh configuration example based on the present preferred embodiment. It is noted that in FIG. 22, mold resin layer 5 is not shown.

The present seventh configuration example focuses on three monolithic ceramic capacitors with identical design specifications (identical capacitance and identical size) electrically connected in series or in parallel through a conductive pattern provided on a wiring board, as a plurality of monolithic ceramic capacitors included in the monolithic ceramic capacitor group described above. The three monolithic ceramic capacitors in the present seventh configuration example are electrically connected in series or in parallel with each other, as in the first configuration example.

As shown in FIG. 22, in a circuit module 1G according to the present seventh configuration example, first monolithic ceramic capacitor 10A, second monolithic ceramic capacitor 10B, and third monolithic ceramic capacitor 10C are each mounted in either of the above-noted first mounting mode 10(H) and second mounting mode 10(V). Specifically, first monolithic ceramic capacitor 10A, second monolithic ceramic capacitor 10B, and third monolithic ceramic capacitor 10C are mounted on wiring board 2 such that the length direction L is parallel or substantially parallel to the main surface of wiring board 2 and either of the width direction W and the thickness direction T is parallel or substantially parallel to the normal direction (the Z-axis direction shown in the figure) to the main surface of wiring board 2. First monolithic ceramic capacitor 10A, second monolithic ceramic capacitor 10B, and third monolithic ceramic capacitor 10C are adjacent to each other.

In such a configuration, one of a pair of end surfaces 15 of first monolithic ceramic capacitor 10A is opposed to one of a pair of side surfaces (including a pair of thickness-direction side surfaces 16 and a pair of width-direction side surfaces 17) of second monolithic ceramic capacitor 10B with mold resin layer interposed, and one of a pair of end surfaces 15 of third monolithic ceramic capacitor 10C is opposed to the one of a pair of side surfaces (including a pair of thickness-direction side surfaces 16 and a pair of width-direction side surfaces 17) of second monolithic ceramic capacitor 10B with mold resin layer 5 interposed.

Therefore, in the present seventh configuration example, first monolithic ceramic capacitor 10A and second monolithic ceramic capacitor 10B positioned adjacent to each other have the positional relation as in seventh to tenth layout patterns LP7 to LP10 in the third layout group, and third monolithic ceramic capacitor 10C and second monolithic ceramic capacitor 10B positioned adjacent to each other have the positional relation as in seventh to tenth layout patterns LP7 to LP10 in the third layout group.

Therefore, with this configuration, vibration of circuit module 1G resulting from distortion produced in first monolithic ceramic capacitor 10A, second monolithic ceramic capacitor 10B, and third monolithic ceramic capacitor 10C during voltage application is significantly reduced or prevented in region R. This results in significant reduction or preventing of noise and prevents malfunction of other elements.

Here, the stacking directions of dielectric layers 12 and internal electrode layers 13 in first monolithic ceramic capacitor 10A, second monolithic ceramic capacitor 10B, and third monolithic ceramic capacitor 10C are aligned in the same direction, thus facilitating manufacturing of circuit module 1G. Meanwhile, in terms of suppressing vibration produced in this circuit module 1G, for example, referring to FIG. 22, it is preferable that first monolithic ceramic capacitor 10A, second monolithic ceramic capacitor 10B, and third monolithic ceramic capacitor 10C are each mounted in the above-noted second mounting mode 10(V).

On the other hand, in terms of maximizing suppression of vibration produced in circuit module 1G, for example, referring to FIG. 22, it is preferable that first monolithic ceramic capacitor 10A and second monolithic ceramic capacitor 10B are each mounted in the above-noted second mounting mode 10(V) and third monolithic ceramic capacitor 10C is mounted in the above-noted first mounting mode 10(H).

Eighth Configuration Example

Figure 23:
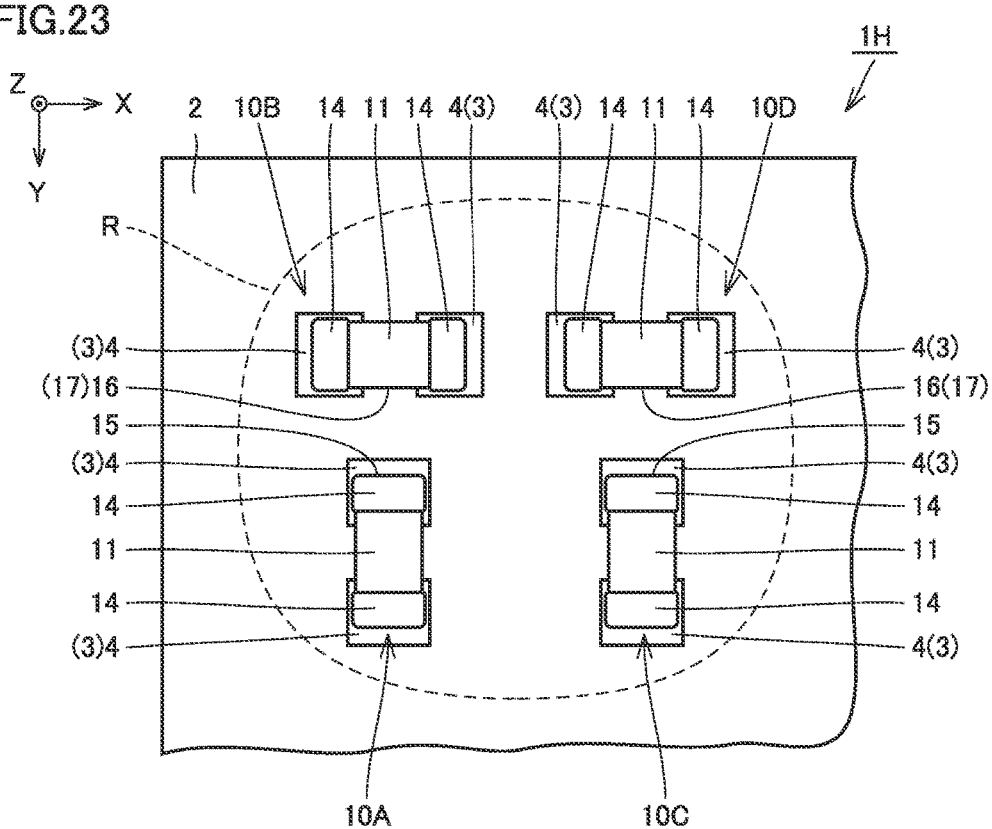
FIG. 23 is a schematic plan view showing the layout of monolithic ceramic capacitors included in a circuit module according to an eighth configuration example.

FIG. 23 is a schematic plan view showing the layout of monolithic ceramic capacitors included in a circuit module according to an eighth configuration example based on the present preferred embodiment. It is noted that in FIG. 23, mold resin layer 5 is not shown.

The present eighth configuration example focuses on four monolithic ceramic capacitors with identical design specifications (identical capacitance and identical size) electrically connected in series or in parallel through a conductive pattern provided on a wiring board, as a plurality of monolithic ceramic capacitors included in the monolithic ceramic capacitor group described above. The four monolithic ceramic capacitors in the present eighth configuration example are electrically connected in series or in parallel with each other, as in the first configuration example.

As shown in FIG. 23, in a circuit module 1H according to the present eighth configuration example, first monolithic ceramic capacitor 10A, second monolithic ceramic capacitor 10B, third monolithic ceramic capacitor 10C, and fourth monolithic ceramic capacitor 10D are each mounted in either of the above-noted first mounting mode 10(H) and second mounting mode 10(V). Specifically, first monolithic ceramic capacitor 10A, second monolithic ceramic capacitor 10B, third monolithic ceramic capacitor 10C, and fourth monolithic ceramic capacitor 10D are each mounted on wiring board 2 such that the length direction L is parallel or substantially parallel to the main surface of wiring board 2 and either of the width direction W and the thickness direction T is parallel or substantially parallel to the normal direction (the Z-axis direction shown in the figure) to the main surface of wiring board 2. First monolithic ceramic capacitor 10A, second monolithic ceramic capacitor 10B, third monolithic ceramic capacitor 10C, and fourth monolithic ceramic capacitor 10D are adjacent to each other. More specifically, first monolithic ceramic capacitor 10A and third monolithic ceramic capacitor 10C are arranged such that the respective axes along the length direction L are positioned parallel or substantially parallel at a distance from each other on the main surface of wiring board 2. Second monolithic ceramic capacitor 10B and fourth monolithic ceramic capacitor 10D are arranged such that the respective axes along the length direction L are positioned on the same straight line on the main surface of wiring board 2.

In such a configuration, one of a pair of end surfaces 15 of first monolithic ceramic capacitor 10A is opposed to one of a pair of side surfaces (including a pair of thickness-direction side surfaces 16 and a pair of width-direction side surfaces 17) of second monolithic ceramic capacitor 10B with mold resin layer interposed, and one of a pair of end surfaces 15 of third monolithic ceramic capacitor 10C is opposed to one of a pair of side surfaces (including a pair of thickness-direction side surfaces 16 and a pair of width-direction side surfaces 17) of fourth monolithic ceramic capacitor 10D with mold resin layer 5 interposed.

Therefore, in the present eighth configuration example, first monolithic ceramic capacitor 10A and second monolithic ceramic capacitor 10B positioned adjacent to each other as well as third monolithic ceramic capacitor 10C and fourth monolithic ceramic capacitor 10D positioned adjacent to each other have the positional relation as in seventh to tenth layout patterns LP7 to LP10 in the third layout group.

Therefore, with this configuration, vibration of circuit module 1H resulting from distortion produced in first monolithic ceramic capacitor 10A, second monolithic ceramic capacitor 10B, third monolithic ceramic capacitor 10C, and fourth monolithic ceramic capacitor 10D during voltage application is significantly reduced or prevented in region R. This results in significant reduction or preventing of noise and prevents malfunction of other elements.

Here, the stacking directions of dielectric layers 12 and internal electrode layers 13 in first monolithic ceramic capacitor 10A, second monolithic ceramic capacitor 10B, third monolithic ceramic capacitor 10C, and fourth monolithic ceramic capacitor 10D are aligned in the same direction, thus facilitating manufacturing of circuit module 1H. Meanwhile, in terms of suppressing vibration produced in this circuit module 1H, for example, referring to FIG. 23, it is preferable that first monolithic ceramic capacitor 10A, second monolithic ceramic capacitor 10B, third monolithic ceramic capacitor 10C, and fourth monolithic ceramic capacitor 10D are each mounted in the above-noted second mounting mode 10(V).

On the other hand, in terms of maximizing suppression of vibration produced in circuit module 1H, for example, referring to FIG. 23, it is preferable that first monolithic ceramic capacitor 10A and second monolithic ceramic capacitor 10B are each mounted in the above-noted second mounting mode 10(V) and third monolithic ceramic capacitor 10C and fourth monolithic ceramic capacitor 10D are each mounted in the above-noted first mounting mode 10(H).

Ninth Configuration Example

Figure 24:
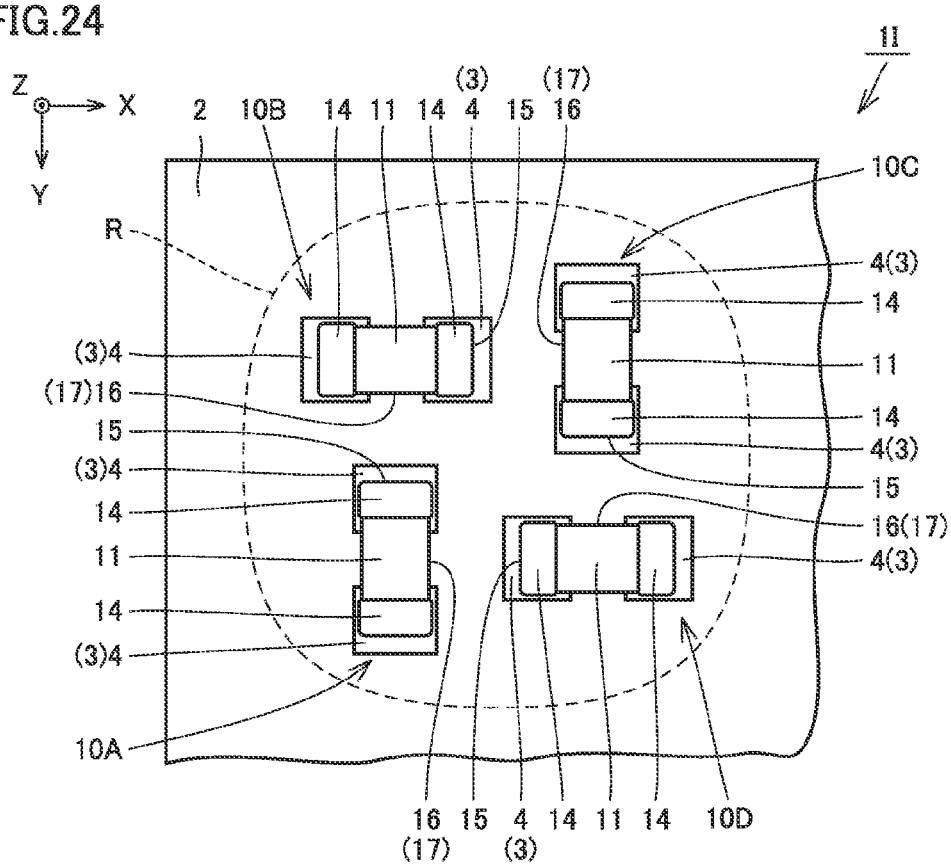
FIG. 24 is a schematic plan view showing the layout of monolithic ceramic capacitors included in a circuit module according to a ninth configuration example.

FIG. 24 is a schematic plan view showing the layout of monolithic ceramic capacitors included in a circuit module according to a ninth configuration example based on the present preferred embodiment. It is noted that in FIG. 24, mold resin layer 5 is not shown.

The present ninth configuration example focuses on four monolithic ceramic capacitors with identical design specifications (identical capacitance and identical size) electrically connected in series or in parallel through a conductive pattern provided on a wiring board, as a plurality of monolithic ceramic capacitors included in the monolithic ceramic capacitor group described above. The four monolithic ceramic capacitors in the present ninth configuration example are electrically connected in series or in parallel with each other, as in the first configuration example.

As shown in FIG. 24, in a circuit module 1I according to the present ninth configuration example, first monolithic ceramic capacitor 10A, second monolithic ceramic capacitor 10B, third monolithic ceramic capacitor 10C, and fourth monolithic ceramic capacitor 10D are each mounted in either of the above-noted first mounting mode 10(H) and second mounting mode 10(V). Specifically, first monolithic ceramic capacitor 10A, second monolithic ceramic capacitor 10B, third monolithic ceramic capacitor 10C, and fourth monolithic ceramic capacitor 10D are mounted on wiring board 2 such that the length direction L is parallel or substantially parallel to the main surface of wiring board 2 and either of the width direction W and the thickness direction T is parallel or substantially parallel to the normal direction (the Z-axis direction shown in the figure) to the main surface of wiring board 2. First monolithic ceramic capacitor 10A, second monolithic ceramic capacitor 10B, third monolithic ceramic capacitor 10C, and fourth monolithic ceramic capacitor 10D are adjacent to each other. More specifically, first monolithic ceramic capacitor 10A and third monolithic ceramic capacitor 10C are arranged such that the respective axes along the length direction L are positioned in parallel or substantially in parallel at a distance from each other on the main surface of wiring board 2. Second monolithic ceramic capacitor 10B and fourth monolithic ceramic capacitor 10D are arranged such that the respective axes along the length direction L are positioned in parallel or substantially in parallel at a distance from each other on the main surface of wiring board 2.

In such a configuration, one of a pair of end surfaces 15 of first monolithic ceramic capacitor 10A is opposed to one of a pair of side surfaces (including a pair of thickness-direction side surfaces 16 and a pair of width-direction side surfaces 17) of second monolithic ceramic capacitor 10B with mold resin layer interposed, and one of a pair of end surfaces 15 of second monolithic ceramic capacitor 10B is opposed to one of a pair of side surfaces (including a pair of thickness-direction side surfaces 16 and a pair of width-direction side surfaces 17) of third monolithic ceramic capacitor 10C with mold resin layer 5 interposed. Furthermore, one of a pair of end surfaces 15 of third monolithic ceramic capacitor 10C is opposed to one of a pair of side surfaces (including a pair of thickness-direction side surfaces 16 and a pair of width-direction side surfaces 17) of fourth monolithic ceramic capacitor 10D with mold resin layer 5 interposed, and one of a pair of end surfaces 15 of fourth monolithic ceramic capacitor 10D is opposed to one of a pair of side surfaces (including a pair of thickness-direction side surfaces 16 and a pair of width-direction side surfaces 17) of first monolithic ceramic capacitor 10A with mold resin layer 5 interposed.

Therefore, in the present ninth configuration example, first monolithic ceramic capacitor 10A and second monolithic ceramic capacitor 10B positioned adjacent to each other, second monolithic ceramic capacitor 10B and third monolithic ceramic capacitor 10C positioned adjacent to each other, third monolithic ceramic capacitor 10C and fourth monolithic ceramic capacitor 10D positioned adjacent to each other, as well as fourth monolithic ceramic capacitor 10D and first monolithic ceramic capacitor 10A positioned adjacent to each other have the positional relation as in seventh to tenth layout patterns LP7 to LP10 in the third layout group.

Therefore, with this configuration, vibration of circuit module 1I resulting from distortion produced in first monolithic ceramic capacitor 10A, second monolithic ceramic capacitor 10B, third monolithic ceramic capacitor 10C, and fourth monolithic ceramic capacitor 10D during voltage application is significantly reduced or prevented in region R. This results in significant reduction or preventing of noise and prevents malfunction of other elements.

Here, the stacking directions of dielectric layers 12 and internal electrode layers 13 in first monolithic ceramic capacitor 10A, second monolithic ceramic capacitor 10B, third monolithic ceramic capacitor 10C, and fourth monolithic ceramic capacitor 10D are aligned in the same direction, thus facilitating manufacturing of circuit module 1I. Meanwhile, in terms of suppressing vibration produced in this circuit module 1I, for example, referring to FIG. 24, it is preferable that first monolithic ceramic capacitor 10A, second monolithic ceramic capacitor 10B, third monolithic ceramic capacitor 10C, and fourth monolithic ceramic capacitor 10D are each mounted in the above-noted second mounting mode 10(V).

On the other hand, in terms of maximizing suppression of vibration produced in circuit module 1I, for example, referring to FIG. 24, it is preferable that first monolithic ceramic capacitor 10A and second monolithic ceramic capacitor 10B are each mounted in the above-noted second mounting mode 10(V) and third monolithic ceramic capacitor 10C and fourth monolithic ceramic capacitor 10D are each mounted in the above-noted first mounting mode 10(H).

Tenth Configuration Example

Figure 25:
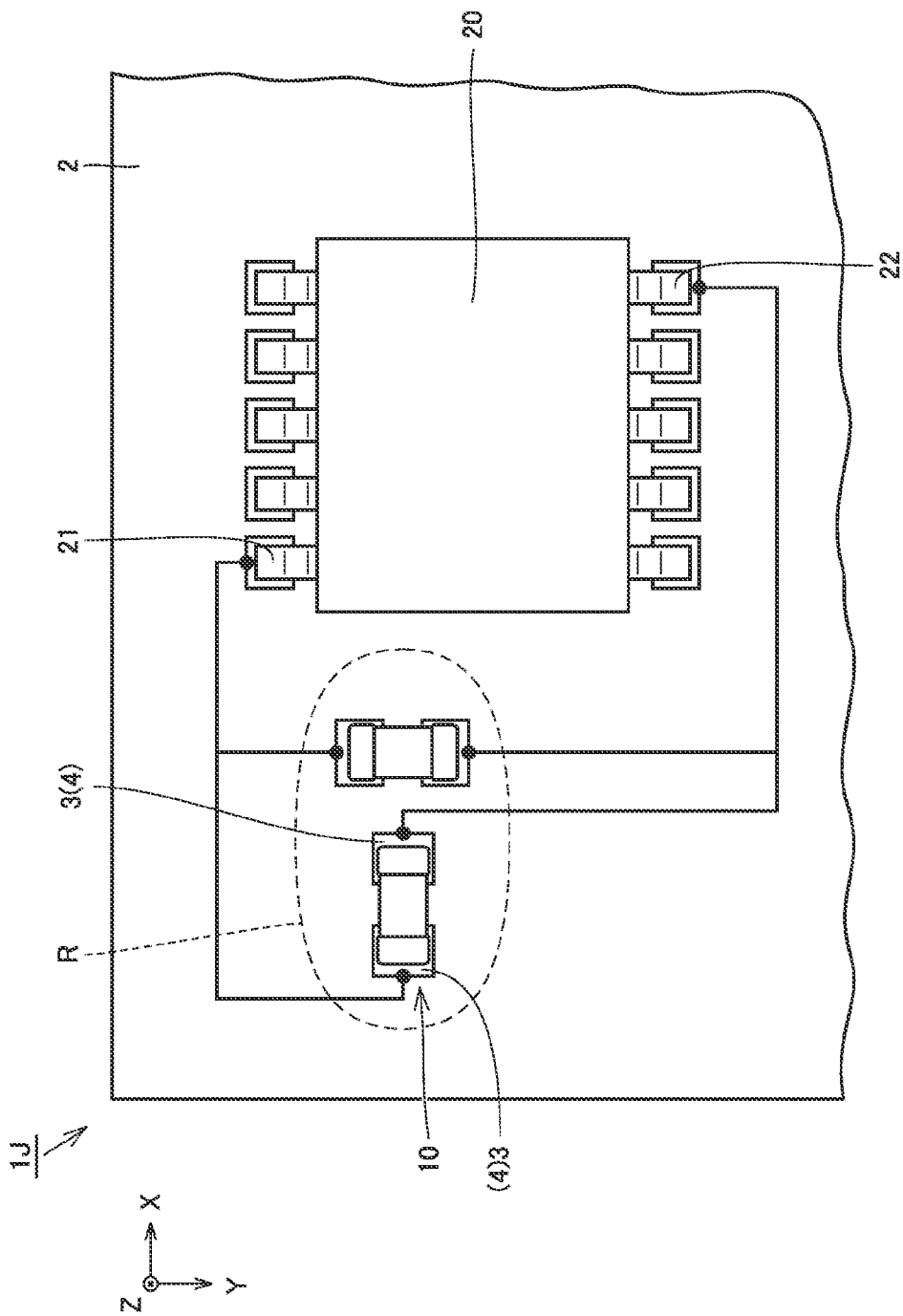
FIG. 25 is a schematic plan view showing the layout of monolithic ceramic capacitors and an IC included in a circuit module according to a tenth configuration example.

FIG. 25 is a schematic plan view showing the layout of monolithic ceramic capacitors and an IC included in a circuit module according to a tenth configuration example. It is noted that in FIG. 25, mold resin layer 5 is not shown.

As shown in FIG. 25, a circuit module 1J according to the present tenth configuration example includes a wiring board 2, an IC (Integrated Circuit) 20 as an integrated circuit device mounted on wiring board 2, a capacitor element group including two decoupling monolithic ceramic capacitors 10 mounted on wiring board 2 to be connected to the IC, and a not-shown mold resin layer. Any one of the layouts of first monolithic ceramic capacitor 10A and second monolithic ceramic capacitor 10B shown in first to fourth configuration examples 1A to 1D above (that is, any one of the seventh to tenth layout patterns LP7 to LP10 in the third layout group) is applied the layout of the two decoupling monolithic ceramic capacitors 10. Here, the two decoupling monolithic ceramic capacitors 10 have different capacitances and both are encapsulated by the not-shown mold resin layer described above on wiring board 2.

More specifically, IC 20 include a plurality of terminals for input/output from/to an external circuit. The terminals include a power supply terminal 21 and a ground terminal 22. The two decoupling monolithic ceramic capacitors 10 are lined up in the vicinity of IC 20 along the direction parallel or substantially parallel to the main surface on the main surface of wiring board 2 populated with IC 20.

The lands 3 connected to the respective external electrodes of the two decoupling monolithic ceramic capacitors 10 through bonding members 4 are connected to be associated with power supply terminal 21 and ground terminal 22 of IC 20 through wiring. Thus, two decoupling monolithic ceramic capacitors 10 are electrically connected in parallel between power supply terminal 21 and ground terminal 22.

Here, a decoupling monolithic ceramic capacitor is connected between the power supply line and the ground to reduce or prevent variation in power supply voltage and interference between circuits. A decoupling circuit including such decoupling monolithic ceramic capacitors is preferably provided by electrically connecting a plurality of monolithic ceramic capacitors with different capacitances in parallel between the power supply line and the ground so as to bring about the high noise-absorbing effect in a wide frequency range. A variety of ICs can be installed with a decoupling circuit, and examples include a CPU (Central Processing Unit), a GPU (Graphics Processing Unit), and an APU (Accelerated Processing Unit).

As described above, in circuit module 1J according to the present tenth configuration example, any one of the layouts of first monolithic ceramic capacitor 10A and second monolithic ceramic capacitor 10B shown in circuit modules 1A to 1D according to the first to fourth configuration examples above is applied the layout of two decoupling monolithic ceramic capacitors 10. With such a configuration, vibration produced in region R in which these two decoupling monolithic ceramic capacitors 10 are arranged is significantly reduced or prevented, and as a result, noise is significantly reduced or prevented, although a description thereof will not be repeated.

As described above, the arrangement of these two decoupling monolithic ceramic capacitors 10 in the vicinity of IC 20 prevent size increase of circuit module 1J and also reduce the loop inductance of the circuit on wiring board 2.

Therefore, by including the configuration as in circuit module 1J according to the present tenth configuration example to provide a decoupling circuit, it is possible to significantly reduce or prevent noise while preventing size increase of electronic equipment. Here, in the present tenth configuration example, two decoupling monolithic ceramic capacitors 10 and IC 20 are preferably lined up on the same straight line, by way of illustration. Alternatively, the direction in which two decoupling monolithic ceramic capacitors 10 are lined up may be perpendicular or substantially perpendicular to the direction in which the capacitor element group including two decoupling monolithic ceramic capacitors 10 and IC 20 are lined up.

Eleventh Configuration Example

Figure 26:
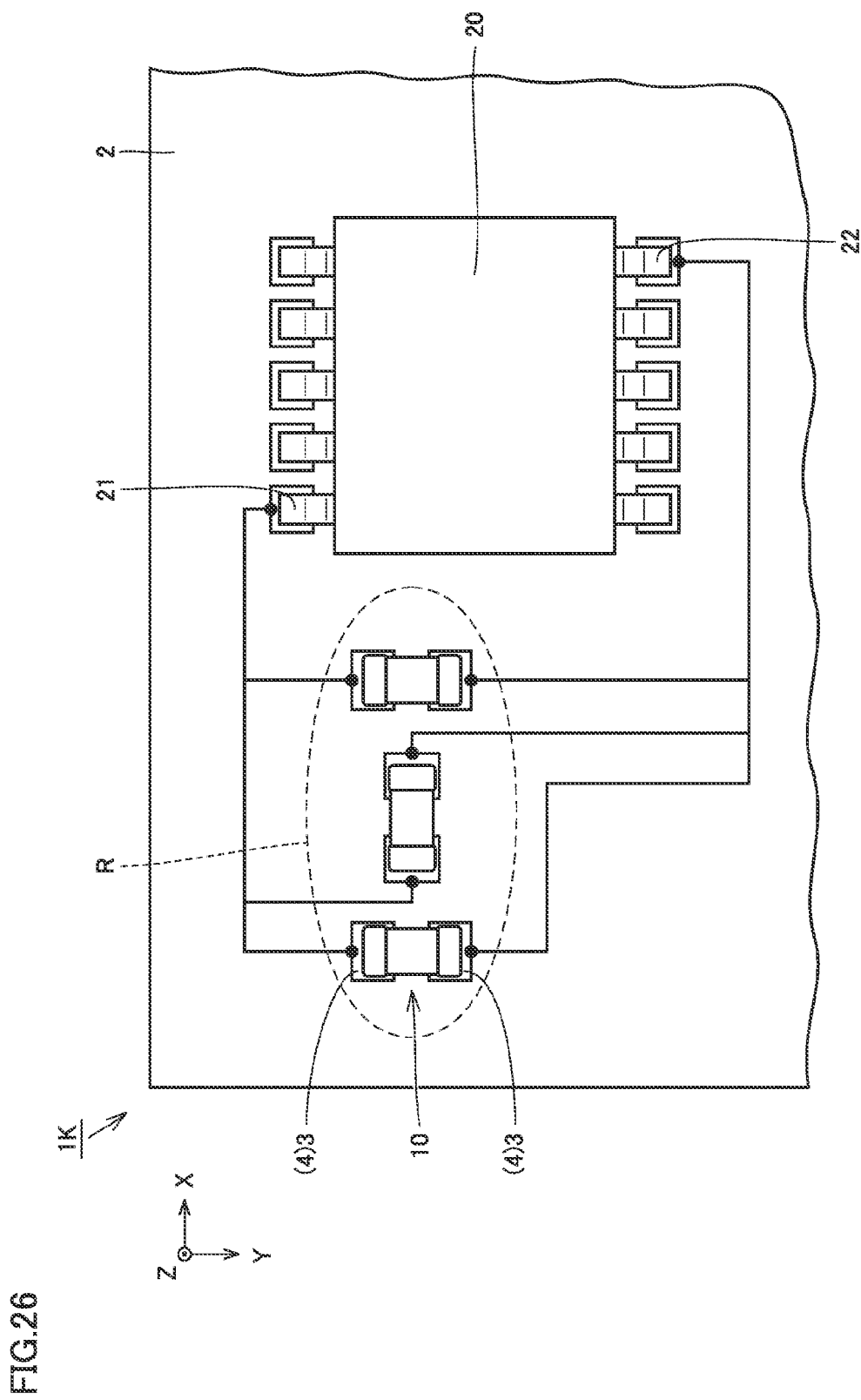
FIG. 26 is a schematic plan view showing the layout of monolithic ceramic capacitors and an IC included in a circuit module according to an eleventh configuration example.

FIG. 26 is a schematic plan view showing the layout of monolithic ceramic capacitors and an IC included in a circuit module according to an eleventh configuration example. It is noted that in FIG. 26, mold resin layer 5 is not shown.

As shown in FIG. 26, a circuit module 1K according to the present eleventh configuration example includes a wiring board 2, an IC 20 mounted on wiring board 2, a capacitor element group including three decoupling monolithic ceramic capacitors 10 mounted on wiring board 2 to be connected to the IC, and a not-shown mold resin layer. The layout of first monolithic ceramic capacitor 10A, second monolithic ceramic capacitor 10B, and third monolithic ceramic capacitor 10C shown in circuit module 1E according to the fifth configuration example above is applied the layout of the three decoupling monolithic ceramic capacitors 10. Here, the three decoupling monolithic ceramic capacitors 10 are a combination of large-capacitance, medium-capacitance, and small-capacitance capacitors, all of which are encapsulated by the not-shown mold resin layer on wiring board 2.

More specifically, as in the tenth configuration example, IC 20 includes a plurality of terminals for input/output from/to an external circuit. The terminals include a power supply terminal and a ground terminal 22. The three decoupling monolithic ceramic capacitors 10 are lined up along the direction parallel or substantially parallel to the main surface of wiring board 2 populated with IC 20 in the vicinity of IC 20.

The lands 3 connected to the respective external electrodes of three decoupling monolithic ceramic capacitors 10 through bonding members 4 are connected to be associated with power supply terminal 21 and ground terminal 22 of IC 20 through wiring. Thus, three decoupling monolithic ceramic capacitors 10 are electrically connected in parallel between power supply terminal 21 and ground terminal 22.

As described above, in circuit module 1K according to the present eleventh configuration example, the layout of first monolithic ceramic capacitor 10A, second monolithic ceramic capacitor 10B, and third monolithic ceramic capacitor 10C shown in circuit module 1E according to fifth the configuration example above is applied the layout of three decoupling monolithic ceramic capacitors 10. With such a configuration, vibration produced in region R in which these three decoupling monolithic ceramic capacitors 10 are arranged is significantly reduced or prevented, and as a result, noise is significantly reduced or prevented, although a detailed description thereof will not be repeated.

As described above, the arrangement of these three decoupling monolithic ceramic capacitors 10 in the vicinity of IC 20 prevents a size increase of circuit module 1K and also reduces the loop inductance of the circuit on wiring board 2.

Therefore, by including a configuration as in circuit module 1K according to the present eleventh configuration example to provide a decoupling circuit, it is possible to significantly reduce or prevent noise while preventing size increase of electronic equipment. Here, in the present eleventh configuration example, three decoupling monolithic ceramic capacitors 10 and IC 20 are preferably lined up on the same straight line, by way of illustration. Alternatively, the direction in which three decoupling monolithic ceramic capacitors 10 are lined up may be perpendicular or substantially perpendicular to the direction in which IC 20 and the capacitor element group including three decoupling monolithic ceramic capacitors 10 are lined up.

Twelfth Configuration Example

Figure 27:
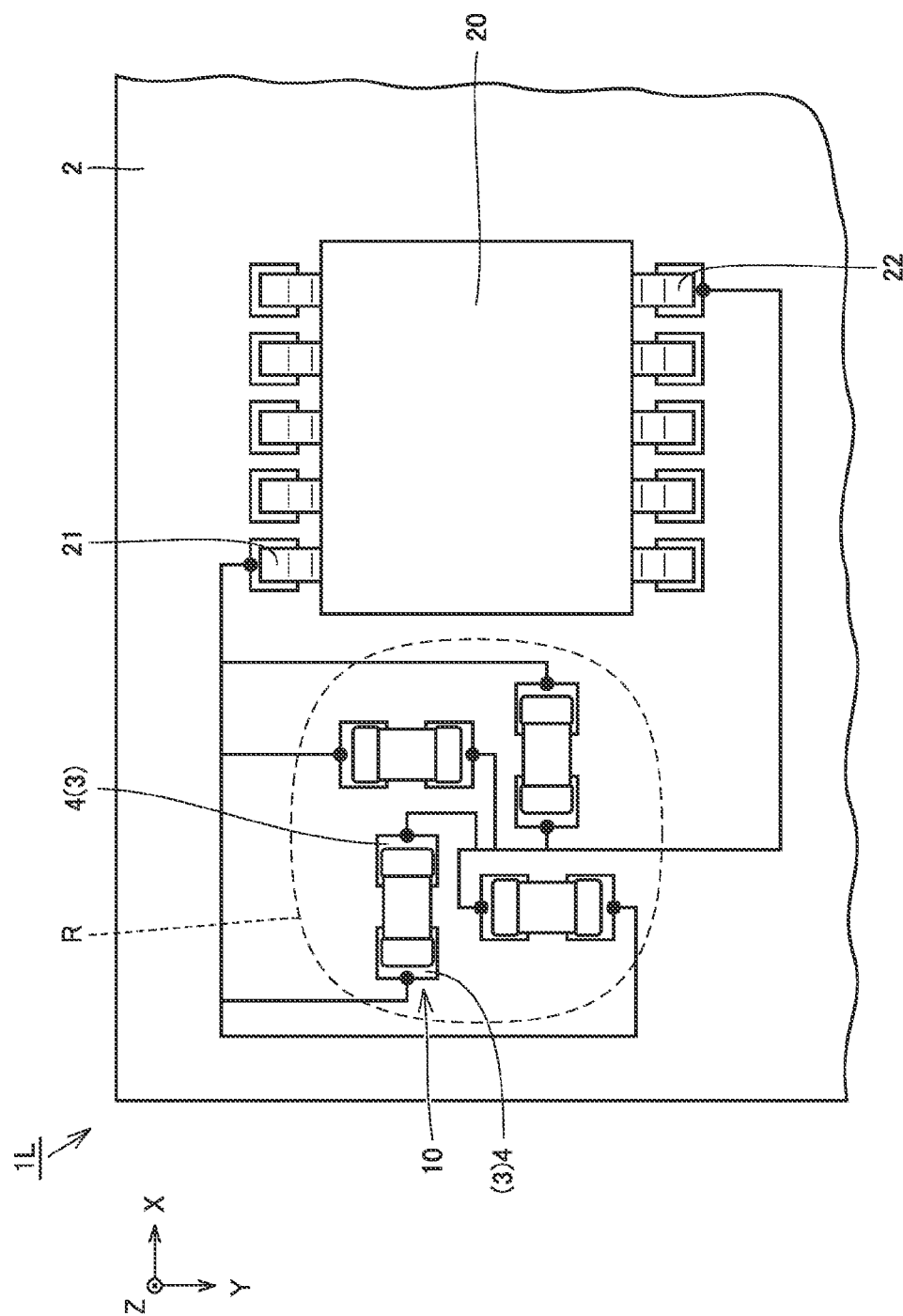
FIG. 27 is a schematic plan view showing the layout of monolithic ceramic capacitors and an IC included in a circuit module according to a twelfth configuration example.

FIG. 27 is a schematic plan view showing the layout of monolithic ceramic capacitors and an IC included in a circuit module according to a twelfth configuration example. It is noted that in FIG. 27, mold resin layer 5 is not shown.

As shown in FIG. 27, a circuit module 1L according to the present twelfth configuration example includes a wiring board 2, an IC 20 mounted on wiring board 2, a capacitor element group including four decoupling monolithic ceramic capacitors 10 mounted on wiring board 2 to be connected to the IC, and a not-shown mold resin layer. The layout of first monolithic ceramic capacitor 10A, second monolithic ceramic capacitor 10B, third monolithic ceramic capacitor 10C, and fourth monolithic ceramic capacitor 10D shown in circuit module 1I according to the ninth configuration example above is applied the layout of the four decoupling monolithic ceramic capacitors 10. Here, the four decoupling monolithic ceramic capacitors 10 are preferably a combination of small-capacitance, medium-capacitance, and large-capacitance capacitors, in which the large-capacitance capacitor corresponds to two monolithic ceramic capacitors 10 having the same capacitance, and medium-capacitance and small-capacitance capacitors each correspond to a single monolithic ceramic capacitor 10. All of the four decoupling monolithic ceramic capacitors 10 are encapsulated by the not-shown mold resin layer on wiring board 2.

More specifically, as in the tenth configuration example above, IC 20 includes a plurality of terminals for input/output from/to an external circuit. The terminals include a power supply terminal 21 and a ground terminal 22. The four decoupling monolithic ceramic capacitors 10 are lined up along the direction parallel or substantially parallel to the main surface in the vicinity of IC 20 on the main surface of wiring board 2 populated with IC 20.

The lands 3 connected to the respective external electrodes of the four decoupling monolithic ceramic capacitors 10 through bonding members 4 are connected to be associated with power supply terminal 21 and ground terminal 22 of IC 20 through wiring. Thus, four decoupling monolithic ceramic capacitors 10 are electrically connected in parallel between power supply terminal 21 and ground terminal 22.

As described above, in circuit module 1L according to the present twelfth configuration example, the layout of first monolithic ceramic capacitor 10A, second monolithic ceramic capacitor 10B, third monolithic ceramic capacitor 10C, and fourth monolithic ceramic capacitor 10D shown in circuit module 1I according to the ninth configuration example is applied the layout of four decoupling monolithic ceramic capacitors 10. With such a configuration, vibration produced in region R in which these four decoupling monolithic ceramic capacitors 10 are arranged is significantly reduced or prevented, and as a result, noise is significantly reduced or prevented, although a detailed description thereof will not be repeated.

As described above, the arrangement of these four decoupling monolithic ceramic capacitors 10 in the vicinity of IC 20 prevents a size increase of circuit module 1L and also reduces the loop inductance of the circuit on wiring board 2.

Therefore, by including a configuration as in circuit module 1L according to the present twelfth configuration example to provide a decoupling circuit, it is possible to significantly reduce or prevent noise while preventing a size increase of electronic equipment.

Verification Test

In the following, a verification test conducted to confirm the advantageous effects of preferred embodiments of the present invention will be described. The verification test conducted includes first and second verification tests, in which the mounting layout of monolithic ceramic capacitors on the wiring board is modified into a variety of forms and the mounting mode of a monolithic ceramic capacitor on the wiring board is modified into a variety of forms, such that what change occurs in the sound pressure level of noise produced during voltage application is determined.

First Verification Test

FIG. 28 shows the mounting layouts of monolithic ceramic capacitors according to Comparative Examples 1, 2 and Examples 1, 2 verified in the first verification test. It is noted that in FIG. 28, the mold resin layer is not shown. In the first verification test, the circuit modules including the mounting layouts of monolithic ceramic capacitors shown in FIGS. 28A to 28D were prepared as samples, and the sound pressure levels of noise produced when voltage was actually applied these samples were measured.

Of the samples prepared in the first verification test, the sample according to Comparative Example 1 (see FIG. 28A) and the sample according to Example 1 (see FIG. 28C) both include two monolithic ceramic capacitors 10 mounted in the above-noted first mounting mode 10(H). The sample according to Comparative Example (see FIG. 28B) and the sample according to Example 2 (see FIG. 28D) both include two monolithic ceramic capacitors 10 mounted in the above-noted second mounting mode 10(V).

Figure 28A:
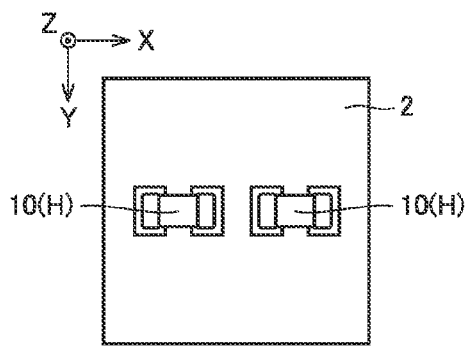
FIG. 28A is a diagram showing the mounting layout of monolithic ceramic capacitors according to Comparative Example 1 verified in a first verification test.

As shown in FIG. 28A, the mounting layout according to Comparative Example 1 is configured as the fourth layout pattern LP4 in the second layout group, such that the length direction L of two monolithic ceramic capacitors 10 is matched with the X-axis direction of wiring board 2, and the width direction W of two monolithic ceramic capacitors 10 is matched with the Y-axis direction of wiring board 2.

Figure 28B:
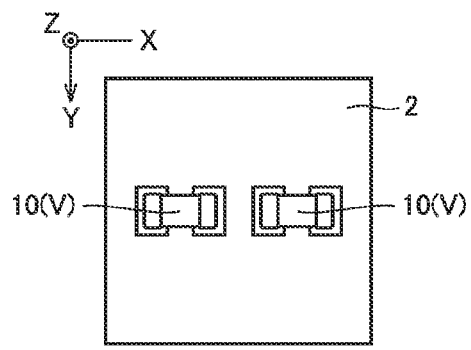
FIG. 28B is a diagram showing the mounting layout of monolithic ceramic capacitors according to Comparative Example 2 verified in the first verification test.

As shown in FIG. 28B, the mounting layout according to Comparative Example 2 is configured as the fifth layout pattern LP5 in the second layout group, such that the length direction L of two monolithic ceramic capacitors 10 is matched with the X-axis direction of wiring board 2, and the thickness direction T of two monolithic ceramic capacitors 10 is matched with the Y-axis direction of wiring board 2.

Figure 28C:
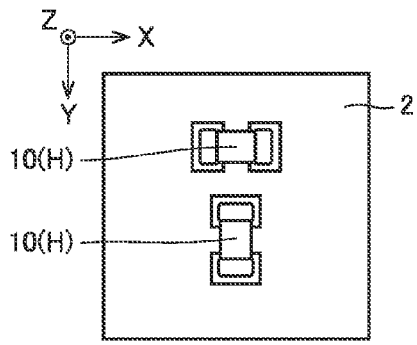
FIG. 28C is a diagram showing the mounting layout of monolithic ceramic capacitors according to Example 1 verified in the first verification test.

As shown in FIG. 28C, the mounting layout according to Example 1 is configured as the seventh layout pattern LP7 in the third layout group (that is, the mounting layout as in the first configuration example), such that the width direction W of one monolithic ceramic capacitor 10 and the length direction L of the other monolithic ceramic capacitor 10 are matched with the X-axis direction of wiring board 2, and the length direction L of the one monolithic ceramic capacitor 10 and the width direction W of the other monolithic ceramic capacitor 10 are matched with the Y-axis direction of wiring board 2. One of a pair of axial-direction end surfaces of one monolithic ceramic capacitor 10 is opposed to one of a pair of width-direction end surfaces of the other monolithic ceramic capacitor 10 with the mold resin layer interposed.

Figure 28D:
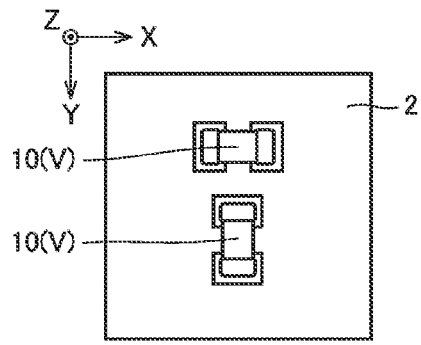
FIG. 28D is a diagram showing the mounting layout of monolithic ceramic capacitors according to Example 2 verified in the first verification test.

As shown in FIG. 28D, the mounting layout according to Example 2 is configured as the eighth layout pattern LP8 in the third layout group (that is, the mounting layout as in the second configuration example), such that the thickness direction T of one monolithic ceramic capacitor 10 and the length direction L of the other monolithic ceramic capacitor 10 are matched with the X-axis direction of wiring board 2, and the length direction L of the one monolithic ceramic capacitor 10 and the thickness direction T of the other monolithic ceramic capacitor 10 are matched with the Y-axis direction of wiring board 2. One of a pair of axial-direction end surfaces of one monolithic ceramic capacitor 10 is opposed to one of a pair of thickness-direction end surfaces of the other monolithic ceramic capacitor 10 with the mold resin layer interposed.

All of monolithic ceramic capacitors 10 used in Comparative Examples 1, 2 and Examples 1, 2 have identical design specifications. More specifically, the external dimension in the length direction L, the external dimension in the width direction W, and the external dimension in the thickness direction T of monolithic ceramic capacitor 10 are approximately 1.0 mm×0.5 mm×0.5 mm, and the capacitance is 2.2 µF. In all of Comparative Examples 1, 2 and Examples 1, 2, a plurality of monolithic ceramic capacitors 10 are electrically connected in parallel. Wiring board 2 used is a glass epoxy substrate with a thickness of about 0.8 mm, and a plurality of monolithic ceramic capacitors 10 are encapsulated with an epoxy resin layer with a thickness of about 0.8 mm as mold resin layer 5.

Figure 29:
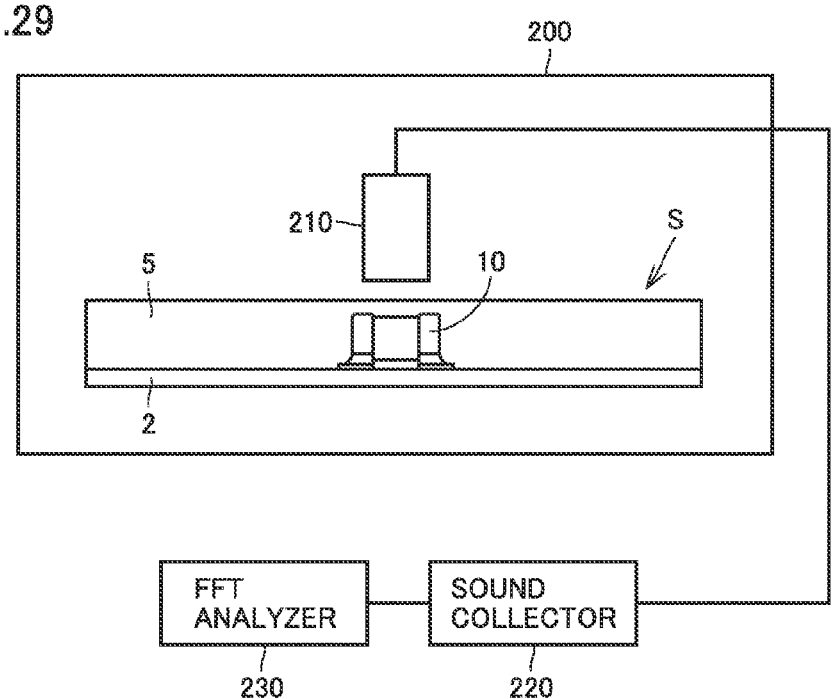
FIG. 29 is a schematic view showing a method of measuring the sound pressure level of noise in the first verification test.

FIG. 29 is a schematic view showing a method of measuring the sound pressure level of noise in the first verification test. As shown in FIG. 29, to measure the sound pressure level of noise, sample S was installed in an anechoic box 200. In this state, AC voltage of 2 Vpp was applied monolithic ceramic capacitor 10 with frequencies in a range of about 4.5 kHz or more to about 5.0 kHz or less, and the maximum value of noise produced at that time was measured.

The sound pressure level of noise was measured by arranging a sound-collecting microphone 210 to face sample S in anechoic box 200, collecting sound emitted from sample S with sound-collecting microphone 210 and a sound collector 220, and analyzing the sound pressure level using an FFT analyzer 230 based on this.

In measuring the sound pressure level of noise, wiring board 2 having a rectangular or substantially rectangular shape including long sides and short sides was used in each sample so that the sound pressure level of noise caused by vibration along the X-axis direction of wiring board 2 and the sound pressure level of noise caused by vibration along the Y-axis direction of wiring board 2 can be independently measured. That is, in each of Comparative Examples 1, 2 and Examples 1, 2, a sample was prepared such that the long-side direction of wiring board 2 having a rectangular or substantially rectangular shape was matched with the X-axis direction and the dimension in the Y-axis direction of the mount area for monolithic ceramic capacitor 10 was matched with the length in the short-side direction of wiring board 2 having a rectangular or substantially rectangular shape, in order to measure the sound pressure level of noise caused by vibration along the X-axis direction. In addition, a sample was prepared such that the long-side direction of wiring board 2 having a rectangular or substantially rectangular shape was matched with the Y-axis direction and the dimension in the X-axis direction of the mount area for monolithic ceramic capacitor 10 was matched with the length in the short-side direction of wiring board 2 having a rectangular or substantially rectangular shape, in order to measure the sound pressure level of noise caused by vibration along the Y-axis direction. For each of these samples, the sound pressure level of noise was measured.

Figure 30:
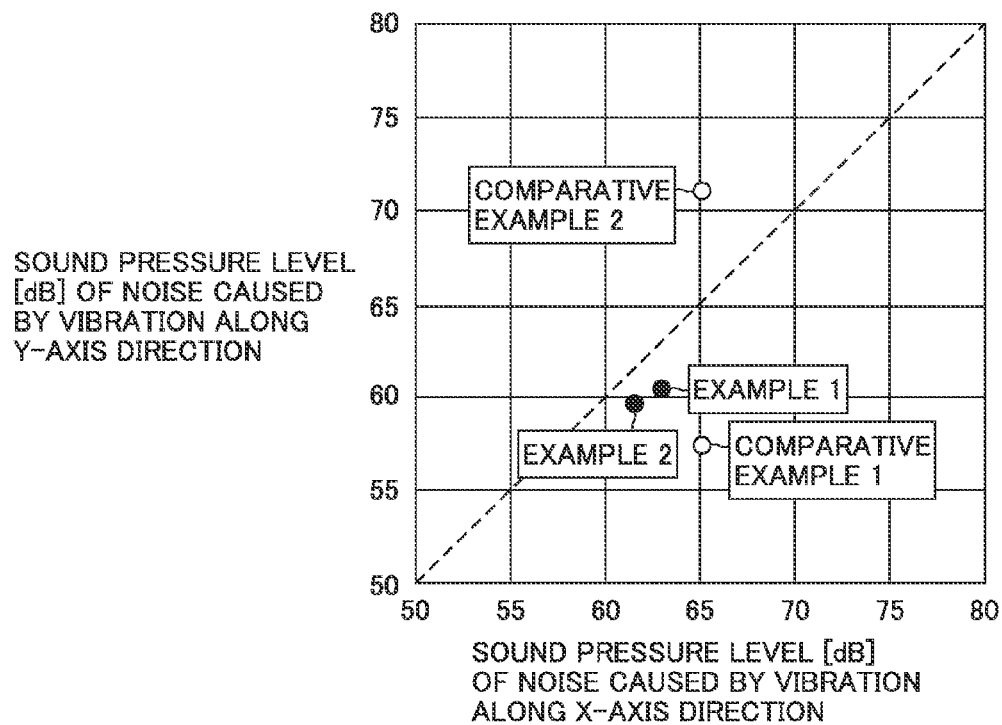
FIG. 30 is a graph showing the result of the first verification test.

FIG. 30 is a graph showing the result of the first verification test. In the graph shown in FIG. 30, the horizontal axis represents the sound pressure level in dB of noise caused by vibration along the X-axis direction, and the vertical axis represents the sound pressure level in dB of noise caused by vibration along the Y-axis direction.

As shown in FIG. 30, as for the relation between Comparative Example 1 and Examples 1, 2, it was confirmed that the sound pressure level of noise was significantly reduced in the X-axis direction in Examples 1, 2 that preferred embodiments of the present invention is applied, compared with Comparative Example 1 in which preferred embodiments of the present invention are not applied. As for the relation between Comparative Example 2 and Examples 1, 2, it was confirmed that the sound pressure level of noise was significantly reduced in both the X-axis direction and the Y-axis direction in Examples 1, 2 in which preferred embodiments of the present invention are applied, compared with Comparative Example 2 in which preferred embodiments of the present invention are not applied. In particular, as for the relation between Comparative Example 2 and Examples 1, 2, the sound pressure level of noise is significantly reduced in the Y-axis direction in Examples 1, 2 in which preferred embodiments of the present invention are applied, compared with Comparative Example 2 in which preferred embodiments of the present invention are not applied.

As for the relation between Example 1 and Example 2, it was confirmed that the sound pressure level of noise was significantly reduced in both the X-axis direction and the Y-axis direction in Example 2 in which preferred embodiments of the present invention are applied, compared with Example 1 in which preferred embodiments of the present invention are applied.

It is experimentally confirmed based on the first verification test described above that the application of preferred embodiments of the present invention significantly reduces or prevents transmission of vibration and results in reduction of noise.

Second Verification Test

Figure 31A:
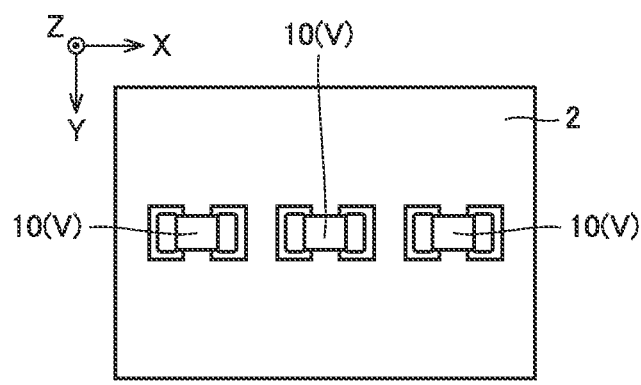
FIG. 31A is a diagram showing the mounting layout of monolithic ceramic capacitors according to Comparative Example 3 verified in a second verification test.
Figure 31B:
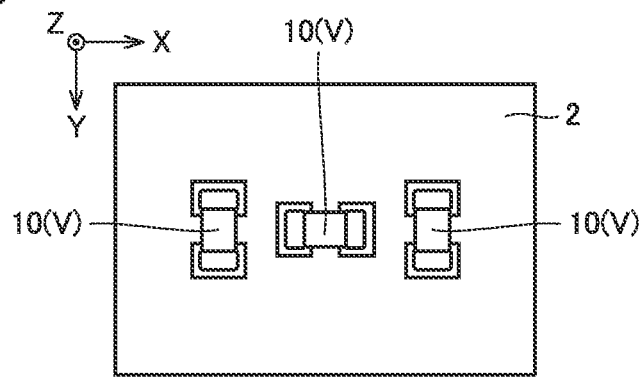
FIG. 31B is a diagram showing the mounting layout of monolithic ceramic capacitors according to Example 3 verified in the second verification test.
Figure 31C:
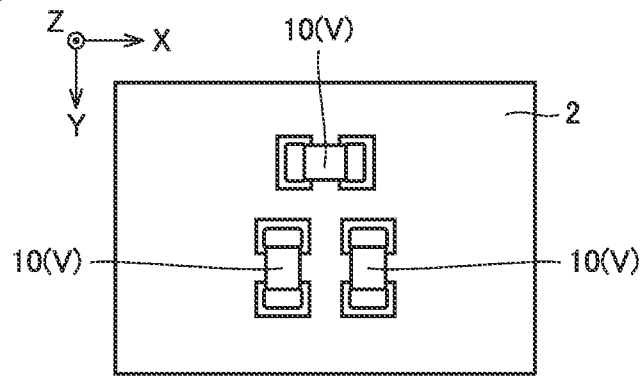
FIG. 31C is a diagram showing the mounting layout of monolithic ceramic capacitors according to Example 4 verified in the second verification test.

FIG. 31 shows the mounting layouts of monolithic ceramic capacitors according to Comparative Example 3 and Examples 3, 4 verified in a second verification test. It is noted that in FIG. 31, the mold resin layer is not shown. In the second verification test, the circuit modules including the mounting layouts of monolithic ceramic capacitors shown in FIGS. 31A to 31C were prepared as samples, and the sound pressure level of noise produced when voltage was actually applied each of these samples was measured.

All of the samples prepared in the second verification test include three monolithic ceramic capacitors mounted in the above-noted second mounting mode 10(V).

As shown in FIG. 31A, in the mounting layout according to Comparative Example 3, the length direction L of three monolithic ceramic capacitors 10 is matched with the X-axis direction of wiring board 2, and the width direction W of three monolithic ceramic capacitors 10 is matched with the Y-axis direction of wiring board 2. The length direction L of three monolithic ceramic capacitors 10 is positioned on the same straight line.

As shown in FIG. 31B, the mounting layout according to Example 3 is the same or similar to the mounting layout as in the fifth configuration example, such that the length direction L of one monolithic ceramic capacitor 10 and the thickness direction T of the remaining two monolithic ceramic capacitors 10 are matched with the X-axis direction of wiring board 2, and the thickness direction T of the one monolithic ceramic capacitor 10 and the length direction L of the two monolithic ceramic capacitors 10 are matched with the Y-axis direction of wiring board 2. It is noted that a pair of axial-direction end surfaces of the one monolithic ceramic capacitor 10 is opposed to one of a pair of thickness-direction end surfaces of one of the two monolithic ceramic capacitors 10 with the mold resin layer interposed, and the other of a pair of axial-direction end surfaces of the one monolithic ceramic capacitor 10 is opposed to one of a pair of thickness-direction end surfaces of the remaining one of the two monolithic ceramic capacitors 10 with the mold resin layer interposed.

As shown in FIG. 31C, the mounting layout according to Example 4 is the same or similar to the mounting layout as in the seventh configuration example, such that the thickness direction T of two monolithic ceramic capacitors 10 and the length direction L of the remaining one monolithic ceramic capacitor 10 are matched with the X-axis direction of wiring board 2, and the length direction L of the two monolithic ceramic capacitors 10 and the thickness direction T of the one monolithic ceramic capacitor 10 are matched with the Y-axis direction of wiring board 2. It is noted that one of a pair of axial-direction end surfaces of each of the two monolithic ceramic capacitors 10 is opposed to one of a pair of thickness-direction end surfaces of the one monolithic ceramic capacitor 10 with the mold resin layer interposed.

All of monolithic ceramic capacitors 10 used in Comparative Example 3 and Examples 3, 4 have identical design specifications. More specifically, the external dimension in the length direction L, the external dimension in the width direction W, and the external dimension in the thickness direction T of monolithic ceramic capacitor 10 are approximately 1.0 mm×0.5 mm×0.5 mm, and the capacitance is 2.2 µF. In all of Comparative Example 3 and Examples 3, 4, a plurality of monolithic ceramic capacitors 10 are electrically connected in parallel. The wiring board 2 used is a glass epoxy substrate with a thickness of about 0.8 mm, and all of a plurality of monolithic ceramic capacitors 10 are encapsulated with an epoxy resin layer with a thickness of about 0.8 mm as mold resin layer 5. In the second verification test, the sound pressure level of noise produced in the sample was measured by the same measurement method as the method of measuring the sound pressure level of noise illustrated in the first verification test.

Figure 32:
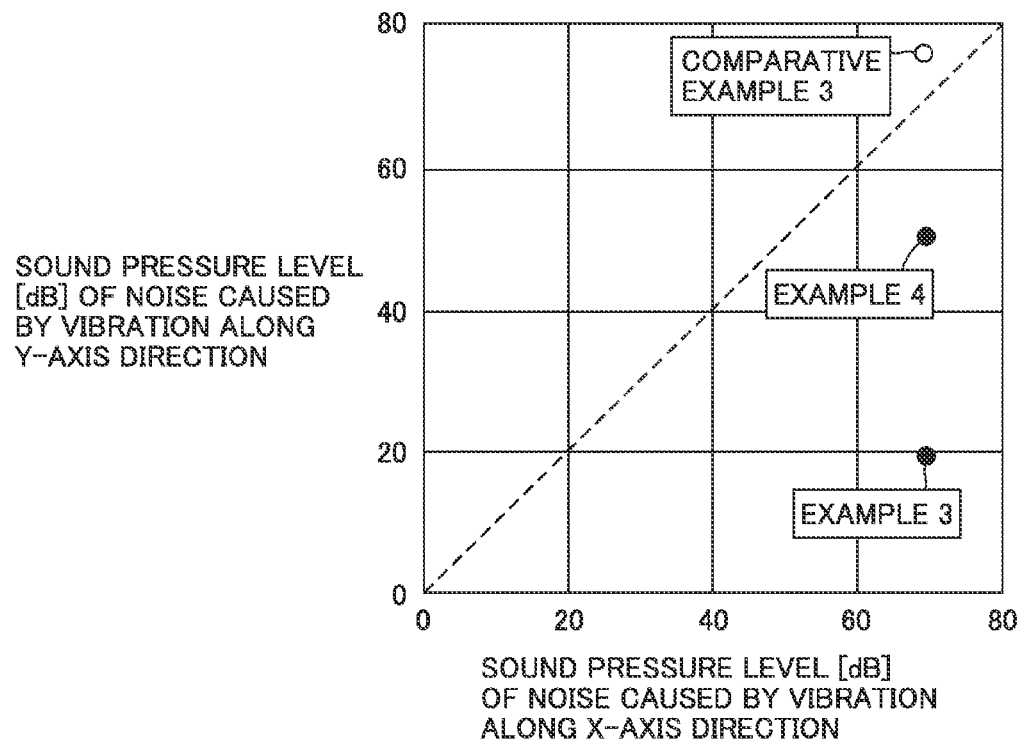
FIG. 32 is a graph showing the result of the second verification test.

FIG. 32 is a graph showing the result of the second verification test. In the graph shown in FIG. 32, the horizontal axis represents the sound pressure level in dB of noise caused by vibration along the X-axis direction, and the vertical axis represents the sound pressure level in dB of noise caused by vibration along the Y-axis direction.

As shown in FIG. 32, as for the relation between Comparative Example 3 and Examples 3, 4, it was confirmed that the sound pressure level of noise was significantly reduced in the Y-axis direction in Examples 3, 4 in which preferred embodiments of the present invention are applied, compared with Comparative Example 3 in which preferred embodiments of the present invention are not applied. In particular, as for the relation between Comparative Example 3 and Example 3, the sound pressure level of noise is extremely significantly reduced in the Y-axis direction in Example 3 in which preferred embodiments of the present invention are applied, compared with Comparative Example 3 in which preferred embodiments of the present invention are not applied.

It was experimentally confirmed based on the second verification test described above that the application of preferred embodiments of the present invention significantly reduces or prevents transmission of vibration and results in reduction of noise.

Third Verification Test

FIG. 33 shows the mounting layouts of monolithic ceramic capacitors according to Examples 5 to 8 verified in a third verification test. FIG. 34 shows the mounting layouts of monolithic ceramic capacitors according to Examples 9, 10 verified in the third verification test. In FIGS. 33 and 34, the mold resin layer is not shown. In the third verification test, the circuit modules including the mounting layouts of monolithic ceramic capacitors shown in FIGS. 33A to 33D and FIGS. 34A, B were prepared as samples, and the sound pressure level of noise produced when voltage was actually applied each of these samples was measured.

Of the samples prepared in the third verification test, the sample according to Example 5 (see FIG. 33A), the sample according to Example 8 (see FIG. 33D), the sample according to Example 9 (see FIG. 34A), and the sample according to Example 10 (see FIG. 34B) are structured such that two of four monolithic ceramic capacitors 10 included in the sample are mounted in the above-noted first mounting mode 10(H) and the remaining two are mounted in the above-noted second mounting mode 10(V). The sample according to Example 6 (see FIG. 33B) includes four monolithic ceramic capacitors 10 mounted in the above-noted second mounting mode 10(V). The sample according to Example 7 (see FIG. 33C) includes four monolithic ceramic capacitors 10 mounted in the above-noted first mounting mode 10(H).

As shown in FIGS. 33A to 33D, the mounting layouts according to Examples 5 to 8 are the same or similar to the mounting layout as in the ninth configuration example shown in FIG. 24.

Figure 33A:
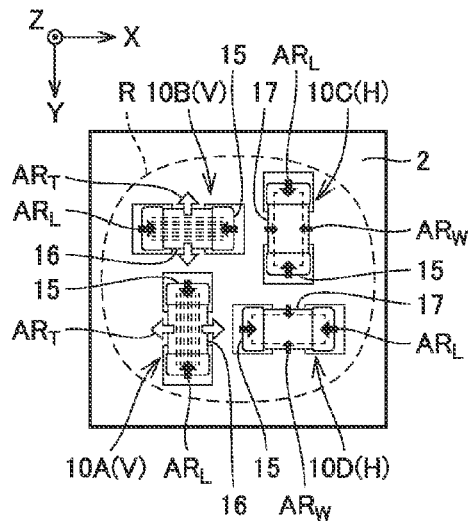
FIG. 33A is a diagram showing the mounting layout of monolithic ceramic capacitors according to Example 5 verified in a third verification test.
Figure 34A:
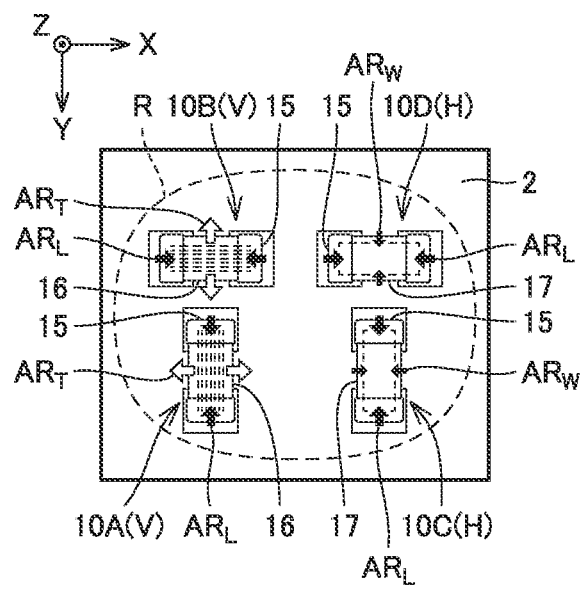
FIG. 34A is a diagram showing the mounting layout of monolithic ceramic capacitors according to Example 9 verified in the third verification test.

As shown in FIG. 24 and FIG. 33A, in the mounting layout according to Example 5, first monolithic ceramic capacitor 10A and second monolithic ceramic capacitor 10B are mounted in second mounting mode 10(V), and third monolithic ceramic capacitor 10C and fourth monolithic ceramic capacitor 10D are mounted in first mounting mode 10(H).

Figure 33B:
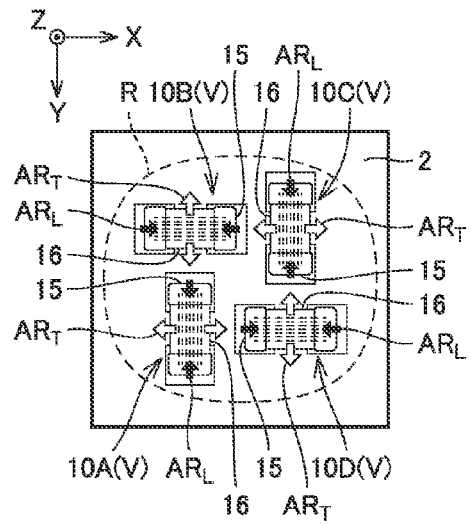
FIG. 33B is a diagram showing the mounting layout of monolithic ceramic capacitors according to Example 6 verified in the third verification test.

As shown in FIG. 24 and FIG. 33B, in the mounting layout according to Example 6, first monolithic ceramic capacitor 10A to fourth monolithic ceramic capacitor 10D are mounted in second mounting mode 10(V).

Figure 33C:
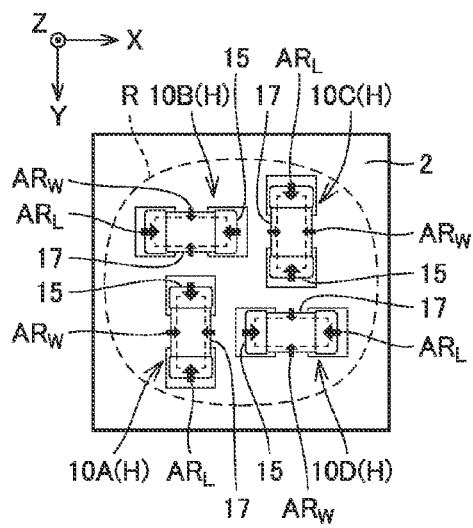
FIG. 33C is a diagram showing the mounting layout of monolithic ceramic capacitors according to Example 7 verified in the third verification test.

As shown in FIG. 24 and FIG. 33C, in the mounting layout according to Example 7, first monolithic ceramic capacitor 10A to fourth monolithic ceramic capacitor 10D are mounted in first mounting mode 10(H).

Figure 33D:
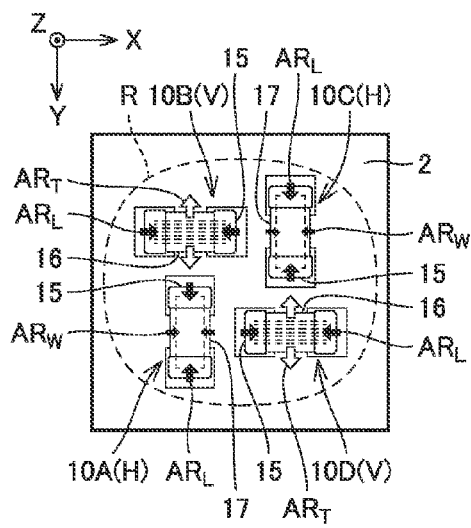
FIG. 33D is a diagram showing the mounting layout of monolithic ceramic capacitors according to Example 8 verified in the third verification test.

As shown in FIG. 24 and FIG. 33D, in the mounting layout according to Example 8, second monolithic ceramic capacitor 10B and fourth monolithic ceramic capacitor 10D are mounted in second mounting mode 10(V), and first monolithic ceramic capacitor 10A and third monolithic ceramic capacitor 10C are mounted in first mounting mode 10(H).

As shown in FIG. 34A, the mounting layout according to Example 9 is the same or similar to the mounting layout as in the eighth configuration example shown in FIG. 23. As shown in FIG. 23 and FIG. 34A, in the mounting layout according to Example 9, first monolithic ceramic capacitor 10A and second monolithic ceramic capacitor 10B are mounted in second mounting mode 10(V), and third monolithic ceramic capacitor 10C and fourth monolithic ceramic capacitor 10D are mounted in first mounting mode 10(H).

Figure 34B:
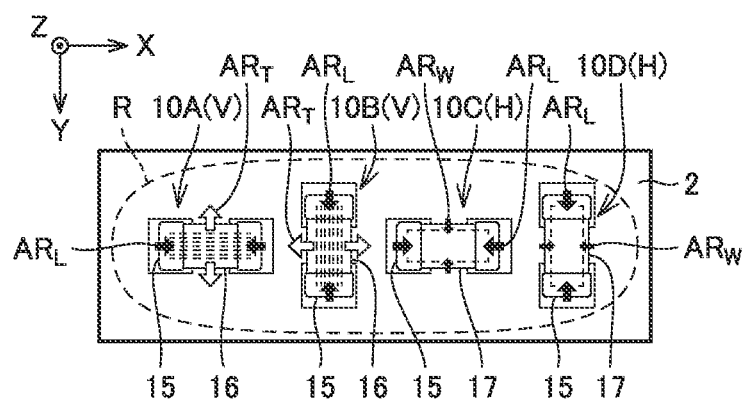
FIG. 34B is a diagram showing the mounting layout of monolithic ceramic capacitors according to Example 10 verified in the third verification test.

As shown in FIG. 34B, the mounting layout according to Example 10 is a mounting layout in which the first configuration example shown in FIG. 11 and the second configuration example shown in FIG. 14 are combined to hold the relation of the fourth configuration example shown in FIG. 18. As shown in FIG. 34B, in the mounting layout according to Example 10, first monolithic ceramic capacitor 10A and second monolithic ceramic capacitor 10B are mounted in second mounting mode 10(V), and third monolithic ceramic capacitor 10C and fourth monolithic ceramic capacitor 10D are mounted in first mounting mode 10(H).

All of the monolithic ceramic capacitors 10 used in Examples 5 to 10 have identical design specifications. More specifically, the external dimension in the length direction L, the external dimension in the width direction W, and the external dimension in the thickness direction T of monolithic ceramic capacitor 10 are approximately 1.0 mm×0.5 mm×0.5 mm, and the capacitance is 2.2 µF. In all of Examples 5 to 8, a plurality of monolithic ceramic capacitors 10 are electrically connected in parallel. The wiring board 2 used is a glass epoxy substrate with a thickness of about 0.8 mm. A plurality of monolithic ceramic capacitors 10 are encapsulated with an epoxy resin layer with a thickness of about 0.8 mm as mold resin layer 5. In the third verification test, the sound pressure level of noise produced in the sample was measured by the same measurement method as the method of measuring the sound pressure level of noise illustrated in the first verification test.

Figure 35:
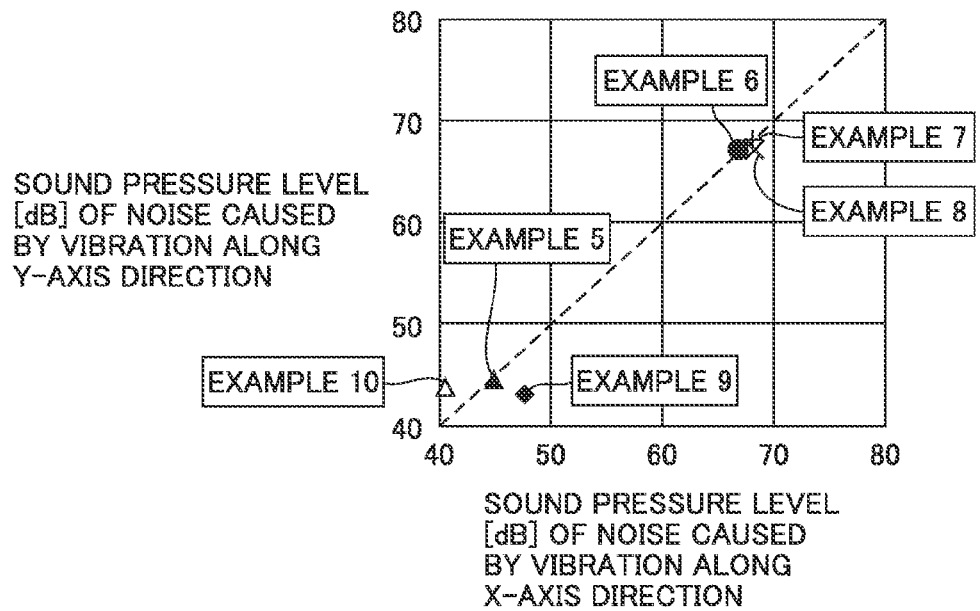
FIG. 35 is a graph showing the result of the third verification test.

FIG. 35 is a graph showing the result of the third verification test. In the graph shown in FIG. 35, the horizontal axis represents the sound pressure level in dB of noise caused by vibration along the X-axis direction, and the vertical axis represents the sound pressure level in dB of noise caused by vibration along the Y-axis direction.

As shown in FIG. 35, as for the relation between Examples 5, 9, 10 and Examples 6, 7, 8, it was confirmed that the sound pressure level of noise was significantly reduced in Examples 5, 9, 10 compared with Examples 6, 7, 8. It is noted that even in Examples 6, 7, 8, although four monolithic ceramic capacitors 10 are arranged, the sound pressure level of noise is reduced compared with the sound pressure level of noise shown in FIG. 32 in Comparative Example 3 with three monolithic ceramic capacitors 10.

It is experimentally confirmed based on the third verification test described above that the application of preferred embodiments of the present invention significantly reduces or prevents transmission of vibration and results in reduction of noise.

In some of the first to twelfth configuration examples based on the preferred embodiments of the present invention, a monolithic ceramic capacitor mounted in first mounting mode 10(H) and a monolithic ceramic capacitors mounted in second mounting mode 10(V) coexist, by way of illustration. However, the monolithic ceramic capacitor prepared to be mounted differs between when the monolithic ceramic capacitor is mounted in first mounting mode 10(H) and when it is mounted in second mounting mode 10(V). Therefore, to facilitate preparation of monolithic ceramic capacitors, it is preferable to include a configuration example in which a plurality of monolithic ceramic capacitors installed in a circuit module are mounted uniformly in either of first mounting mode 10(H) and second mounting mode 10(V).

The layouts of monolithic ceramic capacitors illustrated in the first to twelfth configuration examples based on the preferred embodiments of the present invention are the layouts by which noise is significantly reduced or prevented without being limited by the capacitance or size of the monolithic ceramic capacitors. However, in general, as the capacitance of a monolithic ceramic capacitor increases, the sound pressure level of noise tends to increases. Therefore, preferred embodiments of the present invention are suitably applied particularly when one capacitor in the monolithic ceramic capacitor group assembled in a circuit module has a capacitance of at least 1 µF or more, more particularly 10 µF or more.

In the tenth to twelfth configuration examples based on the preferred embodiments of the present invention, preferred embodiments of the present invention are applied a monolithic ceramic capacitor group defining a decoupling circuit, by way of illustration. However, preferred embodiments of the present invention are applicable to a monolithic ceramic capacitor group included in circuits for other applications connected to a line in which voltage variation including audible frequency components (20 Hz or higher and 20 kHz or lower) may occur.

In the first to ninth configuration examples based on the preferred embodiments of the present invention, a plurality of monolithic ceramic capacitors electrically connected in series or in parallel have identical design specifications (identical capacitance and identical size), by way of illustration. However, these monolithic ceramic capacitors may have different design specifications.

As previously described, the scope of the application of preferred embodiments of the present invention is not limited to the monolithic ceramic capacitor-mounted structure as illustrated in the preferred embodiments of the present invention, and preferred embodiments of the present invention are applicable to other kinds of capacitor element-mounted structures typically including multilayer metallized film capacitors.

Here, a case example in which preferred embodiments of the present invention are suitably applied is a case in which preferred embodiments of the present invention are applied after one capacitor element is replaced by two or more capacitor elements and the replaced two capacitor elements are electrically connected in parallel. In this case, vibration produced in the circuit module is significantly reduced or prevented by replacing the capacitor element by those having a smaller capacitance and a smaller size. Moreover, vibration of the circuit module is further reduced or prevented by the vibration-suppressing effect, which is one of the advantageous effects of preferred embodiments of the present invention as described above. As a result, noise is significantly reduced or prevented to a large degree. For example, by replacing a capacitor element with a capacitance of about 10 µF by two capacitor elements with a capacitance of about 4.7 µF, it is possible to reduce noise to a large degree without significantly increasing the mount area.

The characteristic configurations shown in the first to twelfth configuration examples based on the preferred embodiments of the present invention can be combined with each other without departing from the spirit of the present invention.

Although the present invention has been described and illustrated in detail, it is clearly understood that the same is by way of illustration and example only and is not to be taken by way of limitation, the scope of the present invention being interpreted by the terms of the appended claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A capacitor element-mounted structure comprising:
a first capacitor element and a second capacitor element each including a dielectric layer and an internal electrode layer alternately stacked along a stacking direction;
a wiring board including a main surface with the first capacitor element and the second capacitor element mounted thereon; and
a mold resin layer encapsulating the first capacitor element and the second capacitor element; wherein
the first capacitor element and the second capacitor element are electrically connected in series or in parallel through a conductive pattern provided on the wiring board;
the first capacitor element and the second capacitor element each include a surface opposed to the wiring board including short sides and long sides;
each of the first capacitor element and the second capacitor element includes a pair of end surfaces facing each other in a direction in which the long sides extend, a pair of side surfaces facing each other in a direction in which the short sides extend, and a pair of external electrodes spaced apart from each other on an outer surface of the multilayer structure;
each of the external electrodes included in the first capacitor element and the second capacitor element is bonded to a land through a conductive bonding member, the land being provided on the wiring board so as to correspond to a position of each of the external electrodes;
one of the pair of end surfaces of the first capacitor element is opposed to one of the pair of side surfaces of the second capacitor element with the mold resin layer interposed; and
both of the stacking direction in the first capacitor element and the stacking direction in the second capacitor element are oriented in a direction along the main surface of the wiring board.

2. The capacitor element-mounted structure according to claim 1, wherein each of the first capacitor element and the second capacitor element includes a rectangular or substantially rectangular parallelepiped-shaped multilayer structure.

3. A capacitor element-mounted structure comprising:
a first capacitor element, a second capacitor element, and a third capacitor element each including a dielectric layer and an internal electrode layer alternately stacked along a stacking direction;
a wiring board including a main surface with the first capacitor element, the second capacitor element, and the third capacitor element mounted thereon; and
a mold resin layer encapsulating the first capacitor element, the second capacitor element, and the third capacitor element; wherein
the first capacitor element, the second capacitor element, and the third capacitor element are electrically connected in series or in parallel through a conductive pattern provided on the wiring board;
the first capacitor element, the second capacitor element, and the third capacitor element each include a surface opposed to the wiring board including short sides and long sides;
each of the first capacitor element, the second capacitor element, and the third capacitor element includes a pair of end surfaces facing each other in a direction in which the long sides extend, a pair of side surfaces facing each other in a direction in which the short sides extend, and a pair of external electrodes spaced apart from each other on an outer surface of the multilayer structure;
each of the external electrodes included in the first capacitor element, the second capacitor element, and the third capacitor element is bonded to a land through a conductive bonding member, the land being provided on the wiring board so as to correspond to each of the external electrodes;
any one surface of the pair of end surfaces of the first capacitor element, the pair of end surfaces of the second capacitor element, and the pair of end surfaces of the third capacitor element is opposed to any one surface of the pair of side surfaces of the first capacitor element, the pair of side surfaces of the second capacitor element, and the pair of side surfaces of the third capacitor element with the mold resin layer interposed;
another remaining surface of the pair of end surfaces of the first capacitor element, the pair of end surfaces of the second capacitor element, and the pair of end surfaces of the third capacitor element is opposed to any one surface of the pair of side surfaces of the first capacitor element, the pair of side surfaces of the second capacitor element, and the pair of side surfaces of the third capacitor element with the mold resin layer interposed; and both of the stacking direction in the first capacitor element and the stacking direction in the second capacitor element are oriented in a direction along the main surface of the wiring board.

4. The capacitor element-mounted structure according to claim 3, wherein one of the pair of end surfaces of the first capacitor element is opposed to one of the pair of side surfaces of the second capacitor element with the mold resin layer interposed; and a remaining other of the pair of end surfaces of the first capacitor element are opposed to one of the pair of side surfaces of the third capacitor element with the mold resin layer interposed.

5. The capacitor element-mounted structure according to claim 3, wherein one of the pair of end surfaces of the first capacitor element is opposed to one of the pair of side surfaces of the second capacitor element with the mold resin layer interposed; and one of the pair of end surfaces of the third capacitor element is opposed to a remaining other of the pair of side surfaces of the second capacitor element with the mold resin layer interposed.

6. The capacitor element-mounted structure according to claim 3, wherein one of the pair of end surfaces of the first capacitor element and one the pair of end surfaces of the third capacitor element are opposed to one of the pair of side surfaces of the second capacitor element with the mold resin layer interposed.

7. The capacitor element-mounted structure according to claim 3, wherein the stacking direction in the third capacitor element is oriented in a direction along the main surface of the wiring board.

8. The capacitor element-mounted structure according to claim 3, wherein the stacking direction in the third capacitor element is oriented in a direction not along the main surface of the wiring board.

9. The capacitor element-mounted structure according to claim 3, wherein each of the first capacitor element, the second capacitor element and the third capacitor elements includes a rectangular or substantially rectangular parallelepiped-shaped multilayer structure.

10. A capacitor element-mounted structure comprising:

a first capacitor element, a second capacitor element, a third capacitor element, and a fourth capacitor element each including a dielectric layer and an internal electrode layer alternately stacked along a stacking direction;

a wiring board including a main surface with the first capacitor element, the second capacitor element, the third capacitor element, and the fourth capacitor element mounted thereon; and a mold resin layer encapsulating the first capacitor element, the second capacitor element, the third capacitor element, and the fourth capacitor element; wherein the first capacitor element, the second capacitor element, the third capacitor element, and the fourth capacitor element are electrically connected in series or in parallel through a conductive pattern provided on the wiring board;

the first capacitor element, the second capacitor element, the third capacitor element, and the fourth capacitor element each include a surface opposed to the wiring board including short sides and long sides;

each of the first capacitor element, the second capacitor element, the third capacitor element, and the fourth capacitor element includes a pair of end surfaces facing each other in a direction in which the long sides extend, a pair of side surfaces facing each other in a direction in which the short sides extend, and a pair of external electrodes spaced apart from each other on an outer surface of the multilayer structure;

each of the external electrodes included in the first capacitor element, the second capacitor element, the third capacitor element, and the fourth capacitor element is bonded to a land through a conductive bonding member, the land being provided on the wiring board so as to correspond to each of the external electrodes;

one of the pair of end surfaces of the first capacitor element is opposed to one of the pair of side surfaces of the second capacitor element with the mold resin layer interposed;

one of the pair of end surfaces of the second capacitor element is opposed to one of the pair of side surfaces of the third capacitor element with the mold resin layer interposed;

one of the pair of end surfaces of the third capacitor element is opposed to one of the pair of side surfaces of the fourth capacitor element with the mold resin layer interposed;

one of the pair of end surfaces of the fourth capacitor element is opposed to one of the pair of side surfaces of the first capacitor element with the mold resin layer interposed; and both of the stacking direction in the first capacitor element and the stacking direction in the second capacitor element are oriented in a direction along the main surface of the wiring board.

11. The capacitor element-mounted structure according to claim 10, wherein both of the stacking direction in the third capacitor element and the stacking direction in the fourth capacitor element are oriented in a direction along the main surface of the wiring board.

12. The capacitor element-mounted structure according to claim 10, wherein both of the stacking direction in the third capacitor element and the stacking direction in the fourth capacitor element are oriented in a direction not along the main surface of the wiring board.

13. The capacitor element-mounted structure according to claim 10, wherein each of the first capacitor element, the second capacitor element, the third capacitor element and the fourth capacitor element includes a rectangular or substantially rectangular parallelepiped-shaped multilayer structure.

14. A capacitor element-mounted structure comprising:

a first capacitor element, a second capacitor element, a third capacitor element, and a fourth capacitor element each including a dielectric layer and an internal electrode layer alternately stacked along a stacking direction;

a wiring board including a main surface with the first capacitor element, the second capacitor element, the third capacitor element, and the fourth capacitor element mounted thereon; and a mold resin layer encapsulating the first capacitor element, the second capacitor element, the third capacitor element, and the fourth capacitor element; wherein the first capacitor element, the second capacitor element, the third capacitor element, and the fourth capacitor element are electrically connected in series or in parallel through a conductive pattern provided on the wiring board;

the first capacitor element, the second capacitor element, the third capacitor element, and the fourth capacitor element each include a surface opposed to the wiring board including short sides and long sides;

each of the first capacitor element, the second capacitor element, the third capacitor element, and the fourth capacitor element includes a pair of end surfaces facing each other in a direction in which the long sides extend, a pair of side surfaces facing each other in a direction in which the short sides extend, and a pair of external electrodes spaced apart from each other on an outer surface of the multilayer structure;

each of the external electrodes included in the first capacitor element, the second capacitor element, the third capacitor element, and the fourth capacitor element is bonded to a land through a conductive bonding member, the land being provided on the wiring board so as to correspond to a position of each of the external electrodes;

one of the pair of end surfaces of the first capacitor element is opposed to one of the pair of side surfaces of the second capacitor element with the mold resin layer interposed;

one of the pair of end surfaces of the third capacitor element is opposed to one of the pair of side surfaces of the fourth capacitor element with the mold resin layer interposed;

both of the stacking direction in the first capacitor element and the stacking direction in the second capacitor element are oriented in a direction along the main surface of the wiring board; and both of the stacking direction in the third capacitor element and the stacking direction in the fourth capacitor element are oriented in a direction not along the main surface of the wiring board.

15. The capacitor element-mounted structure according to claim 14, wherein the other of the pair of side surfaces of the second capacitor element is opposed to the other of the pair of end surfaces of the third capacitor element with the mold resin layer interposed.

16. The capacitor element-mounted structure according to claim 14, wherein one of the pair of side surfaces of the first capacitor element is opposed to one of the pair of side surfaces of the third capacitor element with the mold resin layer interposed; and one of the pair of end surfaces of the second capacitor element is opposed to one of the pair of end surfaces of the fourth capacitor element with the mold resin layer interposed.

17. The capacitor element-mounted structure according to claim 14, wherein each of the first capacitor element, the second capacitor element, the third capacitor element and the fourth capacitor element includes a rectangular or substantially rectangular parallelepiped-shaped multilayer structure.

* * * * *